(12) United States Patent
Chakraborty et al.

(10) Patent No.: US 9,106,201 B1
(45) Date of Patent: Aug. 11, 2015

(54) SYSTEMS AND METHODS FOR DC-TO-DC CONVERTER CONTROL

(75) Inventors: Sombuddha Chakraborty, Redwood City, CA (US); Yali Xiong, San Jose, CA (US); Michael D. McJimsey, Danville, CA (US); Anthony J. Stratakos, St. Helena, CA (US); Giovanni Garcea, Palo Alto, CA (US); Ilija Jergovic, Palo Alto, CA (US); Andrew Burstein, Fremont, CA (US); Andrea Pizzutelli, San Mateo, CA (US)

(73) Assignee: Volterra Semiconductor Corporation, San Jose, CA (US)

( * ) Notice: Subject to any disclaimer, the term of this patent is extended or adjusted under 35 U.S.C. 154(b) by 360 days.

(21) Appl. No.: 13/167,665

(22) Filed: Jun. 23, 2011

Related U.S. Application Data

(60) Provisional application No. 61/357,906, filed on Jun. 23, 2010.

(51) Int. Cl.
  *G05F 1/00* (2006.01)
  *H02J 3/08* (2006.01)
  *H03H 7/20* (2006.01)
  *H02M 3/158* (2006.01)

(52) U.S. Cl.
  CPC .............. *H03H 7/20* (2013.01); *H02M 3/1584* (2013.01)

(58) Field of Classification Search
  CPC . H02M 3/155; H02M 3/1584; H02M 3/1588; H02M 3/156; H02M 3/157; H02M 3/158; H02M 2003/1586; H02M 2001/0009; Y02B 70/1466
  USPC ......... 323/282–286, 351, 909, 910, 212–219, 323/222–226, 237–246, 271–276, 323/320–327; 363/65–72, 123–130
  See application file for complete search history.

(56) References Cited

U.S. PATENT DOCUMENTS

| | | | |
|---|---|---|---|
| 4,267,570 A * | 5/1981 | Braun | ........................... 702/125 |
| 5,793,191 A | 8/1998 | Elmore et al. | |
| 6,160,441 A | 12/2000 | Stratakos et al. | |
| 6,198,261 B1 | 3/2001 | Schultz et al. | |
| 6,278,264 B1 | 8/2001 | Burstein et al. | |
| 6,362,986 B1 | 3/2002 | Schultz et al. | |
| 6,424,129 B1 | 7/2002 | Lethellier | |
| 6,445,244 B1 | 9/2002 | Stratakos et al. | |
| 6,462,522 B2 | 10/2002 | Burstein et al. | |

(Continued)

OTHER PUBLICATIONS

Chil Semiconductor, CHL8314 Datasheet, accessed via the Internet on Feb. 10, 2012, 4 pages.

*Primary Examiner* — Timothy J Dole
*Assistant Examiner* — Carlos Rivera-Perez
(74) *Attorney, Agent, or Firm* — Lathrop & Gage LLP

(57) ABSTRACT

A regulated, power supply system is described using multiphase DC-DC converters with dynamic fast-turnon, slow-turnoff phase shedding, early phase turn-on, and both load-voltage and drive-transistor feedback to pulsewidth modulators to provide fast response to load transients. In an embodiment, a system master can automatically determine whether all, or only some, slave phase units are fully populated. The programmable system includes fault detection with current and voltage sensing, telemetry capability, and automatic shutdown capability. In an embodiment, these are buck-type converters with or without coupled inductors, however some of the embodiments illustrated include boost configurations.

18 Claims, 41 Drawing Sheets

(56) References Cited

U.S. PATENT DOCUMENTS

| | | |
|---|---|---|
| 6,563,294 B2 | 5/2003 | Duffy et al. |
| 6,747,442 B2 * | 6/2004 | Olsen et al. .................... 323/283 |
| 6,826,028 B2 * | 11/2004 | Schuellein ................... 361/93.1 |
| 6,853,169 B2 | 2/2005 | Burstein et al. |
| 7,026,798 B2 | 4/2006 | Cheung et al. |
| 7,239,530 B1 | 7/2007 | Djekic et al. |
| 7,414,383 B2 * | 8/2008 | Burton et al. .................. 323/271 |
| 7,449,867 B2 | 11/2008 | Wu et al. |
| 7,622,820 B1 * | 11/2009 | Prodic et al. ................... 307/31 |
| 7,759,918 B2 | 7/2010 | Moyer et al. |
| 7,777,460 B2 | 8/2010 | Schuellein |
| 8,030,911 B2 | 10/2011 | Nien et al. |
| 8,237,423 B2 * | 8/2012 | Heineman et al. ............ 323/283 |
| 8,274,265 B1 | 9/2012 | Khanna et al. |
| 8,710,810 B1 | 4/2014 | McJimsey et al. |
| 8,907,642 B1 | 12/2014 | Burstein et al. |
| 2008/0298093 A1 * | 12/2008 | Jin et al. ..................... 363/21.06 |
| 2008/0309300 A1 | 12/2008 | Liu et al. |
| 2009/0174485 A1 | 7/2009 | Teng et al. |
| 2009/0224731 A1 * | 9/2009 | Tang et al. .................... 323/241 |
| 2010/0225287 A1 * | 9/2010 | Schultz ......................... 323/272 |

* cited by examiner

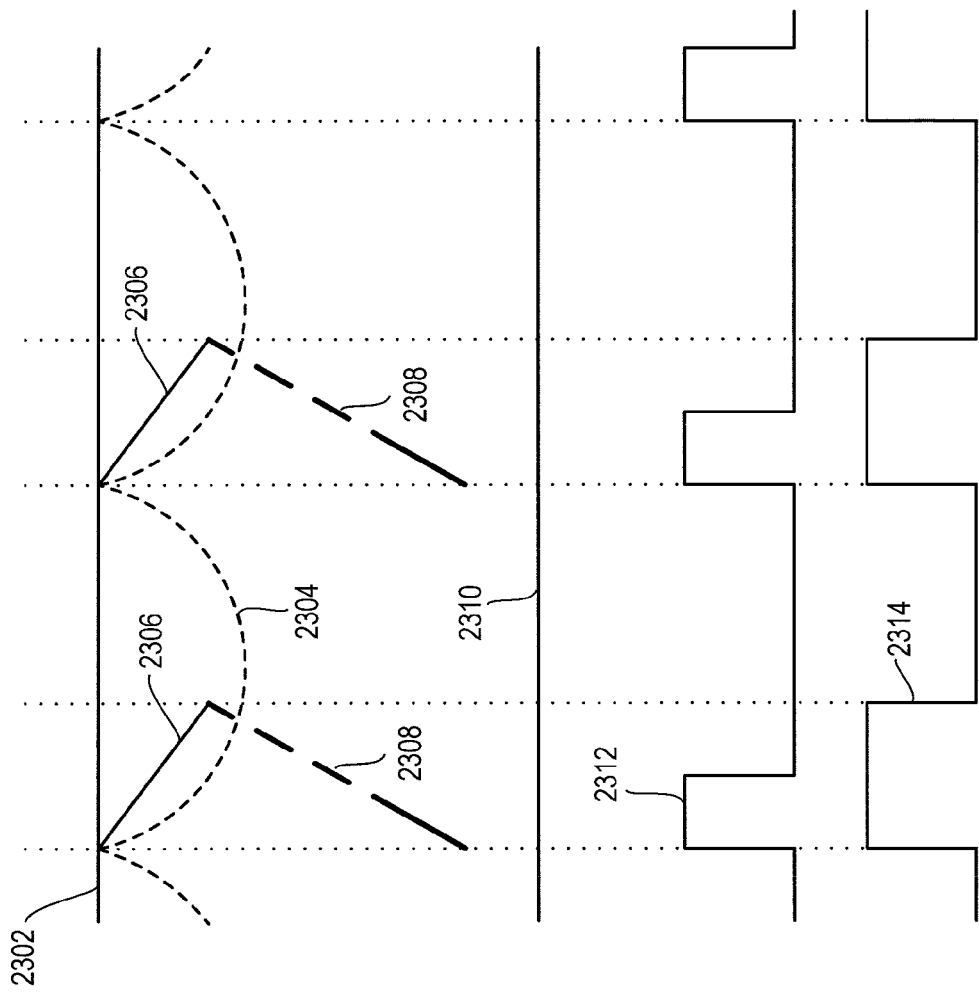

SYSTEMS AND METHODS FOR DC-TO-DC CONVERTER CONTROL

CROSS-REFERENCE TO RELATED APPLICATIONS

This application claims benefit of priority to U.S. Provisional Patent Application Ser. No. 61/357,906 filed Jun. 23, 2010, which is incorporated herein by reference.

BACKGROUND

Many DC-DC converters make use of the "buck" or the "multiphase buck" topology. These topologies are illustrated in FIG. 1. In a single or multiphase buck converter 102, a switching device 104 periodically couples a driven end of an inductor 106 to an input power supply 108. This coupling causes a current to build up through inductor 106 between a converter output 110 and the power supply 108. When the switching device 104 opens, inductor current continues to flow for a time, typically through either or both of a diode 112 and a second switching device 114, and thence into the load. Accordingly, inductor 106 may be referred to as an energy storage inductor, and diode 112 and second switching device 114 couple energy stored in inductor 106 to a load 118. A bypass or filtering capacitor 116 is typically provided to reduce ripple by smoothing voltage provided to load 118. A variable-resistor symbol is used to represent load 118 because effective load resistance may change during operation. Voltage provided to the load 118 is typically sensed by a controller 119 that provides for control and drive of the switching devices 104 and 114; for simplicity of illustration connections between controller 119 and switching devices are not shown. The switching devices are selected by a designer from transistors deemed to be good for switching regulators such as MOS (including CMOS & LDMOS), Gallium Arsenide and Bipolar transistors, and such other electronic switching devices such as gate-turnoff thyristors as known in the art of electronics.

In order to provide for high current capability and reduce ripple, one or more additional phases may be provided to extend the design into a multiphase converter design; where each phase adds an additional switching device, such as switching device 120, diode 121 and/or second switching device 122, and inductor 124 to the design. These switching devices 120, 122 also operate under control of controller 119, and are typically timed to reduce ripple such that device 120 and device 104 do not turn on simultaneously, although they both may be on simultaneously, the timing relationship between turn-on of devices 120, 104 within a converter cycle is a phasing, or a phase relationship between the primary and additional phases of the multiphase converter.

Multiphase DC-DC converters may be designed without magnetic coupling between the inductors 106 and 124 of different phases, or may be designed with specific coupling between the inductors of different phases as described in U.S. Pat. No. 6,362,986 to Schultz, et al., the disclosure of which is incorporated herein by reference.

Multiphase DC-DC converters can be utilized in many applications including digital and analog IC chips. One challenging example is for a power supply to high performance microprocessors. Modern processor integrated circuits often require very low operating voltages, such as voltages at predetermined levels from around one to two and a half volts, and may require very high currents of as much as hundreds of amperes. Further, these processors are often designed with power-saving circuitry that can save considerable power by disabling functional units when those units not needed, but can cause current demand to soar dramatically over very short periods of time as functional units within the processor are enabled when needed. For example, current demand by some processors may jump by at least 100 amperes within a microsecond, effective load 118 resistance changing sharply between values in the ranges of ohms or tenths of ohms and values on the order of less than a hundredth of an ohm. These processors therefore impose stringent requirements on their associated power supply systems. Typically, these processors are powered from five or twelve volt power supplies thus requiring step-down DC-DC converters such as multiphase buck converters, and large filtering capacitors 116 are provided to allow for load current changes.

Many DC-DC converter applications require a voltage step-up rather than the step-down provided by the buck converter of FIG. 1. Many other architectures for single and multiple-phase converters exist that can meet such requirements.

Among those DC-DC converter architectures that are capable of providing a voltage step up, the most common is the boost converter, single-phase boost converters have been used for many years in such applications as powering the cathode-ray tube of television receivers. FIG. 2 illustrates a multiphase boost converter, having an inductor 202, 204 associated with each phase. Each phase also has at least one switching device, represented by switch 206, and a diode 208. A second switching device, represented as switch 210, may be provided to bypass forward voltage drop of the diode 208; diode 208 and switch 210 together couple energy from inductor 204 to load filter capacitor 212 following each turnoff of switch 206. A controller 214, which may operate under feedback control by sensing load voltage, is provided for driving switching devices 206, 210.

SUMMARY

A regulated, power supply system is described using multiphase DC-DC converters with dynamic fast-turnon, slow-turnoff phase shedding, early phase turn-on, and both load-voltage and drive-transistor feedback to pulsewidth modulators to provide fast response to load transients. In an embodiment, a system master can automatically determine whether all, or only some, slave phase units are fully populated. The programmable system includes fault detection with current and voltage sensing, telemetry capability, and automatic shutdown capability. In an embodiment, these are buck-type converters with or without coupled inductors; however some of the embodiments illustrated include boost configurations.

In an embodiment, a method for controlling phase current imbalance in a multiphase DC-to-DC converter includes: (1) determining a current magnitude value for each phase, where each current magnitude value corresponds to magnitude of current out of one or more switching devices of the phase; (2) identifying a smallest current magnitude value; and (3) firing a phase corresponding to the smallest current magnitude value.

In another embodiment, a method for controlling a number of phases that are active in a multiphase DC-to-DC converter includes: (1) comparing a current signal representing a magnitude of current processed by the converter to a first threshold value; and (2) decreasing a number of phases that are active if the current signal falls below the first threshold value.

In another embodiment, a method for controlling a number of phases that are active in a multiphase DC-to-DC converter includes: (1) comparing a current signal representing a magnitude of current processed by the converter to a second threshold value; and (2) increasing a number of phases that are active if the current signal rises above the second threshold value.

In another embodiment, a system for controlling a DC-DC converter includes an apparatus for sensing a total current of the DC-to-DC converter, at least one comparator for comparing the total current to at least one predetermined phase-enable and phase drop threshold, and circuitry for changing a number of active phases. The circuitry is adapted to (1) increase the number of active phases if the total current is greater than the phase-enable threshold, and (2) decrease the number of active phases if the total current is less than the phase-drop threshold.

In yet another embodiment, a system for controlling a multiphase DC-to-DC converter includes: (1) an apparatus for determining a current magnitude value of each phase of the multiphase DC-to-DC converter, where each current magnitude value corresponds to magnitude of current in one or more switching devices of the phase, (2) an apparatus for identifying a smallest current magnitude value, and (3) an apparatus for firing a phase corresponding to the smallest current magnitude.

BRIEF DESCRIPTION OF THE DRAWINGS

FIG. 23 shows a simulation of an embodiment of the controller of FIGS. 22A and 22B.

FIG. 42 is a flowchart of operation with early-turn-on.

DETAILED DESCRIPTION OF THE EMBODIMENTS

Figure 1:
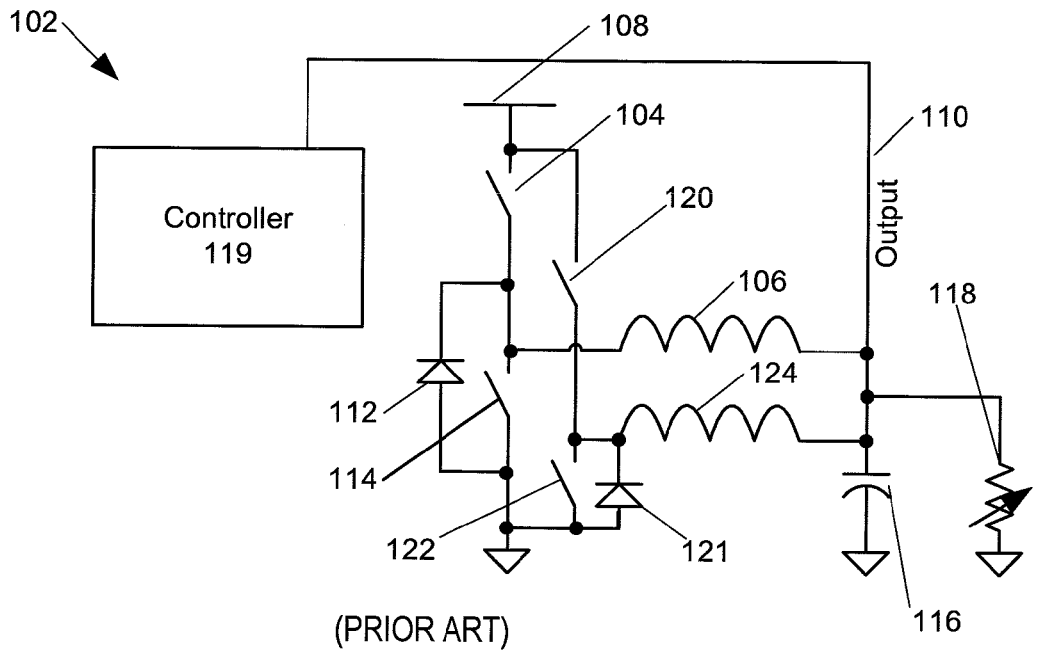
FIG. 1 is a schematic illustration of a two-phase buck converter.

Disclosed herein are systems and methods that advance the state of the art of switching DC-to-DC converters. For purposes of illustrative clarity, certain elements in the drawings may not be drawn to scale. Specific instances of an item may be referred to by use of a numeral in parentheses (e.g., inductor 310(1)) while numerals without parentheses refer to any such item (e.g., inductors 310).

Figure 3:
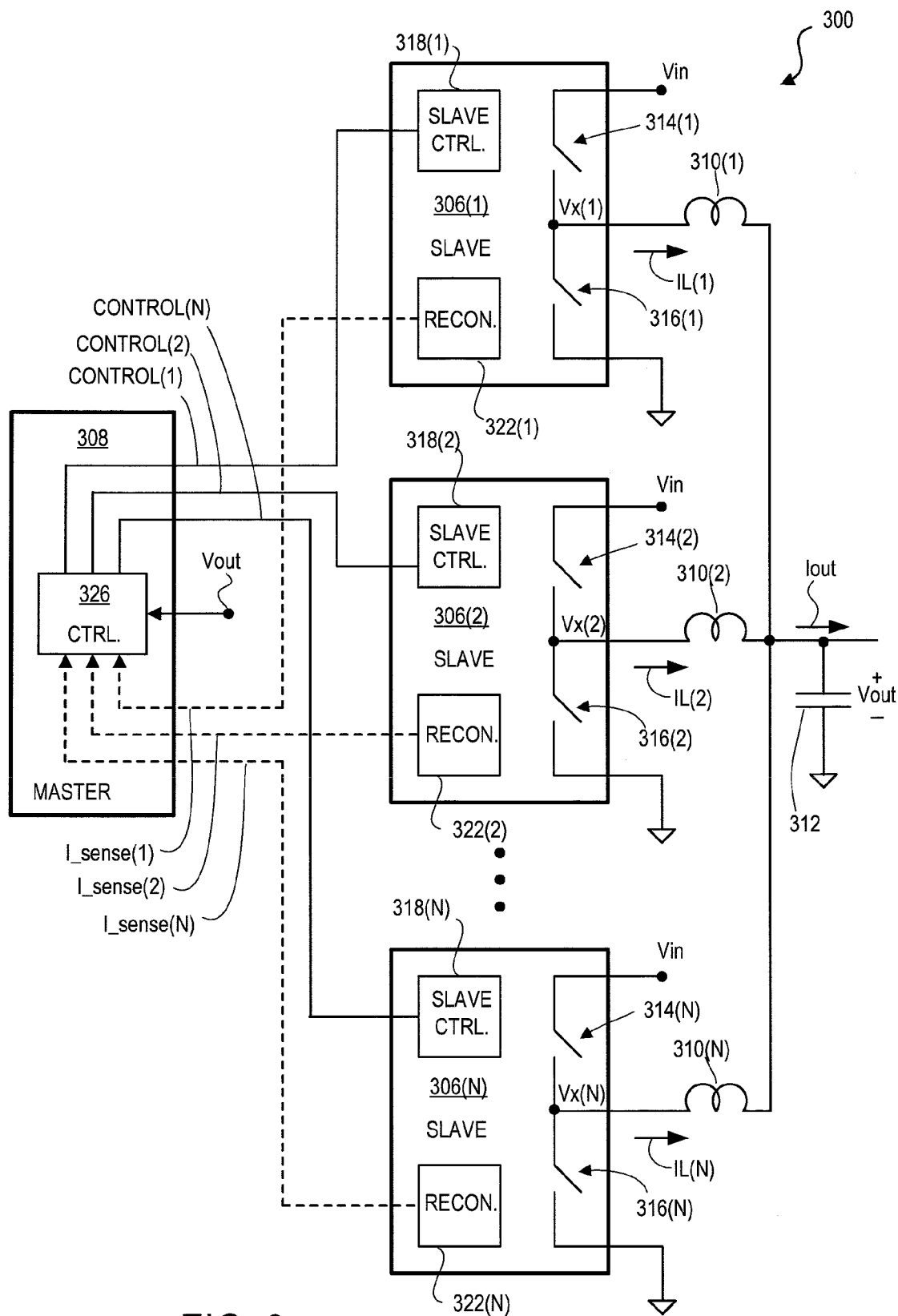
FIG. 3 shows a multiphase buck-type DC-to-DC converter, in an embodiment.

FIG. 3 shows a buck-type DC-to-DC converter 300 which converts an input voltage Vin to an output voltage Vout. Converter 300 includes N slaves 306, where N is an integer greater than or equal to one, a master 308, N energy storage inductors 310, and at least one output capacitor 312. Each slave and its respective inductor 310 form a phase, a single phase converter has a single slave 306 and inductor 310, and a multiphase converter has two or more slaves 306 and respective inductors 310. Thus, converter 300 includes N phases. As discussed below, master 308 controls slaves 306 to regulate Vout. Although not required, each slave 306 is typically integrated into a respective integrated circuit chip, and master 308 also is typically integrated into a respective integrated circuit chip. In certain embodiments, two or more of inductors 310 are magnetically coupled to improve converter performance relative to a converter with discrete, uncoupled, inductors 310.

Each slave 306 includes a high side switch 314, a low side switch 316, and a slave control 318, which in a particular embodiment includes a pulse width modulation (PWM) interface, for controlling switches 314, 316 in response to control signals, which in an embodiment include PWM signals or pulse frequency modulation (PFM) signals, from master 308. As known in the art, a PWM signal is a series of variable width pulses, which is used, for example, to control a switch, such as switch 314 or 316. A PFM signal, on the hand, is a series of constant width pulses of variable frequency. Switches 314, 316, for example, are transistors. In the embodiment of FIG. 3, high side switch 314 is a control switch in that Vout is a function of the switch's duty cycle. Low side switch 316 is a freewheeling device in that it provides a path for inductor current IL when the control switch turns off. Low side switch 316 is typically selected to provide a low forward voltage drop when conducting current IL. Thus, low side switch couples energy stored in inductor 310 to output Vout. In some embodiments, low side switches 316 are external to and not part of slaves 306 and/or are replaced with diodes.

In alternative embodiments, slave control 318 may be replaced by local pulse-width modulators for controlling switches 314, 316. In such alternative embodiments, the local pulse-width modulators may be controlled by digital signals provided by master 308. In one such embodiment, local pulse-width modulators are controlled by loading them with binary-encoded pulse widths transmitted serially in digital form from master 308.

Each slave 306 also includes a slave current reconstructor circuit 322, which generates a current sense signal I_sense representing the instantaneous value of current IL, which is current flowing out of the slave's switching node Vx. Thus, current sense signal I_sense represents current flowing through high side 314 when switch 314 is in its conductive state, and current sense signal I_sense represents current flowing through by low side switch 316 when switch 316 is in its conductive state. Current sense signals I_sense can be analog signals (e.g., single ended or differential current or voltage signals) or digital signals. In certain alternate embodiments, current sense signals I_sense represent averaged or filtered values of current I_L. As discussed below, in certain embodiments, reconstructor circuits 322 generate current sense signals I_sense without use of resistive sensing devices or shunts, thereby promoting high efficiency. Current sense signals I_sense are communicatively coupled to master 308 from slaves 306. In certain alternate embodiments, reconstructor circuits 322 are external to and not part of slaves 306.

A controller 326 in master 308 generates a respective CONTROL signal (e.g., a PWM signal) for each slave 306 in response to at least current sense signals I_sense and the value of Vout. Thus, controller 326 utilizes current mode control. In certain embodiments, controller 326 generates the CONTROL signals in response to parameters in addition to current sense and output voltage parameters. For example, in some embodiments, CONTROL signals are generated in part based on slave temperature, such as to thermally balance slaves as discussed below with respect to FIGS. 14-15. In certain embodiments, controller 326 senses Vout differentially to reduce errors resulting from ground offset voltages. Each CONTROL signal is communicatively coupled to a slave control 318 of a respective slave 306, and the slave control causes the slave's high side switch 314 and low side switch 316 to switch between its conductive and non-conductive states in accordance with the CONTROL signal. For example, in certain embodiments, when converter 300 is operating in continuous current mode (CCM), if signal CONTROL(1) is in its high state, slave control 318(1) causes high side switch 314(1) to operate in its conductive state and low side switch 316(1) to operate in its non-conductive state. Similarly, if signal CONTROL(1) is in its low state during CCM operation, slave control 318(1) causes high side switch 314(1) to be in its non-conductive state and low side switch 316(1) to be in its conductive state. In certain alternate embodiments, polarities of the CONTROL signals are reversed. Although not required, master 308 typically synchronizes the CONTROL signals such that each slave 306 is phase shifted, or switches out of phase with respect to each other slave, thereby promoting canceling of ripple current in output capacitor 312.

Master 308 is typically configured to cause switches 314, 316 to switch between their conductive and non-conductive states at a frequency of at least 20 KHz such that noise generated from switching current generated component movement is above a frequency range perceivable by humans. Operating converter 300 at a significantly higher switching frequency (e.g., at a frequency in the range from at least 200 KHz to several MHz) also promotes fast response to load changes and the ability to use smaller values of inductors 310 and capacitor 312 relative to an embodiment operating at a lower switching frequency.

In certain embodiments, master 308 can control what portion of populated slaves 306 are active. In the context of this document, a slave or phase is active when its switching devices are switching between their conductive and non-conductive states. Conversely, a slave or phase is inactive when its switching devices are not switching between their conductive and non-conductive states. In some embodiments, master 308 is configured to deactivate one or more slaves 306 during light load periods and to reactivate such slaves if load increases. Master 308 is also optionally configured to deactivate and reactivate slaves 306 in response to an external signal.

Converter 300's configuration advantageously promotes DC-to-DC converter scalability. For example, in embodiments where each slave 306 as well as master 308 are integrated into respective integrated circuit chips, master 308 can be designed to support up to M slaves, where M is an integer greater than or equal to one. A number of desired phases (up to M phases) can then be obtained by populating M slaves and M corresponding inductors 310.

Another notable feature of converter 300 is that the number of required communication lines between master 308 and slaves 306 is relatively small. For example, in certain embodiments, the only required communication lines between master 308 and slaves 306 are lines for the CONTROL signals. In some embodiments, the CONTROL signals are PWM or PFM signals, as discussed above. However the CONTROL signals can have other formats. For example, in certain alternate embodiments, the CONTROL signals include digitally encoded pulsewidths and synchronization signals. Additionally, in certain embodiments, the CONTROL signals include digitally encoded signals carrying current sense signals I_sense from slaves 306 to master 308. Furthermore, in some embodiments, the CONTROL signals include DC-to-DC converter 300 operating mode information, and slave controls 318 use this information to control their respective slaves 306. For example, in one embodiment, the CONTROL signals may indicate that the converter has switched or will soon switch from discontinuous conduction mode operation to continuous conduction mode operation, or vice versa. As discussed below, certain embodiments of system 300 include additional communication lines to provide additional functionality.

The configuration of converter 300 is not limited to that shown in FIG. 3. For example, although system 300 is shown having a standard buck-type topology where high side switches 314 are control switches, system 300 could be modified to have an inverted buck-type topology where low side switches 316 are control switches. Converter 300 could also be modified to have other DC-to-DC converter topologies such as a boost-type topology, a buck-boost-type topology, or an isolated topology, with or without magnetically coupled energy storage inductors. Some examples of isolated DC-to-DC converter topologies including coupled energy storage inductors are disclosed in U.S. Pat. No. 7,239,530 to Djekic et al., which is incorporated herein by reference. As another example, although FIG. 3 shows each slave electrically coupled to a common input voltage Vin, two or more of slaves 306 could be electrically coupled to different input voltage sources.

As discussed above, in certain embodiments, reconstructor circuits 322 generate I_sense current sensing signals without use of a separate dissipative sensing element (e.g., without use of current sense or "shunt" resistors). For example, in an embodiment reconstructor circuits 322 use one or more current-mirror sensing transistors and associated circuitry to sense current through a power transistor. Such current sensing and power transistors can be any type of metal oxide semiconductor (MOS) or bipolar transistors, as long as they have certain characteristics that match the associated power transistor such as gain or threshold voltage, and other characteristics such as on resistance that are in a predetermined ratio to characteristics of the associated power transistor. Typically, matching characteristics and ratioed characteristics are determined by device layout.

Figure 4:
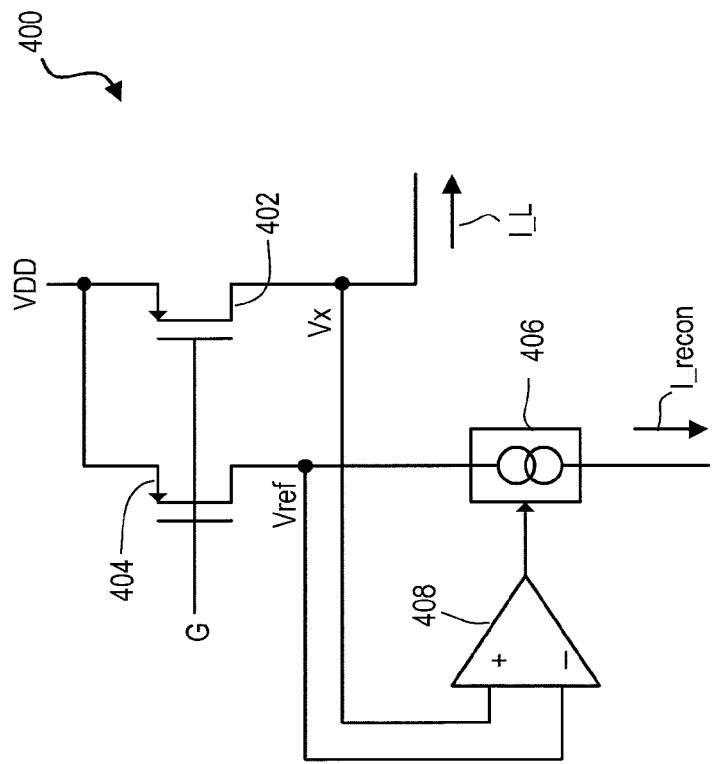
FIG. 4 shows one unipolar current sensing circuit, in an embodiment.

A single current sensing reference transistor and associated circuitry can be used to sense unipolar current (i.e., current flowing in a single direction), such as in a reconstructor application. FIG. 4 shows one unipolar current sensing circuit 400 for sensing a load current I_L flowing through a power transistor 402. Circuit 400 includes a reference transistor 404 with its source connected to a VDD rail and its drain connected to a transconductance device 406. The gate of reference transistor 404 is electrically coupled to the gate of power transistor 402 so that both transistors 402, 404 conduct at the same time and essentially operate under identical conditions of current density and bias. In an embodiment, gate length, channel doping, and gate oxide thickness of MOS or VMOS reference transistor 404 matches that of power transistor 402 to ensure matching threshold voltages and similar current densities. Reference transistor 404 has an on-resistance Rref that is a known multiple of on-resistance Rpwr of power transistor 402. Thus, a ratio of Rref to Rpwr is known. Reference transistor 404 and power transistor 402, for example, are formed on a common semiconductor die with matching gate length and doping profile to promote a predictable relationship between Rref and Rpwr.

A differential amplifier 408 drives transconductance device 406 such that a magnitude of current I_recon through reference transistor 404 causes a voltage on a node Vref to be the same as a voltage on a node Vx. Under such conditions, it can be shown that I_L=I_recon*Rref/Rpwr. Thus, output current I_recon is proportional to load current I_L, and I_L can be determined by multiplying I_recon by the ratio of Rref to Rpwr, which as stated above, is known.

Figure 5:
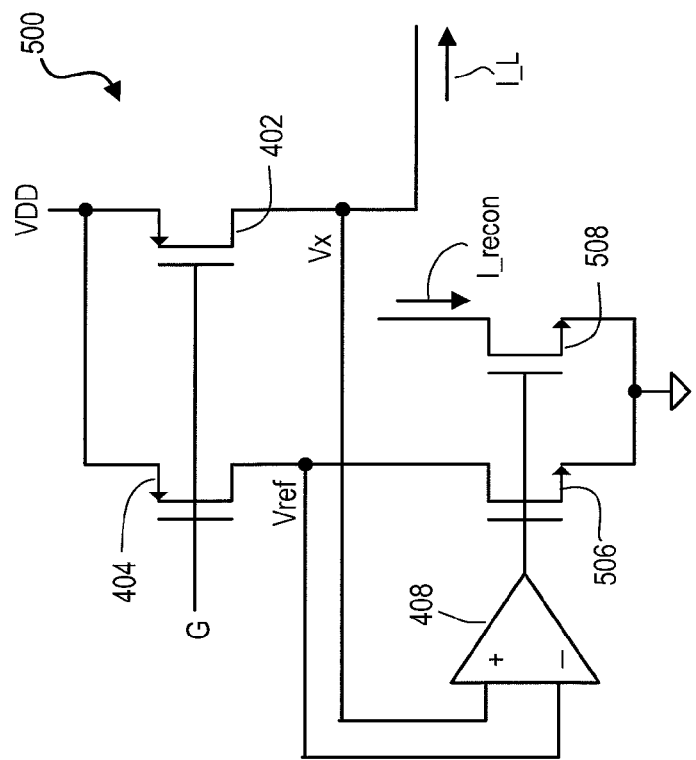
FIG. 5 shows another unipolar current sensing circuit, in an embodiment.

FIG. 5 shows another current sensing circuit 500. Circuit 500 is an alternate embodiment of circuit 400 (FIG. 4) where transconductance device 406 is implemented with transistors 506 and 508. Transistor 506 controls a magnitude of current through reference transistor 404, and transistor 508 mirrors such current to generate output signal current I_recon. Use of mirror transistor 508 allows additional control of a ratio of I_recon to I_L. In particular, the relationship between of I_L and I_recon is given by: I_L=I_recon*M*Rref/Rpwr where M is equal to a ratio of transconductance of transistor 506 to transconductance of transistor 508. Thus, the ratio of I_L to I_recon is a function of M as well as the ratio of Rref to Rpwr.

Figure 6:
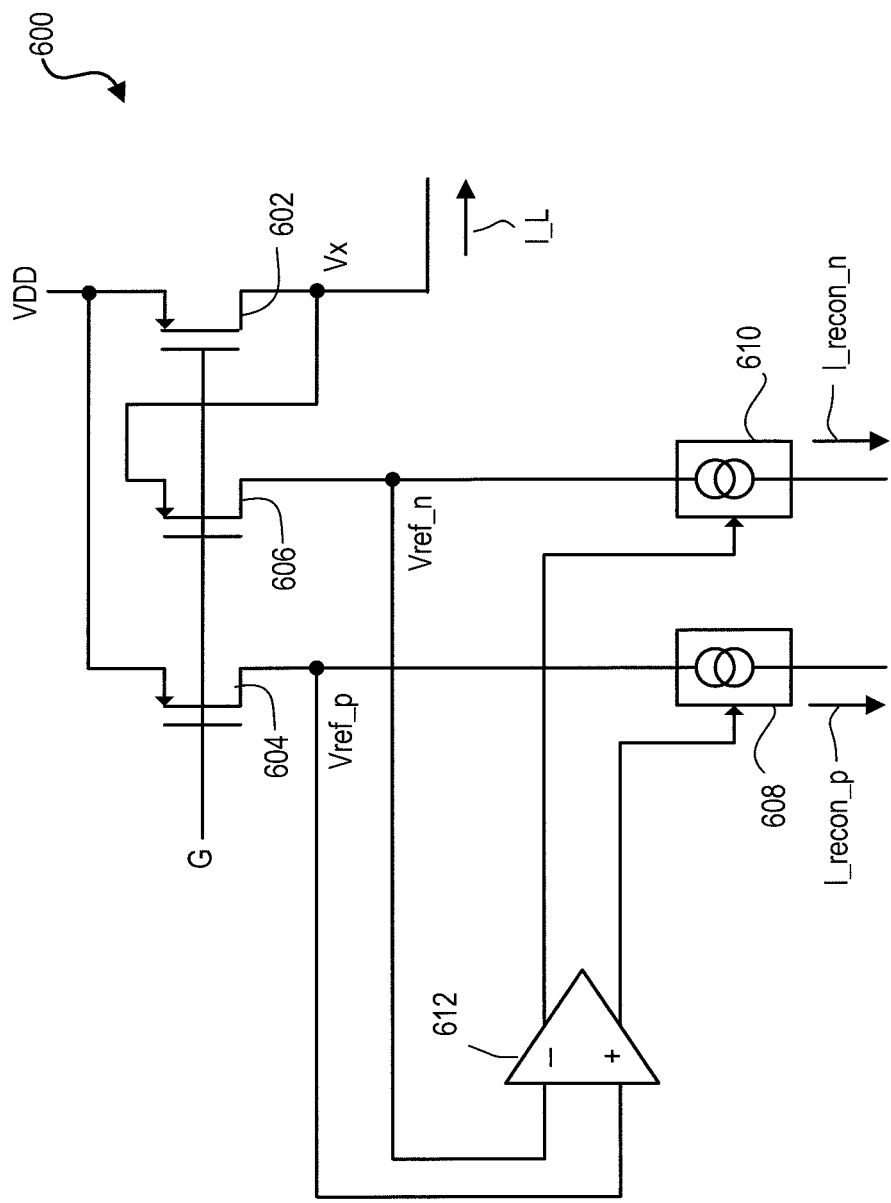
FIG. 6 shows a bipolar current sensing circuit, in an embodiment.

Two current sensing reference transistors and associated circuitry are, for example, used in a current reconstructor to sense bipolar current, to include both current flowing from VDD through transistor 602 into the load, and reverse current flowing from the load through transistor 602 into VDD. FIG. 6 shows one possible bipolar current sensing circuit 600 for sensing a load current I_L flowing through a power transistor 602, where the polarity of I_L can change (i.e., current I_L can flow into or out of a node Vx). Circuit 600 includes a positive reference transistor 604 and a negative reference transistor 606. The source of positive reference transistor 604 is connected to a positive rail VDD, and the drain of transistor 604 is connected to a transconductance device 608. The source of negative reference transistor 606 is connected to node Vx, and the drain of negative reference transistor 606 is connected to a transconductance device 610. The gates of references transistors 604, 606 are connected to the gate of power transistor 602 such that reference transistors 604, 606 conduct when power transistor 602 conducts. Reference transistor 604 has an on-resistance Rrefp that is at least substantially the same as on-resistance Rrefn of reference transistor 606 under common operating conditions. Furthermore, reference transistor on-resistances Rrefn, Rrefp are known multiples of an on-resistance Rpwr of power transistor 602; these ratios are typically determined by ratios of device width during layout of otherwise-identical transistors on the same die.

Circuit 600 includes a differential amplifier 612 which drives transconductance devices 608, 610 such that signal currents I_recon_p and I_recon_n cause a voltage on node Vrefp to equal a voltage on node Vrefn. Under such conditions, it can be shown that I_L=(I_recon_p−I_recon_n)*Rref/Rpwr. In such equations, Rref is the on-resistance of each reference transistor 604, 606. Current signals I_recon_p and I_recon_n could optionally be mirrored, such as in a manner similar to that shown in FIG. 5, and/or combined.

It is anticipated that amplifiers in some embodiments of the current sense circuits discussed herein will include circuitry to reduce and/or compensate for input offset. For example, an amplifier may include a switched capacitor offset cancellation circuit or a chopper-stabilization circuit. Amplifiers, transconductance stages, and/or output stages may also utilize class-A, class-AB, and/or class-B circuitry in some embodiments.

Modifications to the current sense circuits discussed herein are possible. For example, transistor types can be changed (e.g., from p-channel to n-channel transistors) as required to adapt to required system polarities or to change transistor drive methods. As another example, output current signals (e.g., I_recon) can be converted to voltage signals, and differential output signals can be converted to single ended output signals. It should also be appreciated that the current sense circuits discussed herein are not limited to use in slaves 306 but could be adapted for use in other applications requiring sensing of current through high power transistors.

It is also anticipated that current sensing circuits utilizing a mirror transistor to sense current in a high-power transistor may also be fabricated with NPN or PNP bipolar, junction field-effect, and other transistor types, so long as the mirror transistor has certain characteristics, such as threshold voltage or beta, that match those of the high-power transistor, and other characteristics, such as $R_{ON}$, that are in predetermined ratios relative to those of the high-power transistor. For example, and not by way of limitation, the circuit of FIG. 4 may be built with PNP bipolar transistors if beta, and similar characteristics of sensing transistor 404 matches those of high power transistor 402, and base-emitter voltage-current characteristics of sensing transistor 404 essentially matches a predetermined fraction of high-power transistor 402.

A current mirror implemented this way will produce a reconstructed sense current I_recon approximately equal to a scale factor Srecon multiplied by current I_L in the switching device 402, where the scale factor Srecon is approximately equal to a ratio of device sizes of 404 to 404, and may be positive as in FIG. 4, or negative as in FIG. 5.

Figure 7:
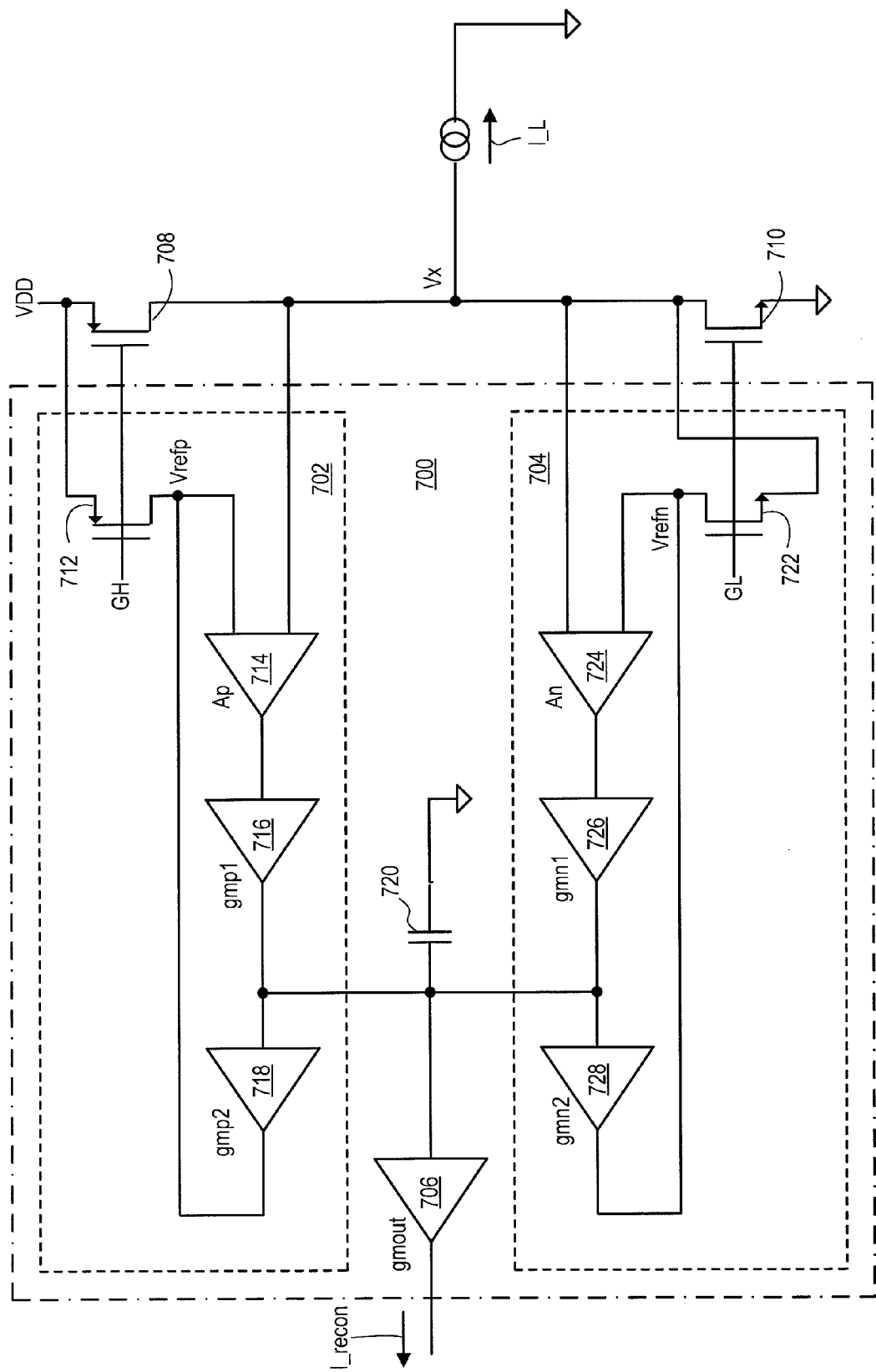
FIG. 7 shows a current reconstructor circuit including two current sensing circuits, in an embodiment.

Additionally, two or more current sensing circuits can be combined, and such combined current sensing circuits can optionally share components (e.g., two sensing circuits can share a common amplifier, and two or more amplifiers can share common current references). For example, a reconstructor circuit 322 can be formed of two current sensing circuits with a shared output, where one current sensing circuit senses current flowing through high side switch 314, while the other current sensing circuit senses current flowing through low side switch 316. For example, FIG. 7 shows one reconstructor circuit 700 including two current measurement circuits 702, 704 sharing a common output transconductance device 706 having a gain gmout. Current sensing circuit 702 senses current I_L flowing from positive node VDD, through an upper power transistor 708 (analogous to upper switch 314) and out of node Vx. Current measurement circuit 704 senses current IL flowing from ground, through lower power transistor 710 (analogous to lower switch 316) and out of node Vx. Current sensing circuit 702 is active when upper power transistor 708 is turned on (i.e., when signal GH is asserted), and current sensing circuit 704 is active when lower power transistor 710 is turned on (when signal GL is asserted). GH and GL are not asserted at the same time, and GH and GL are typically asserted in a complementary fashion.

Current sensing circuit 702 includes a reference transistor 712 having an on-resistance Rrefp that is a known multiple of an on-resistance Rpwrp of upper power transistor 708. Thus, a ratio of Rpwrp to Rrefp is known. The source of reference transistor 712 is electrically coupled to a positive node VDD, and the drain of transistor 712 is electrically coupled to a node Vrefp.

A differential amplifier 714 drives transconductance stages 716 and 718 such that a voltage on node Vrefp is equal to a voltage on a node Vx. In some alternate embodiments, differential amplifier 714 and transconductance stage 716 are combined. An output of transconductance device 716 also drives transconductance device 706 to generate output signal I_recon when switching circuit 702 is active. Amplifier 714 has a gain Ap, transconductance device 716 has a gain gmp1, and transconductance device 718 has a gain gmp2. It can be shown that I_recon=I_L*(Rpwrp/Rrefp)*(gmout/gmp2)=IS1*IL for a scale factor IS1. Thus, I_recon is proportional to I_L when upper power transistor 708 is turned on. In some embodiments, recon is converted to a voltage signal. As stated above, above, the ratio of Rpwrp to Rrefp is known, and the ratio of gmout to gmp2 is also known. Thus, the magnitude of I_L can be determined from I_recon.

Current sensing circuit 704 is similar to current sensing circuit 702. Circuit 704 includes a reference transistor 722 having an on-resistance Rrefn that is a known multiple of an on-resistance Rpwrn of lower power transistor 710. Thus a ratio of Rpwrn to Rrefn is known. The source of reference transistor 722 is electrically coupled to node Vx, and the drain of transistor 722 is electrically coupled to a node Vrefn.

A differential amplifier 724 drives transconductance stages 726 and 728 such that a voltage on node Vrefn is equal to a voltage on node Vx. In some alternate embodiments, differential amplifier 724 and transconductance stage 726 are combined. An output of transconductance device 726 also drives transconductance device 706 to generate output signal I_recon when circuit 704 is active. Amplifier 724 has a gain An, transconductance device 726 has a gain gmn1, and transconductance device 728 has a gain gmn2. It can be shown that I_recon=I_L*(Rpwrn/Rrefn)*(gmout/gmn2)=IS2*I_L for a scale factor IS2. Thus, I_recon is proportional to I_L when lower power transistor 710 is turned on. As stated above, above, the ratio of Rpwrn to Rrefn is known, and the ratio of gmout to gmn2 is also known. Thus, the magnitude of I_L can be determined from I_recon.

Reconstructor circuit 700 typically includes a capacitor 720 coupled to the input of transconductance stage 706 to compensate the feedback loops of circuits 702 and 704 and prevent oscillation. It can be determined that circuit 702's feedback loop has a closed loop bandwidth given by: fp=Ap*gmp2*Gmp1/(2*π*C) where C is the value of capacitor 720. Similarly, circuit 704's feedback loop has a closed loop bandwidth given by fn=An*gmn2*gmn1/(2*π*C).

Capacitor 720 is also used in some embodiments to prevent output signal I_recon from falling to zero during times when neither of power transistors 708, 710 are conducting. In particular, in typical applications of reconstructor circuit 700, there will be some "dead time" in each switching cycle where neither GH nor GL is asserted. Such dead time helps prevent simultaneous conduction of upper and lower power transistors 708, 710, thereby helping prevent shoot through. Capacitor 720 maintains a voltage on the input of transconductance stage 706 during such dead time so that output signal I_recon remains proportional to the last sensed value of I_L during dead time. During non-dead time, I_recon is effectively equal to the sum of a first scale factor IS times current in 708, and a second scale factor IS2G times current in 710, where IS1G is gmout*IS1, and IS2G is gmout*IS2.

Figure 8:
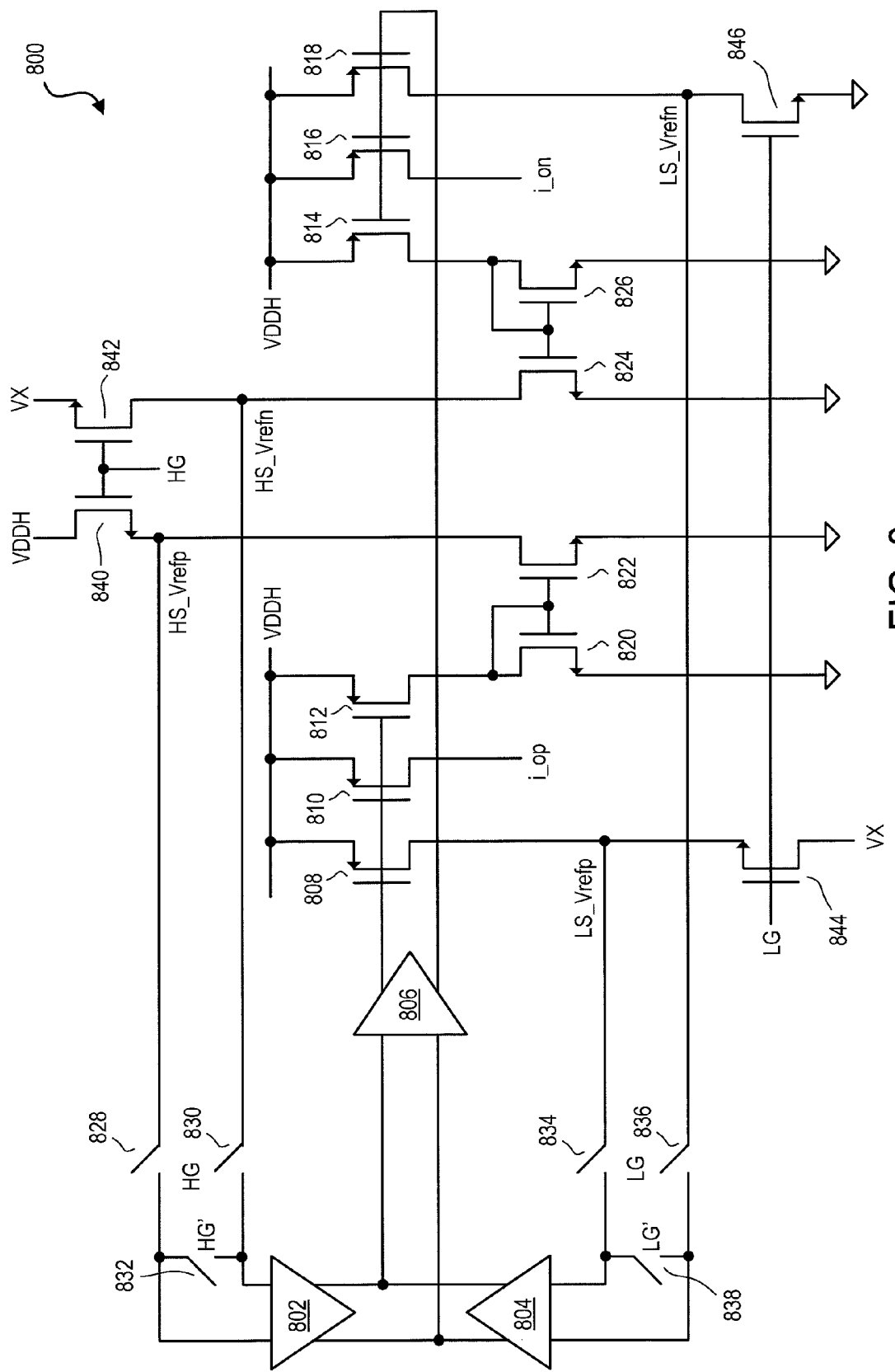
FIG. 8 shows a current reconstructor circuit including two current sensing circuits, in an embodiment.

FIG. 8 shows a current reconstructor circuit 800 including two current sensing circuits sharing common transconductance stages. Reconstructor circuit 800 is similar to reconstructor circuit 700 of FIG. 7. Reconstructor circuit 800 generates a differential output signal consisting of currents i_op and i_on. In alternate embodiments, the differential output signal is converted to a single ended signal or converted to a voltage signal. The output signal is proportional to current flowing from high side rail VDDH, through a high side power transistor (not shown), and out of a node Vx when signal HG is asserted. Similarly, when signal LG is asserted, the output signal is proportional to current flowing from ground, through a low side power transistor (not shown), and out of node Vx.

Reconstructor circuit 800 includes a positive reference transistor 840 and negative reference transistor 842 for measuring current out of node Vx when signal HG is asserted. Each of reference transistors 840, 842 has at least substantially the same on-resistance as the other transistor when operating under the same conditions. Furthermore, each of reference transistors 840, 842 has an on-resistance that is a known multiple of an on-resistance of the high side power transistor (not shown) electrically coupled between node VDDH and node Vx.

Reconstructor circuit 800 further includes a positive reference transistor 844 and negative reference transistor 846 for measuring current out of node Vx when control signal LG is asserted. Each of reference transistors 844, 846 has at least substantially the same on-resistance as the other reference transistor when operating under the same conditions. Furthermore, each of reference transistors 844, 846 has an on-resistance that is a known multiple of on-resistance of the low side power transistor (not shown) electrically coupled between node ground and node Vx.

Reconstructor circuit 800 includes a high side pre-amplifier 802 and a low side pre-amplifier 804 each driving inputs of an amplifier 806. Inputs of pre-amplifier 802 are electrically coupled to nodes HS_Vrefp and HS_Vrefn via switches 828, 830, which are closed when signal HG is asserted. Switch 832 shorts inputs of pre-amplifier 802 when signal HG is deasserted. Inputs of pre-amplifier 804 are electrically coupled to nodes LS_Vrefp and LS_Vrefn via switches 834, 836, which are closed when signal LG is asserted. Switch 838 shorts inputs of pre-amplifier 804 when signal LG is deasserted.

The outputs of amplifier 806 drive two transconductance stages. A first transconductance stage includes transistors 808-812 and 820-822. The first transconductance stage drives current through positive reference transistors 840, 844 and also mirrors current through these transistors to generate output signal current i_op. A second transconductance stage includes transistors 814-818 and 824-826. The second transconductance stage drives current through negative reference transistors 842 and 846 and also mirrors current through these transistors to generate output current signal i_on.

When signal HG is asserted, pre-amplifier 802, amplifier 806, and the two transconductance stages cooperate to equalize the voltages on nodes HS_Vrefp and HS_Vrefn. It can be shown that under such conditions i_op−i_on=I_L*Rhpwr/Rhref, where I_L is current out of node Vx, Rhpwr is the on-resistance of the high side power transistor, and Rhref is the on-resistance of each reference transistor 840, 842.

When signal LG is asserted, pre-amplifier 804, amplifier 806, and the two transconductance stages cooperate to equalize the voltages on nodes LS_Vrefp and LS_Vrefn. It can be shown that under such conditions that i_op−i_on=I_L*Rlpwr/Rlref, where I_L is current out of node Vx, Rlpwr is the on-resistance of the low side power transistor, and Rlref is the on-resistance of each reference transistor 844, 846.

The respective gains of each of pre-amplifiers 802, 804 can be selected such that closed-loop bandwidth of reconstructor circuit 800 is the same regardless of whether signal HG or LG is asserted. For example, if the low side power transistor has an on-resistance that is 5 times lower than that of the high side power transistor, pre-amplifier 804 may be configured to have a gain that is 5 times that of pre-amplifier 802.

Figure 9:
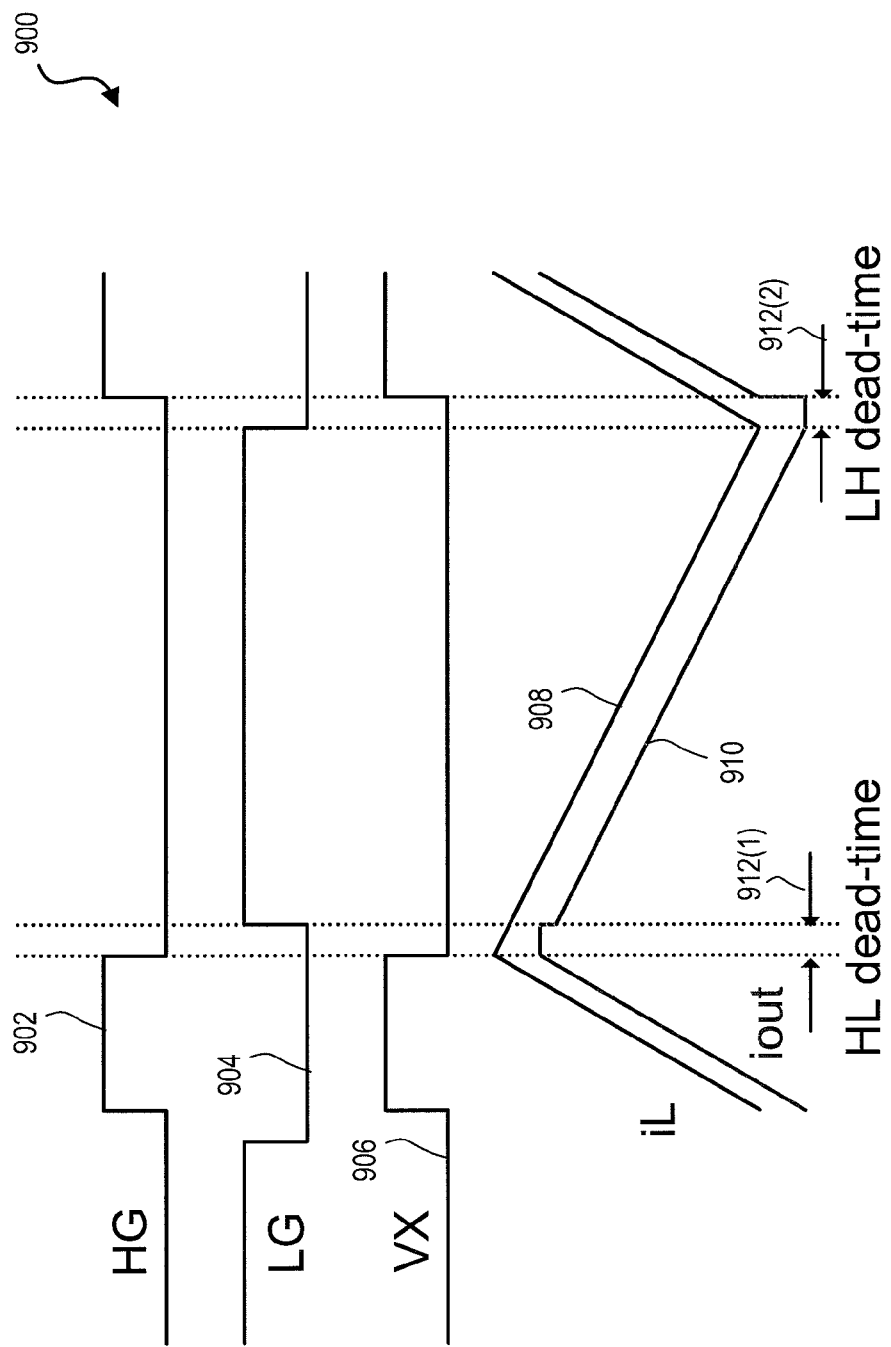
FIG. 9 shows a simulation of one embodiment of the current reconstructor circuit of FIG. 8.

FIG. 9 shows a simulation 900 of one embodiment of reconstructor circuit 800. Curves 902, 904 represent signals HG and LG, respectively, and curve 906 represents voltage on node Vx. Curve 908 represents current out of node Vx, and curve 910 represents reconstructor circuit 800's output signal (e.g., i_op−i_on). As can be observed, output signal 910 is proportional to current 908. The simulated embodiment also includes capacitors (not shown in FIG. 8) to store measured current information during dead time 912, such that output signal 910 represents a last sensed current level during the dead time.

Figure 10:
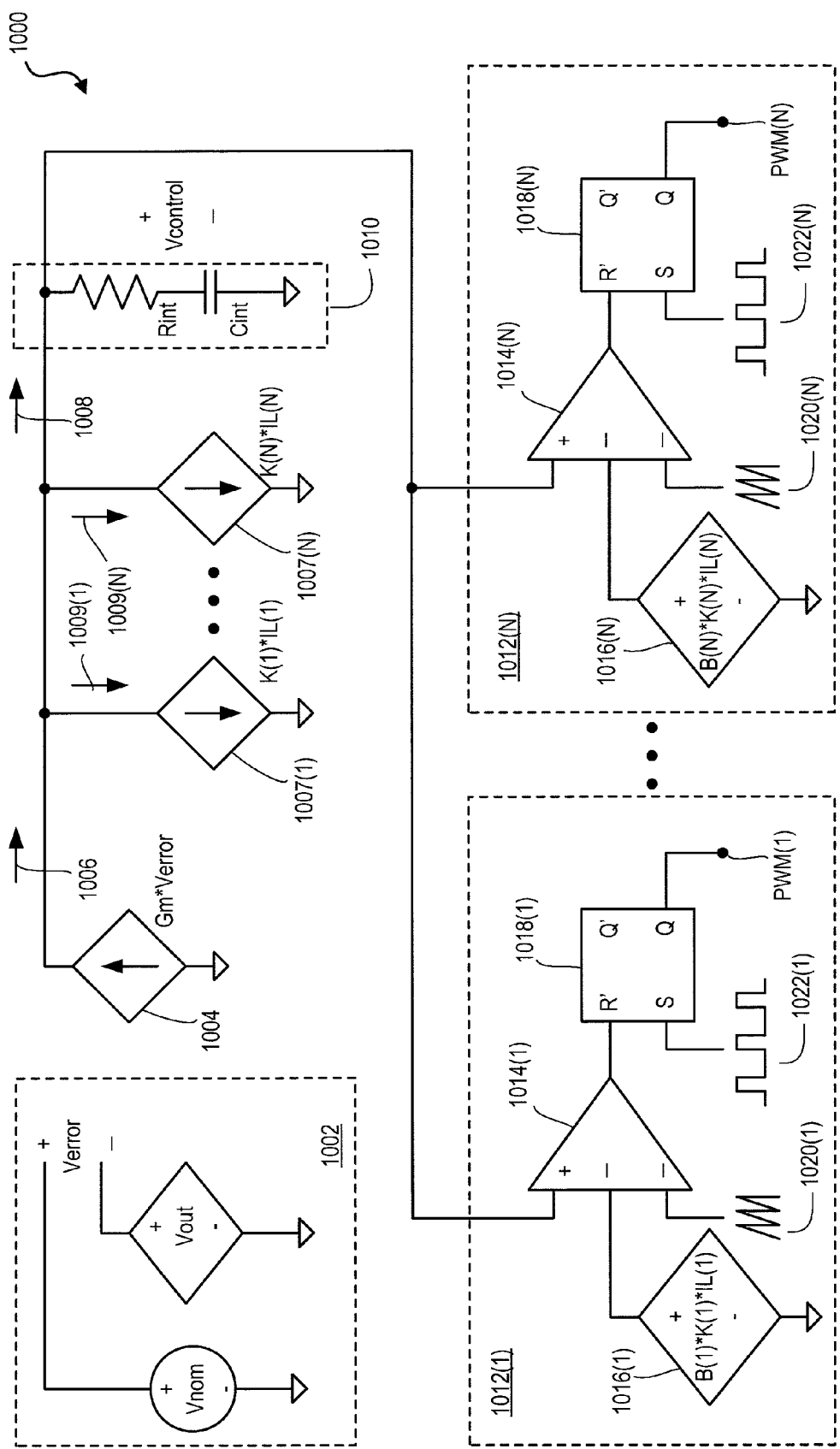
FIG. 10 shows one DC-to-DC converter current mode controller, in an embodiment.

FIG. 10 shows a block diagram of one DC-to-DC converter current mode controller 1000 that generates PWM signals based on phase current signals (e.g., I_sense signals of converter 300) and converter output voltage value. Controller 1000 can be used as controller 326 of FIG. 3 and is discussed in the context of DC-to-DC converter 300 for simplicity. However, it should be understood that controller 1000 is not limited to use in DC-to-DC converter 300. For example, controller 1000 could be adapted for use in other single or multiphase DC-to-DC converters, such as in the converters of FIGS. 1 and 2. It should also be noted that controller 326 of converter 300 could have a configuration different than that of controller 1000.

Controller 1000 includes an error amplifier 1002 which generates an error voltage Verror which is proportional to a difference between Vnom and a sensed value of DC-to-DC converter output voltage Vout, where Vnom is a desired value of converter output voltage Vout. Controller 1000 further includes a transconductance stage 1004 which generates desired current 1006 proportional to Verror. Actual phase currents 1009 are subtracted from desired current 1006 to generate current deficit 1008. Each phase current 1009 is equal to K times current out of the phase's switching node (e.g., equal to K times IL in converter 300). Current sources 1007, sometimes referred to as current sense interconnections, represent current sensing circuits, such as current reconstructors 322 in the DC-to-DC converter 300. Current deficit 1008 represents an amount by which actual output current differs from desired output current.

Current deficit 1008 is integrated by an integrator 1010 to obtain a control signal, such as control voltage Vcontrol. Integrator 1010, for example, includes an integration resistor Rint and an integration capacitor Cint, as shown in FIG. 10, to perform integration. However, integrator 1010 could take other forms, such as a microcontroller processor running firmware that integrates digitized values of current deficit 1008 to generate a digital control signal analogous to Vcontrol, or an op-amp based integrator.

Controller 1000 further includes N modulators 1012, where each modulator generates a PWM signal for a respective phase. For example, if controller 1000 is used as controller 326 of converter 300, in an embodiment, each modulator generates a PWM signal that is communicatively coupled as a CONTROL signal to a slave control 318 of a respective slave 306. Each modulator 1012 generates its respective PWM signal based on Vcontrol as well as current feedback from the phase associated with the modulator. Each modulator 1012 includes a comparator 1014, a voltage source 1016, and a flip-flop 1018. Each voltage source 1016 provides current feedback to its respective modulator. In particular, each voltage source 1016 generates a voltage equal to B*K*IL, where B is a gain associated with the modulator's current feedback circuit. Controller 1000 typically exhibits characteristics of both average and peak current mode control. However, operation can be changed from primarily peak current mode control to primarily average current mode control, or vice versa, by changing the ratio of B to Rint. Specifically, controller 1000 exhibits primarily peak current mode control characteristics if the value of B/Rint is large. Conversely, controller 1000 exhibits primarily average current mode control characteristics if the value of B/Rint is small.

Each modulator 1012 also receives a ramp signal 1020 and a clock signal 1022 from other circuitry (not shown) of the controller. Each ramp signal 1020 and clock signal 1022 of a given modulator 1012 are synchronized with each other. Ramp and clock signals 1020, 1022 of each modulator are typically phase shifted within a converter cycle with respect to corresponding ramp and clock cycles of each other modulator so that DC-to-DC converter output ripple current at least partially cancels in the converter's output capacitor.

Outputs of flip-flops 1018 are PWM signals, and each flip-flop is set by a clock signal 1022 received by the flip-flop's modulator 1012. Each flip-flop 1018 is reset by output of an associated comparator 1014, and each comparator 1014 compares Vcontrol to output of voltage source 1016 as well as a ramp signal 1020. The PWM signals from flip-flops 1018 are communicatively coupled to a respective phase (e.g., to a slave control 318 of a respective slave 306). As discussed further below, if output of comparator 1014 is low at the start of a clock cycle, such as may happen because of a large decrease in load current, flip-flop 1018 is not set by the clock signal 1022, and the modulator's PWM output does not transition high during the clock cycle, resulting in pulse skipping. In certain alternate embodiments, flip-flops 1018 are replaced with other logic having similar functionality. Additionally, in some alternate embodiments, the configuration of comparators 1014 and/or the format of its input signals are varied while retaining similar comparator functionality.

It should be realized that a PWM signals' polarity could be varied by modifying logic of modulators 1012. Additionally, it is anticipated that in some alternate embodiments, modulators 1012 will generate digital control signals that are not PWM signals, such as digitally encoded pulsewidth and synchronization signals that are transmitted to the slave as CONTROL signals to control a PWM modulator in the slave.

Figure 11A:
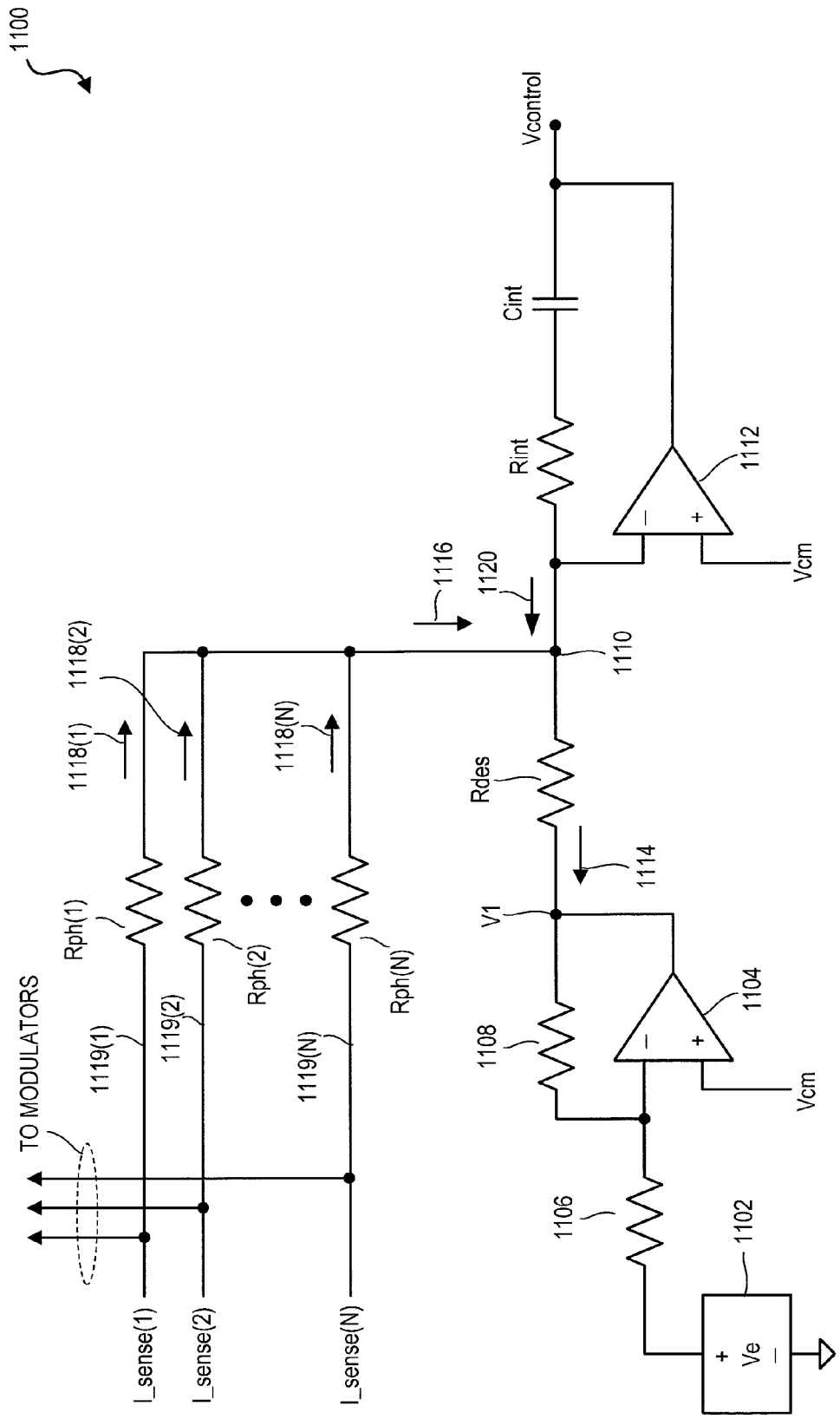
FIGS. 11A and 11B show one possible implementation of the controller of FIG. 10.
Figure 11B:
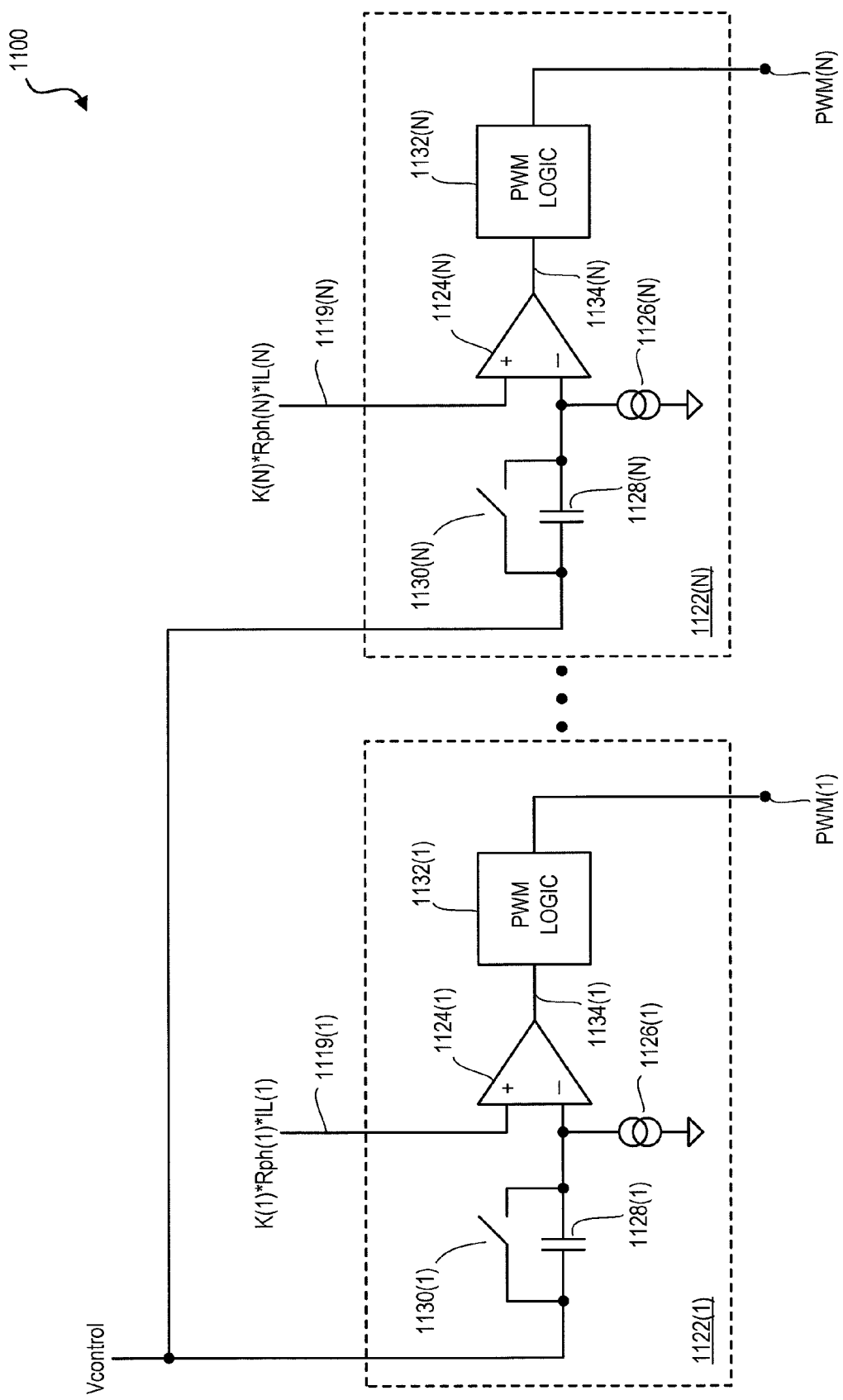

FIGS. 11A and 11B collectively show a controller 1100, which is one possible implementation of controller 1000 of FIG. 10. It should be understood however, that controller 1000 is not limited to such implementation. Controller 1100 includes an error amplifier 1102, which is analogous to error amplifier 1002 of FIG. 10. Error amplifier 1102 generates an error voltage Ve, which is a function of a difference between converter output voltage Vout and a desired converter output voltage Vnom. In one embodiment, error amplifier 1102 includes a double differential amplifier, and Ve is defined as follows: Ve=Vcm+P1*Vnom−P2*Vout, where Vcm is a common mode voltage that could be near the middle of the rail for similar (potentially identical) positive and negative swings, and P1 and P2 are scaling factors determined by the configuration of the double differential amplifier.

Error voltage Ve is amplified by an inverting gain stage including operational amplifier (op-amp) 1104 and resistors 1106, 1108 to obtain voltage V1 on op-amp 1104's output. The non-inverting input of op-amp 1104 is electrically coupled to a common mode voltage Vcm (e.g., 1.6 volts for a 3.3 volt bias supply), and the output of op-amp 1104 is electrically coupled to a summing or junction node 1110 by a resistor Rdes. The inverting input of another op-amp 1112 is also electrically coupled to junction node 1110, and the non-inverting input of op-amp 1112 is electrically coupled to Vcm. Accordingly, during steady state conditions, junction node 1110 is at voltage Vcm. Current through resistor Rdes, which is proportional to the difference between voltage V1 and the voltage on junction node 1110, represents desired converter output current 1114, and is analogous to desired current 1006 of FIG. 10.

Current 1116, which is analogous to the sum of currents 1009 of FIG. 10, flows into junction node 1110. Current 1116 is a scaled representation of total DC-to-DC converter output current and is equal to the sum of currents 1118. Each current 1118 is equal to K times IL of a respective phase, where IL is current out of the phase's switching node. Each current sense signal 1119 is electrically coupled to junction node 1110 via a respective resistor Rph. In embodiments configured for only single phase operation, there will be only one individual current 1118, which will be the same as current 1116. Voltage signals K*Rph*IL are also routed to PWM modulators, which are shown in FIG. 11B and discussed below.

The difference between desired current 1114 and actual current 1116 is a deficit current 1120 (analogous to deficit current 1008 of FIG. 10). Deficit current 1120 is integrated by an integrator including op-amp 1112, a resistor Rint, and a capacitor Cint to obtain control voltage Vcontrol (analogous to Vcontrol of FIG. 10).

Controller 1100 includes N modulators 1122 (analogous to modulators 1012 of FIG. 10) which are shown in FIG. 11B. Each modulator 1122 is associated with a respective phase, and each modulator 1122 includes a comparator 1124, a current source 1126, a capacitor 1128, a switch 1130, and PWM logic 1132. In each modulator, Vcontrol is coupled to comparator 1124 via a capacitor 1128. A current source 1126 charges capacitor 1128 to create a timing ramp signal analogous to ramp signal 1020 of FIG. 10. The ramp signal is superimposed on Vcontrol before Vcontrol is fed into comparator 1124. Switch 1130 opens at the beginning of each clock cycle and closes when comparator output 1134 changes state to indicate an end of a PWM pulse. Comparator 1124 compares Vcontrol, with the superimposed ramp signal, to a K*Rph*IL signal of the respective phase to generate a comparator output signal 1134. PWM logic 1132 in turn generates a PWM signal in response to comparator output signal 1134. In controller 1100, each current sense signal 1119 is scaled by a current gain K of its respective phase as well as by a value of Rph associated with the respective phase. Scaling resulting from resistors Rph is analogous to scaling factor B in FIG. 10.

It is anticipated that many embodiments of controller 1100 will be partially or completely packaged in a single integrated circuit chip. For example, in certain embodiments, all controller components, with the exception of resistors 1106, 1108, Rdes, Rint, and Rph and capacitor Cint are integrated in a common integrated circuit chip.

One notable feature of controller 1100 is that it can be configured such that a DC-to-DC converter utilizing the controller exhibits "droop," which is characterized by a small decrease in converter output voltage Vout with increasing converter output current Tout. In other words, in DC-to-DC converters with droop, Vout does not remain constant over load, but rather decreases slightly as a function of load. As known in the art, droop can be used to help maintain a DC-to-DC converter's output voltage within a specified range during transient loads. Controller 1100 advantageously can be configured such that a DC-to-DC converter utilizing the controller exhibits droop without requiring a dropping resistor in series with the converter's output or use of inductor resistance for current sensing. Controller 1100's droop implementation also does not depend on the number of phases that are present, thereby simplifying controller design and operation.

Specifically, droop can be implemented with controller 1100 by taking advantage of the fact that desired current 1114 must equal actual current 1116 under steady state conditions. As a result, assuming P1 is equal to P2, equivalent effective droop resistance Rdroop is given by: Rdroop=K*Rdes*R1106/(R1108*P1), where K is an average of the individual gains of each phase's current sense circuitry (e.g., average gain of reconstructor circuits 322 in converter 300). If no droop is desired, a capacitor can be electrically coupled in the feedback branch (in series with resistor 1108) of op-amp 1104 so that Rdroop is extremely small.

Another notable feature of certain embodiments of controller 1000 is that its architecture helps prevent overshoot on Vout during a large decrease in converter output current, such as due to a large step decrease in load, by, in an embodiment, operating in a pulse skipping mode, where some or all converter control switches (e.g., high side switches 314 in converter 300) do not switch on during one or more clock cycles, but sufficient converter control switches do turn on at appropriate times to supply the reduced load current. For example, in the implementation of FIGS. 11A and 11B, if converter output current quickly drops, Vcontrol will decrease. If the output current drop is significant enough such that Vcontrol drops below the sum of the ramp signal and current sense signal at the turn on synchronous clock instant of a given modulator 1122, the modulator's PWM signal fails to transition high, resulting in pulse skipping and a reduction in current supplied to the load.

Figure 12:
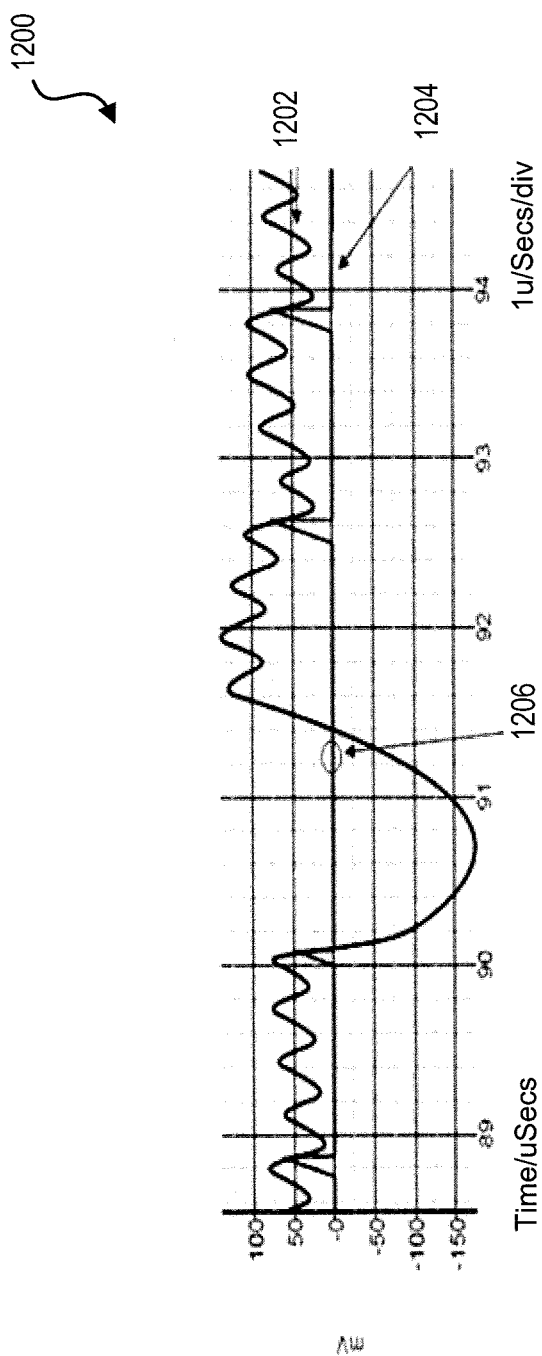
FIG. 12 shows a simulation illustrating pulse skipping in an embodiment of the DC-to-DC converter of FIG. 3 using the controller of FIGS. 11A and 11B.

FIG. 12 shows a simulation 1200 illustrating pulse skipping in one embodiment of converter 300 using controller 1100. Curve 1202 represents Vcontrol, and curve 1204 represents current sense signal I_sense of one slave. As can be observed, a pulse 1206 that would have otherwise occurred was skipped due to a drop in Vcontrol resulting from a decrease in load.

As discussed above, each modulator of controller 1000 includes current feedback with a gain of K*B. In many embodiments, the current feedback gain will be the same for each modulator such that each phase equally shares total DC-to-DC converter output current Iout. However, in some applications, it may be desirable for converter phases to carry unequal portions of Iout. For example, in applications where some phases are better cooled than other phases, it may be desired that the better cooled phases carry a larger portion of Iout than the other phases.

Unequal current sharing among phases can be achieved in a DC-to-DC converter utilizing controller 1000 by varying current feedback gain among modulators. For example, in the implementation of FIGS. 11A and 11B, each modulator's current feedback gain is determined in part by the value of resistor Rph of the phase associated with the modulator because the circuitry of op-amp 1112 acts to maintain the voltage at node 1110 constant. The voltage difference at nodes I_sense(1), I_sense(2), etc., therefore reflects sensing current times Rph added to the common mode voltage Vcm. For example, modulator 1122(1)'s current feedback gain is determined in part by the value of its associated resistor Rph(1), modulator 1122(N)'s current feedback gain is determined in part by the value of its associated resistor Rph(N), etc. Thus, unequal current sharing among phases can be achieved by varying the values of Rph among phases. Specifically, phases that have larger values of resistor Rph will conduct less current than phases having smaller values of resistor Rph.

Figure 13:
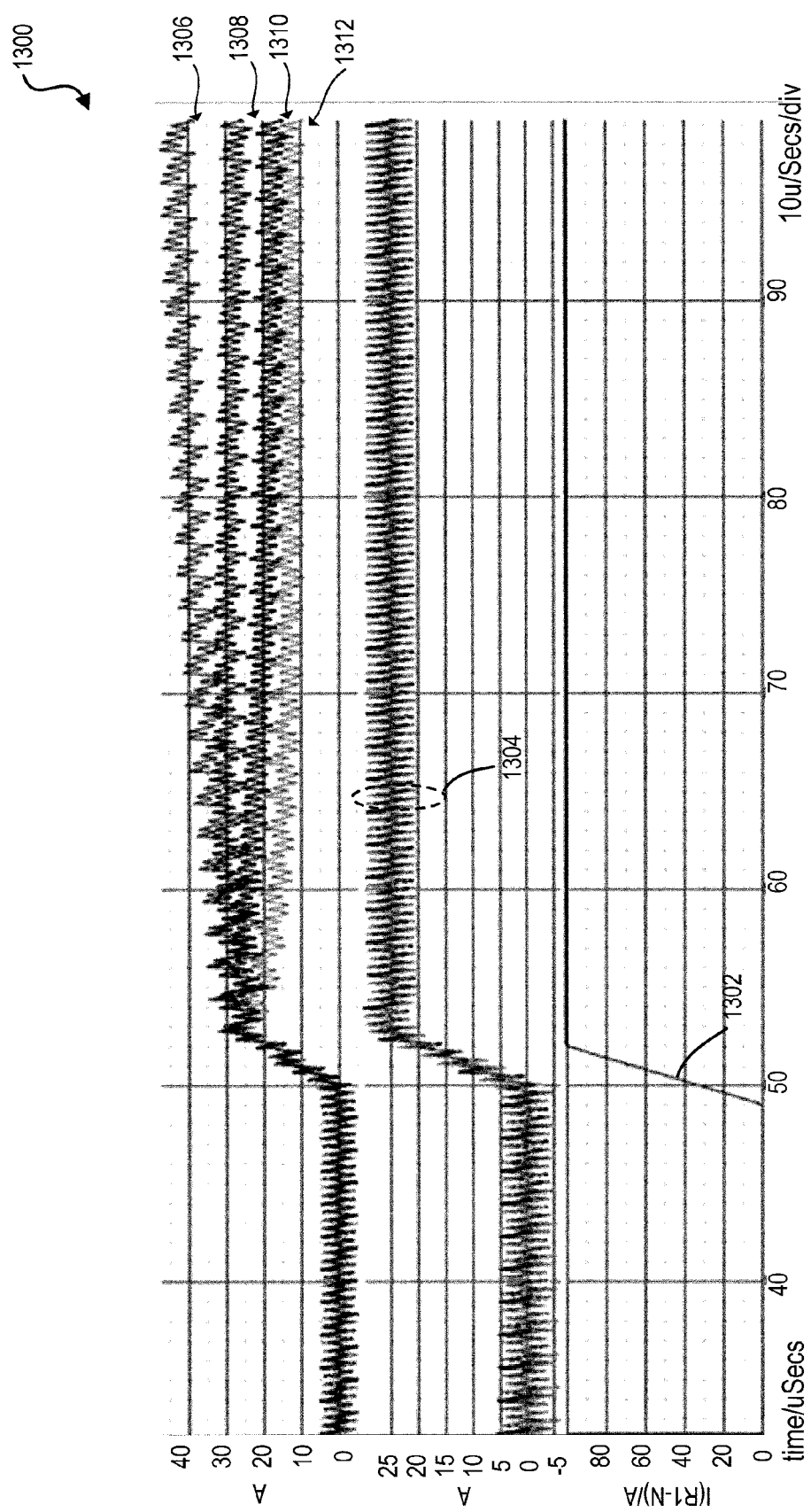
FIG. 13 shows a simulation illustrating how slave current sharing is affected by current feedback gain.

For example, FIG. 13 shows a simulation 1300 of how current sharing is affected by values of Rph in an embodiment of converter 300 including four slaves 306 and controller 1100. Curve 1302 represents total converter output current Iout. Although not individually distinguishable, phase currents IL of each of the four phases are represented by curves 1304 for the case where each phase has the same value of Rph. As can be observed from FIG. 13, the four phases share Tout relatively evenly when each phase has the same value of Rph.

Curves 1306, 1308, 1310, 1312 represent a scenario where each phase has a different value of Rph. Specifically, curve 1306 corresponds to a phase with a value of Rph of 0.5*Ravg, curve 1308 corresponds to a phase with a value of Rph of 1.0*Ravg, curve 1310 corresponds to a phase with a value of Rph of 1.5*Ravg, and curve 1312 corresponds to a phase with a value of Rph of 2.0*Ravg, where Ravg is a constant. As can be observed, the phase with the smallest value of Rph carries the most current, while the phase with the largest value of Rph carries the least current.

Figure 14A:
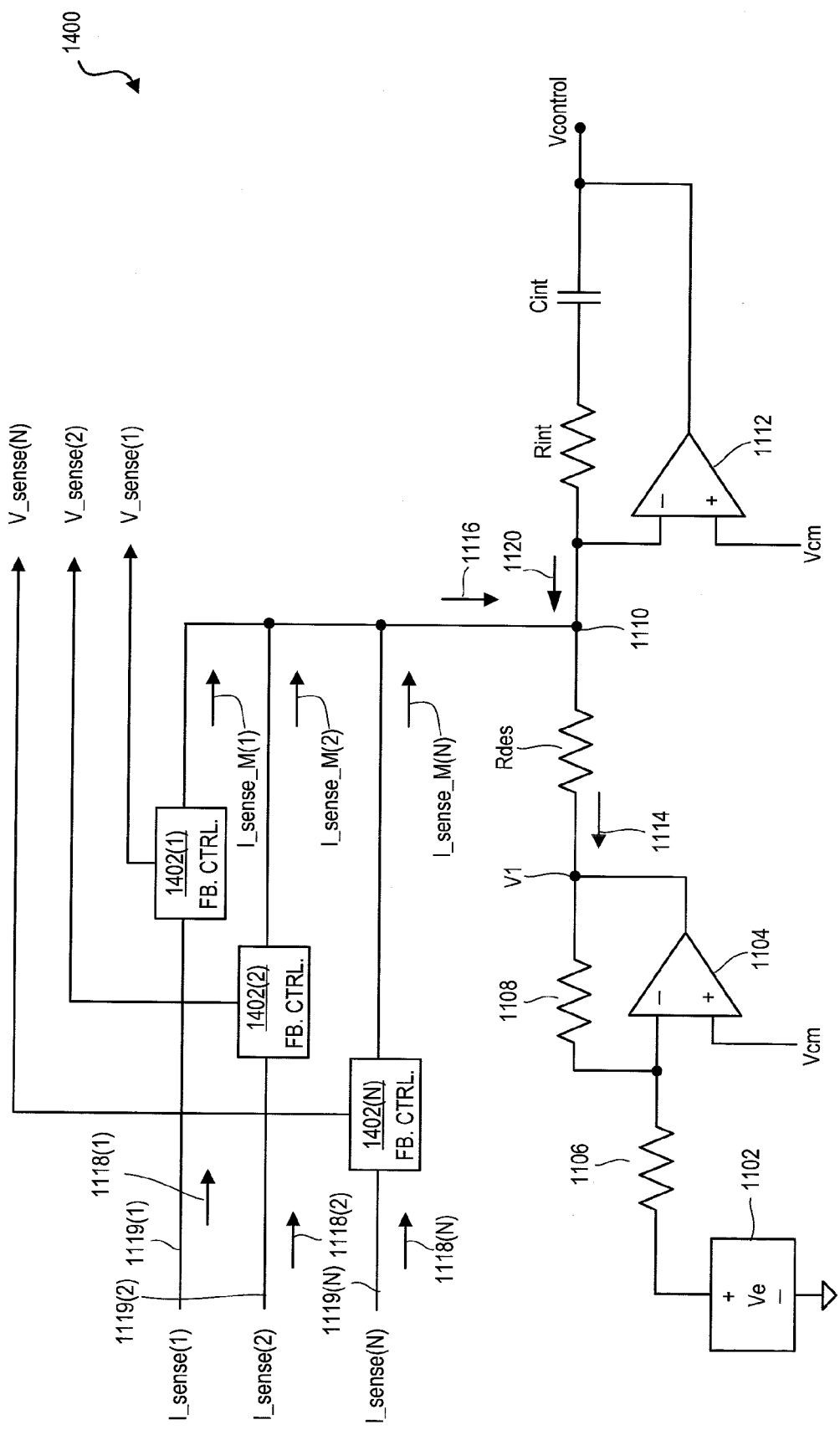
FIGS. 14A and 14B show an embodiment of the controller of FIGS. 11A and 11B with dynamically controlled current feedback gain.
Figure 14B:
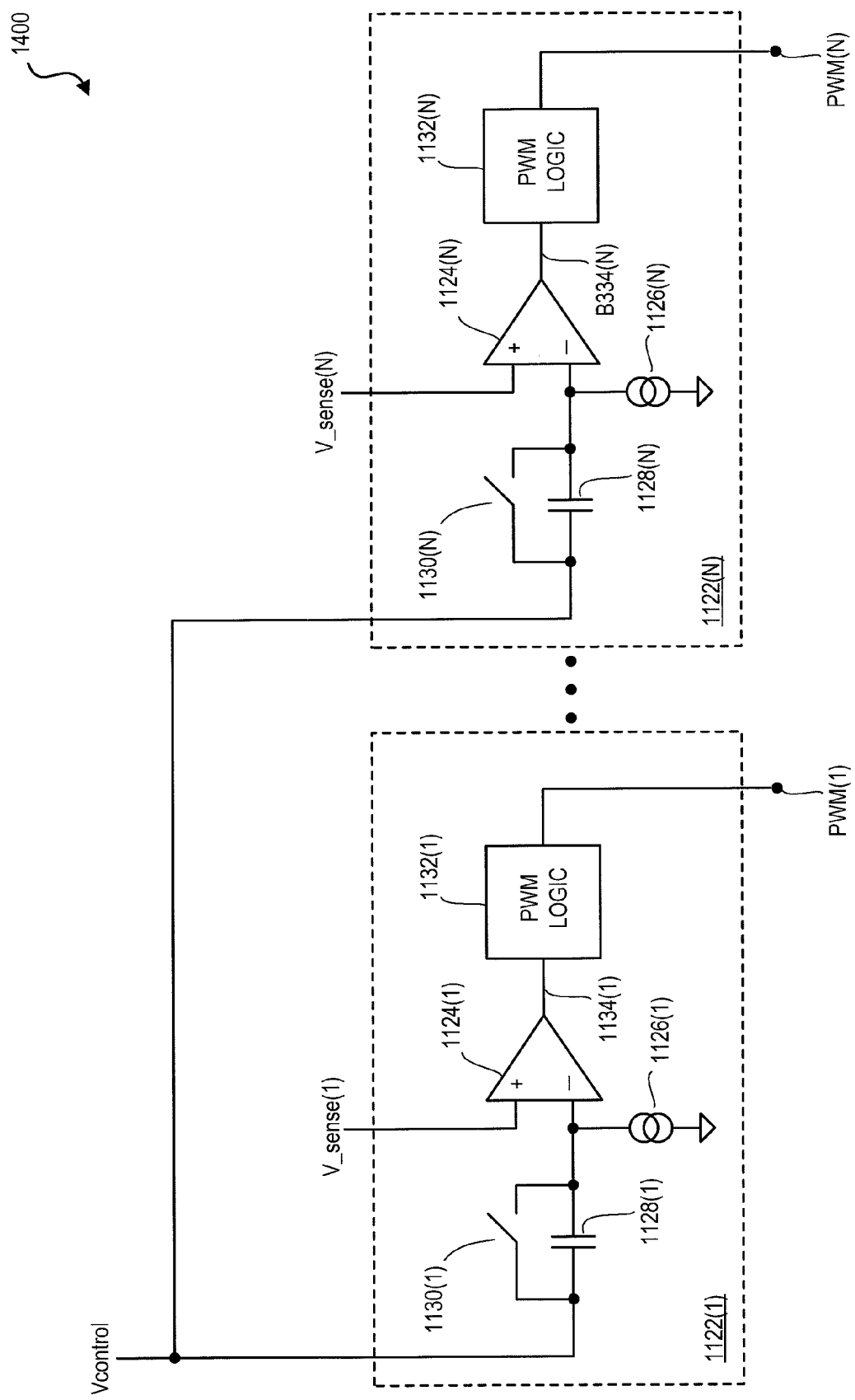

Some embodiments of controller 1000 are operable to dynamically control current feedback gain such that current sharing among phases can be dynamically changed, such as for thermally balancing phases. Adjustment of current feedback gain also allows dynamic adjustment of the converter's loadline, or voltage versus current characteristics. For example, FIGS. 14A and 14B show a controller 1400, which is similar to controller 1100, but with dynamically adjustable current feedback gain. In particular, a feedback control circuit 1402 is electrically coupled to each I_sense line. Each feedback control circuit 1402 generates a signal I_sense_M, which is proportional to a respective I_sense signal. Each feedback control circuit 1402 also generates a voltage signal V_sense proportional to its respective signal I_sense. A ratio of magnitude of V_sense to magnitude of I_sense is dynamically adjustable such that current feedback of each phase is dynamically adjustable. Each V_sense signal is fed to a respective modulator 1122, as shown in FIG. 14B.

Figure 15:
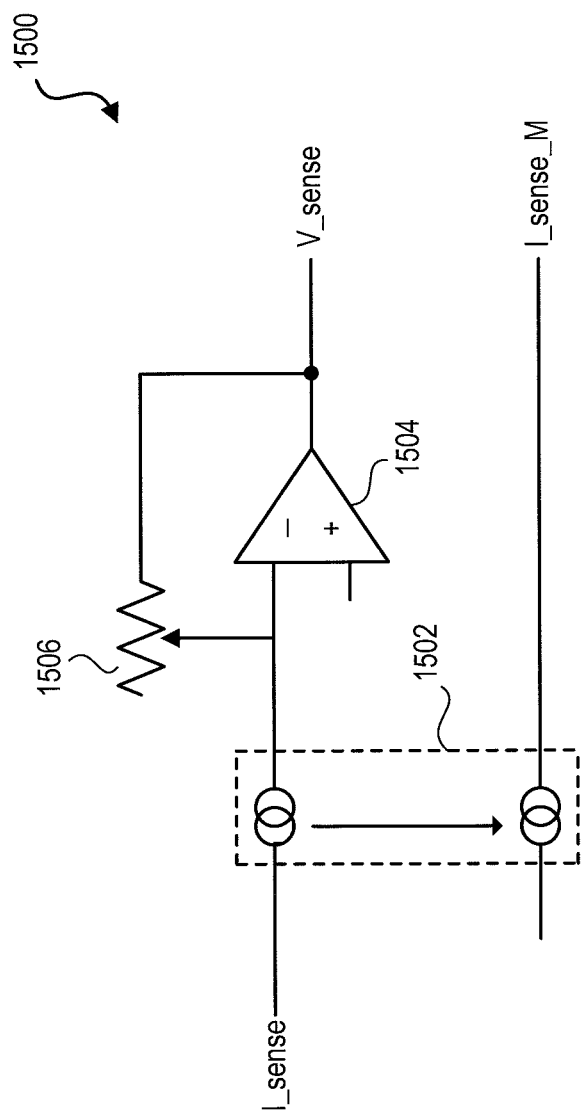
FIG. 15 shows a feedback control circuit, in an embodiment.

FIG. 15 shows a feedback control circuit 1500, which is one possible embodiment of feedback control circuit 1402. Feedback control circuit 1500 includes a current mirror circuit 1502 which mirrors current signal I_sense to generate corresponding current signal I_sense_M. An op-amp 1504 and a variable resistor 1506 generate voltage signal V_sense. A ratio of magnitude of V_sense to magnitude of I_sense is dynamically adjustable by varying a value of variable resistor 1506.

In certain situations, it may be desirable to determine the values of resistors Rdes and/or Rph in controller 1100, such as for use in calculations to determine currents through these resistors from measured voltages across these resistors. Since these resistors are, in an embodiment, internal resistors of an integrated circuit, their relative values tend to track each other but are subject to substantial variation in absolute resistor value due to variations in processing. For example, if the value of Rdes is known, current through Rdes can be determined by dividing a voltage across Rdes by the value of Rdes. It may be useful to know the current through Rdes because such current represents total DC-to-DC converter output current Iout during steady state conditions. Additionally, current through a resistor Rph represents averaged current of an associated phase.

Accordingly, certain embodiments of controller 1100 include circuitry to determine values of Rdes and/or Rph, such as at start up. For example, in some embodiments, controller 1100 includes circuitry to inject a known DC current into junction node 1110 and through resistor Rdes. Voltage across Rdes is measured, and the value of Rdes is determined by dividing the measured voltage by the known value of the current.

As another example, some embodiments of controller 1100 include circuitry to inject a known current in each current sense signal line 1119 to determine actual values of resistors Rph. The voltage across each resistor Rph is measured, and the resistor's value is determined by dividing its measured voltage by the magnitude of the current through the resistor.

Figure 16:
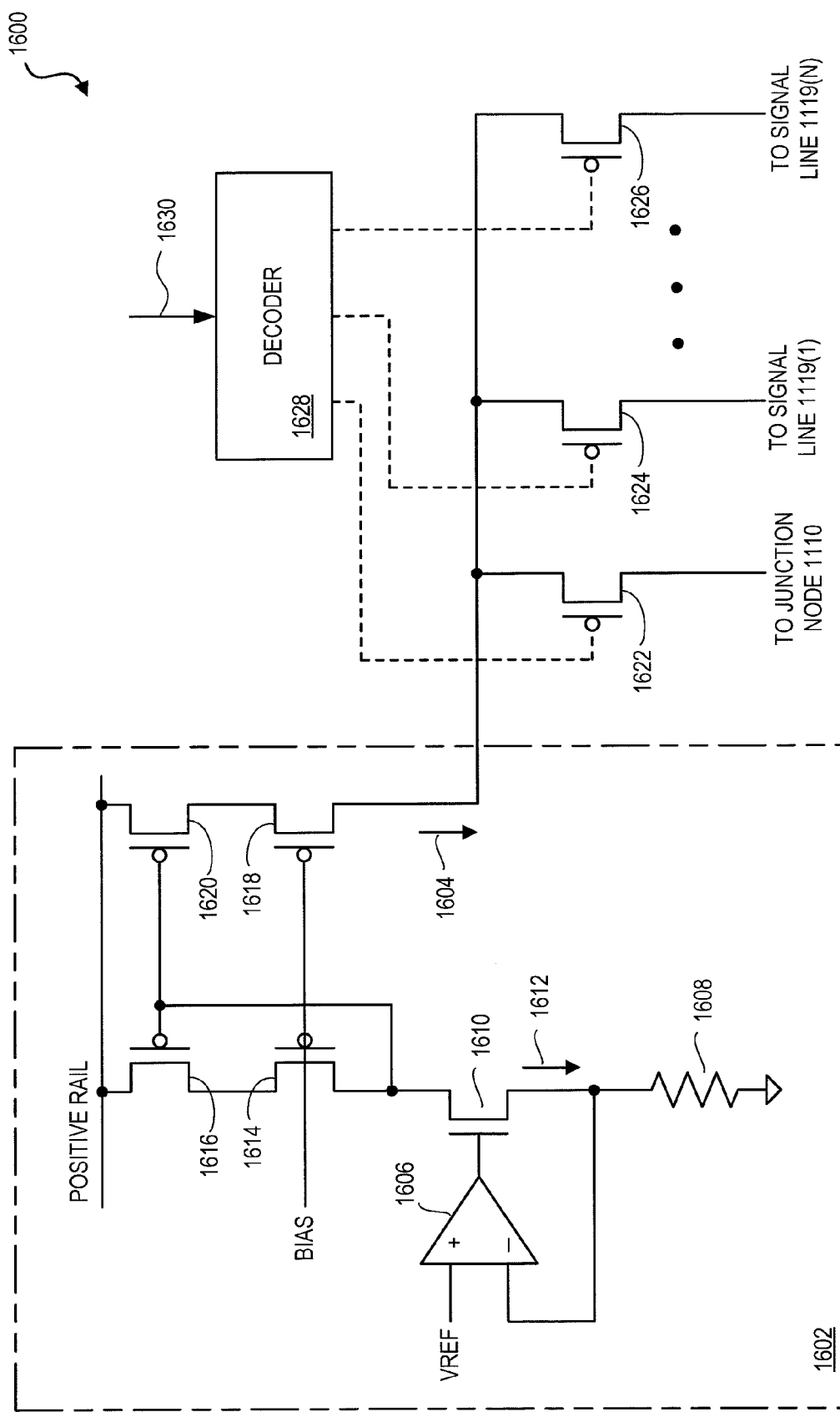
FIG. 16 shows a test current circuit, in an embodiment.

FIG. 16 shows a current circuit 1600 that is in included some embodiments of controller 1100 to generate and control currents for measuring values of Rdes and Rph during start up. Circuit 1600 includes a subsection 1602 for generating a current 1604. An op-amp 1606, a resistor 1608, and a transistor 1610 generate a reference current 1612 approximately equal to VREF divided by the value of resistor 1608. Reference current 1612 is mirrored by transistors 1614, 1616, 1618, 1620 to generate current 1604. Transistors 1622, 1624, 1626 direct current 1604 to one of junction node 1110 or a current sense signal line 1119 under command of a decoder 1628 in response a select signal 1630.

Many integrated circuit (IC) manufacturing processes provide fairly close resistor-to-resistor matching, both of identical resistors and of resistors having ratioed values, while providing only approximate control over absolute values of resistors. For example, a particular IC manufacturing process may provide a first and a second resistor to match values to within one or two percent, while both the first and second resistors may be only within twenty percent of a designed value. In an alternative embodiment, a reference resistor R_Refres is provided on each slave, together with circuitry for measuring a value of reference resistor R_Refres. In this embodiment, actual values of other resistors within the DC-to-DC converter are inferred from the value of R_Refres and the resistor matching properties of the manufacturing process.

Figure 17:
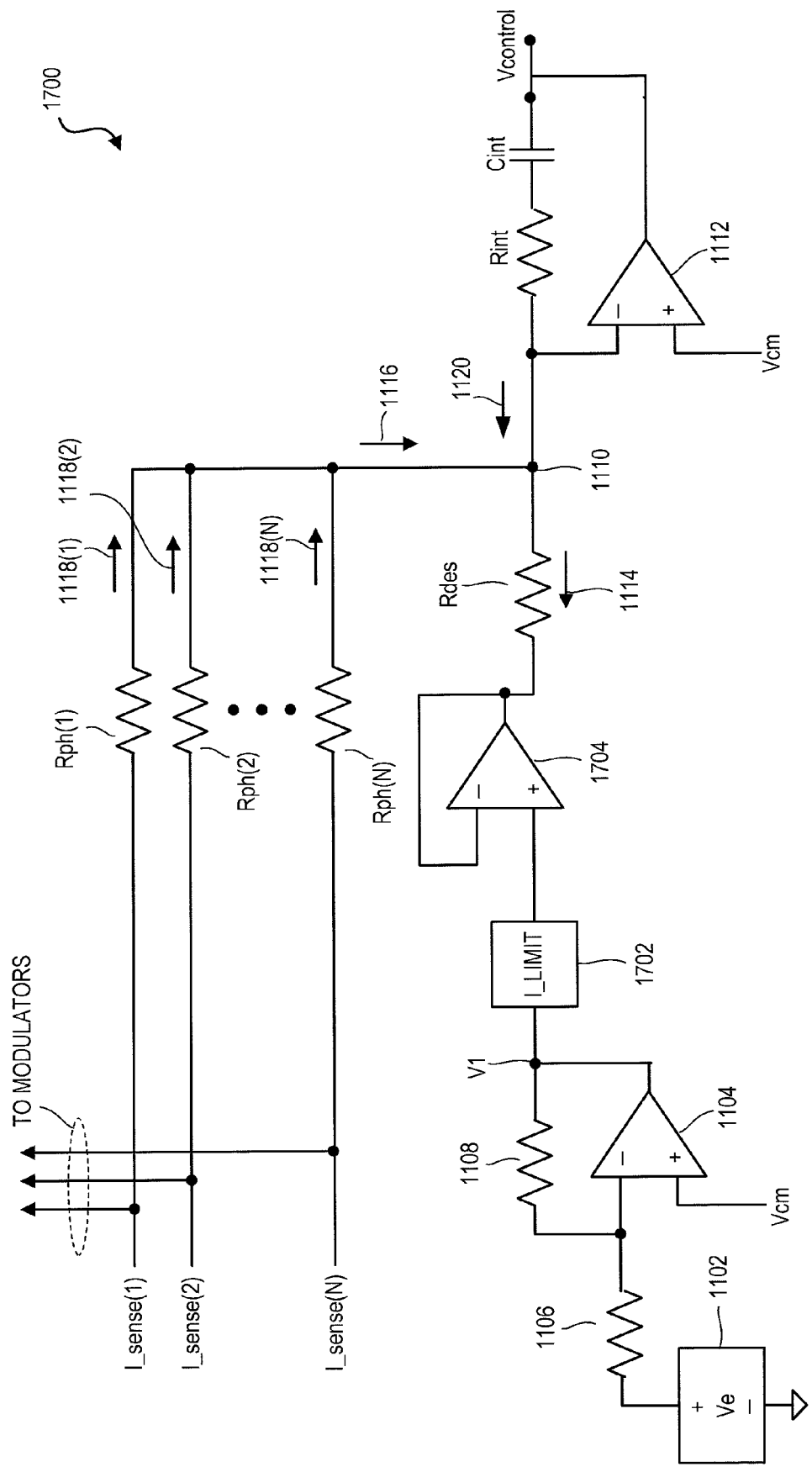
FIG. 17 shows an embodiment of the controller of FIGS. 11A and 11B with current limiting.

Some embodiments of controller 1100 include a current limit subsystem to limit DC-to-DC converter output current Iout to a maximum value, such as to prevent damage to the converter and/or to promote safety. Current limiting can be implemented, for example, by clamping output of current source 1004 (FIG. 10) to a predetermined range of values. For example, FIG. 17 shows a controller 1700, which is an embodiment of controller 1100 including a current limiting feature. Controller 1700 differs from controller 1100 in that controller 1700 includes a current limiting subsystem 1702 and buffer stage 1704 electrically coupled between the output of op-amp 1104 and Rdes. The modulators of controller 1700, which are not shown for simplicity in FIG. 17, are the same as the modulators of controller 1100.

Current limiting subsystem 1702 limits the output of op-amp 1104 to within a predetermined window of Vcm to limit desired current 1114 and thereby limit Iout. In some embodiments, the maximum value of Iout permitted by current limiting subsystem 1702 is scaled in proportion to a number of populated slaves 306 that are active. For example, if a DC-to-DC converter utilizing controller 1700 includes four phases and only two phases are active at a particular moment of time, current limiting subsystem 1702 limits Iout to a maximum value that is half of a maximum value when all slaves are active.

Figure 18:
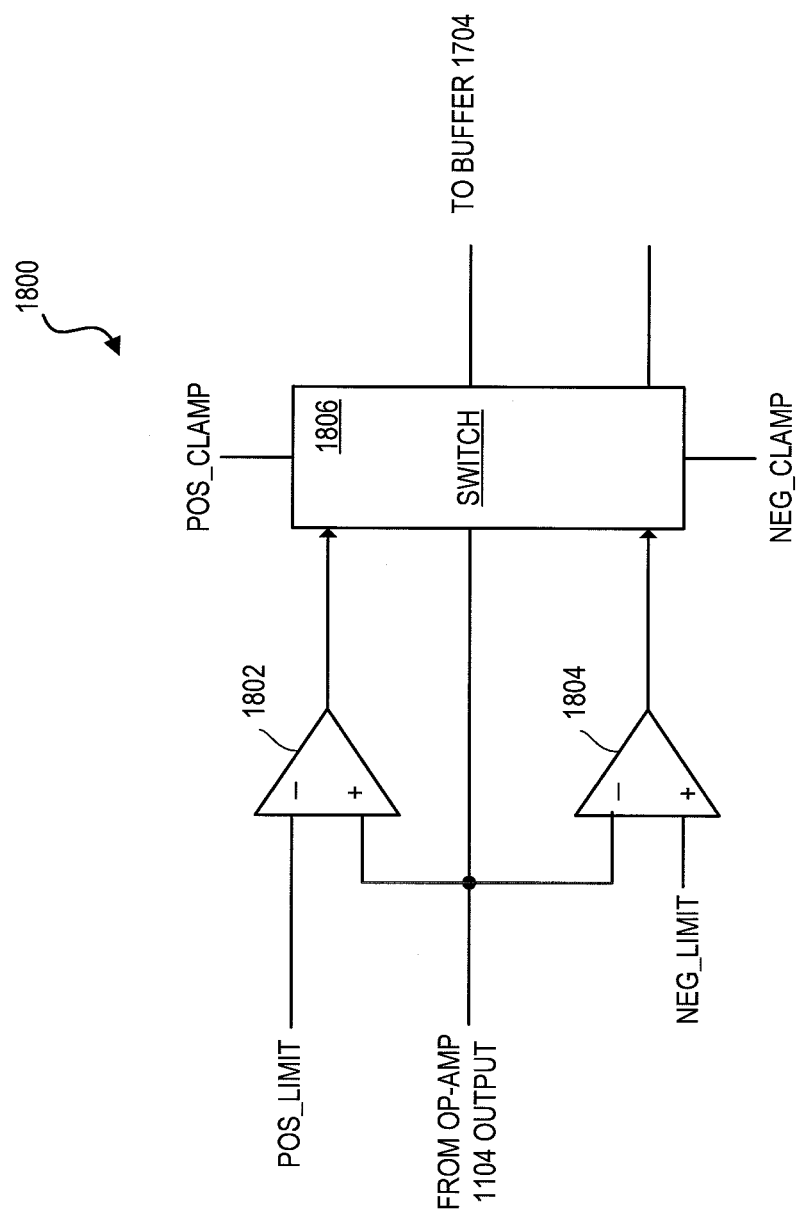
FIG. 18 shows a current limiting subsystem, in an embodiment.

FIG. 18 shows current limiting subsystem 1800, which is one possible implementation of current limiting subsystem 1702. Current limiting subsystem 1800 includes two comparators 1802, 1804. The non-inverting input of comparator 1802 and inverting input of comparator 1804 each connect to the output of of-amp 1104. The outputs of comparators 1802, 1804 each connect to a switch 1806. The inverting input of comparator 1802 connects to a reference POS_LIMIT, and the non-inverting input of comparator 1804 connects to a reference NEG_LIMIT. If the output of op-amp 1104 exceeds POS_LIMIT, comparator 1802 causes switch 1806 to electrically couple input of buffer 1704 to a POS_CLAMP voltage. If the output of op-amp 1104 falls below NEG_LIMIT, comparator 1804 causes switch 1806 to electrically couple input of buffer 1704 to a NEG_CLAMP voltage. If the output of op-amp 1104 is within a range bounded by POS_LIMIT and NEG_LIMIT, switch 1806 allows the output of op-amp 1104 to electrically couple to the input of buffer 1704. In some embodiments, references POS_LIMIT and NEG_LIMIT as well as clamp voltages POS_CLAMP and NEG_CLAMP are scaled in proportion to a number of DC-to-DC converter phases that are active.

Figure 19:
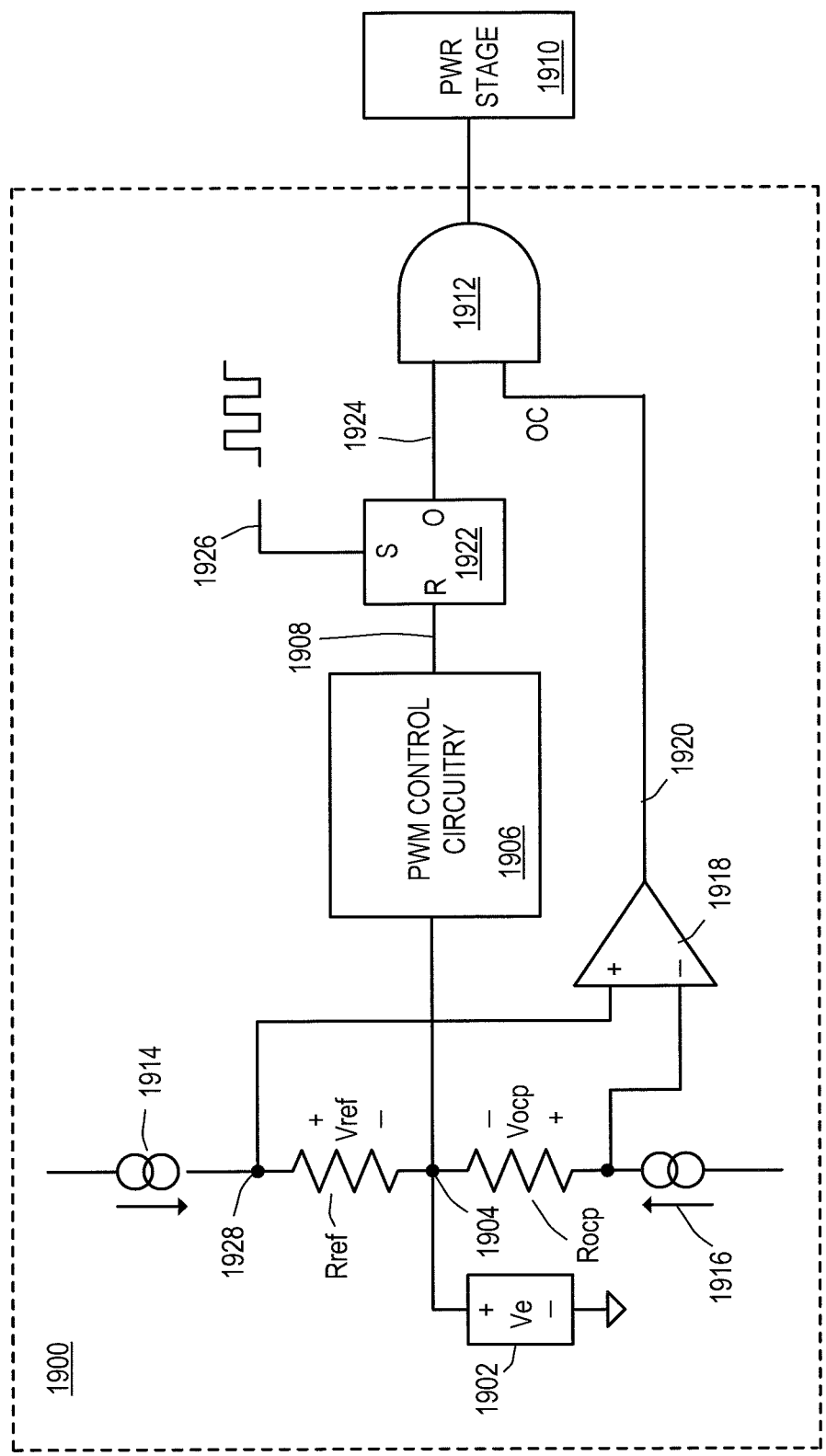
FIG. 19 shows a DC-to-DC converter controller including over current protection, in an embodiment.

FIG. 19 shows a DC-to-DC converter controller 1900, which is another DC-to-DC converter controller including over current protection. Controller 1900 includes an error amplifier 1902 that generates an error signal Ve on a junction node 1904 proportional to a difference between an actual value of the DC-to-DC converter output voltage and a desired value of the output voltage. The error signal is received by PWM control circuitry 1906 which generates a reset signal 1908. A latch 1922 generates PWM signals on an output 1924. Latch 1922 is set by a clock signal 1926 and reset by reset signal 1908. Latch output 1924 is coupled to a DC-to-DC converter power stage 1910 via a gate 1912 which is controlled by an over current signal OC. When signal OC is deasserted (indicating no over current condition), gate 1912 allows high state PWM signals from output 1924 to reach power stage 1910. When signal OC is asserted (indicating an over current condition), gate 1912 blocks high state PWM signals from reaching power stage 1910, thereby preventing control switch conduction in power stage 1910. In certain alternate embodiments, gate 1912 blocks PWM signals having a different level (e.g., low state PWM signals) from reaching power stage 1910 when signal OC is asserted. Additionally, in some alternate embodiments, control signals generated by control circuitry 1906 are digital control signals other than PWM signals.

Controller 1900 further includes a reference current source 1914 which injects current into a reference resistor Rref to establish a voltage Vref with respect to node 1904. A current signal 1916 proportional to DC-to-DC converter output current is injected into a resistor Rocp to establish a voltage Vocp with respect to node 1904. In certain embodiments, current signal 1916 is generated external to controller 1900, such as by a slave's current reconstructor circuit. A comparator 1918 compares Vref to Vocp, and an output 1920 asserts signal OC when Vocp exceeds Vref. Comparator 1918 typically includes hysteresis to prevent undesired oscillation between output states.

Some embodiments include additional circuitry (not shown) to implement negative over current protection, whereby magnitude of current sourced by the converter back into the converter's output node is limited. Such additional circuitry typically includes another comparator similar to comparator 1918 to compare Vocp to a reference voltage (e.g., a negative of Vref, such as obtained by reversing direction of reference current source 1914 or by sinking current from a node 1928). In the event of a negative over current condition, a control switch of DC-to-DC converter power stage 1910 can be turned on for a fixed amount of time to reduce peak current magnitude. At the end of such fixed time, power stage 1910 resumes operating in accordance with PWM signals on output 1924 until the negative over current protection trips again.

Figure 20:
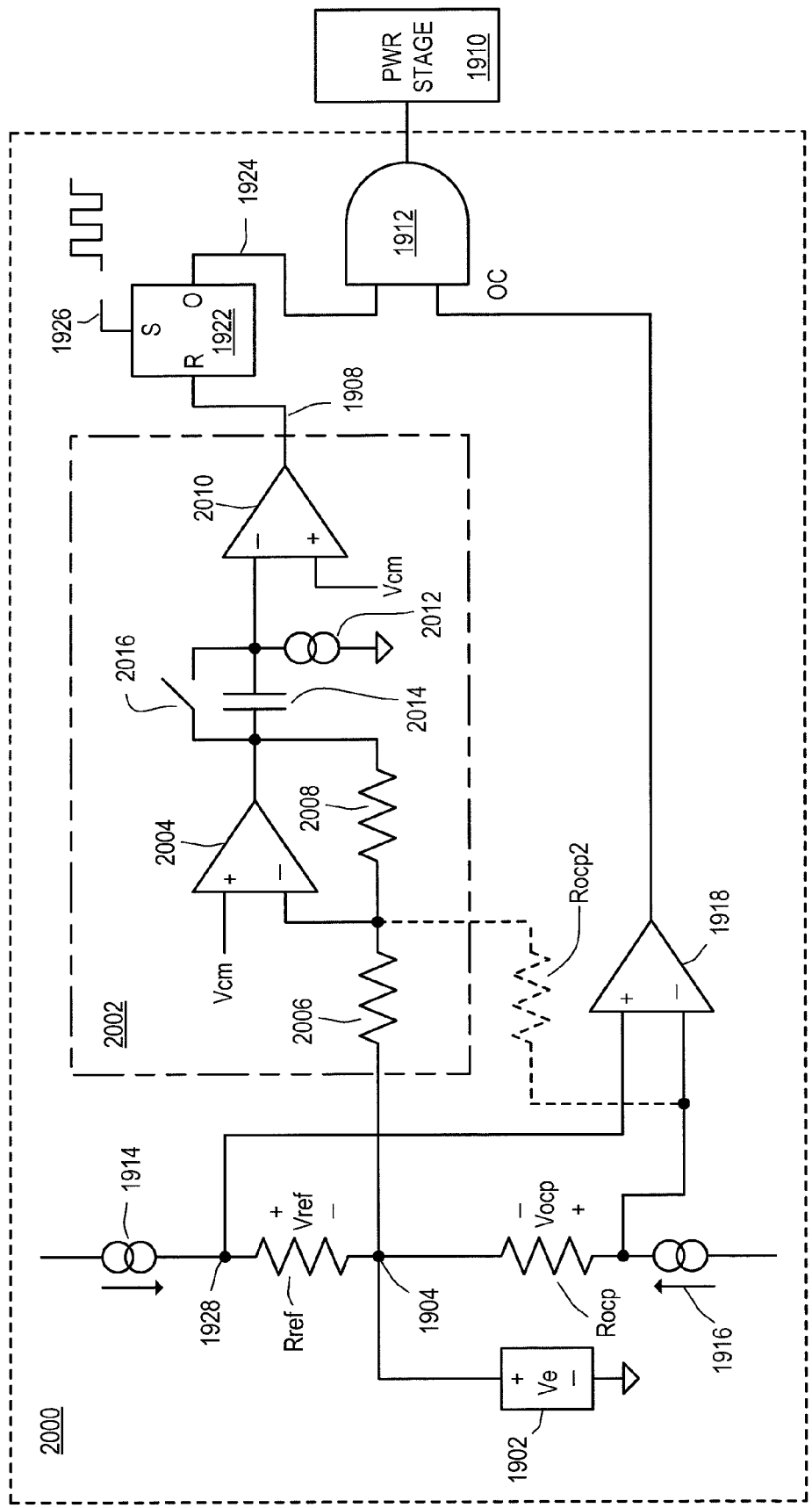
FIG. 20 shows another DC-to-DC converter controller, similar to the controller of FIG. 19, including over current protection, in an embodiment.

FIG. 20 shows a controller 2000, which is an embodiment of controller 1900 with PWM control circuitry 2002. PWM control circuitry 2002 includes an inverting stage including an op-amp 2004 and resistors 2006, 2008 that amplifies an output of error amplifier 1902 for input to latch 1922. In some embodiments, one or more of resistors 2006 and 2008 are replaced with a respective network of passive devices (e.g., a resistor in parallel with a capacitor, a resistor in series with a capacitor, or other R-L-C networks). A current source 2012, a capacitor 2014, and a switch 2016 superimpose a ramp signal on the output of op-amp 2004. Comparator 2010 generates reset signal 1908. In the event droop is desired, resistor Rocp is replaced with resistor Rocp2 electrically coupled to the inverting input of op-amp 2004 so that converter output voltage drops as magnitude of current signal 1916 increases.

It is sometimes desirable to shut down one or more phases in a multiphase DC-to-DC converter. For example, during light load conditions, all phases may not be needed, and it may be possible to obtain higher light-load efficiency by shutting down un-needed phases. However, when controller 1000 is used in a multiphase DC-to-DC converter, changing the number of active phases changes the bandwidth and phase margin of controller 1000's control loop. Therefore, some embodiments of controller 1000 are configured to automatically change control loop characteristics as the number of active phases changes such that control loop bandwidth and phase margin are sufficient for stability as the number of active phases changes. In an embodiment, control-loop bandwidth remains at least somewhat constant as the number of active phases varies.

Figure 21:
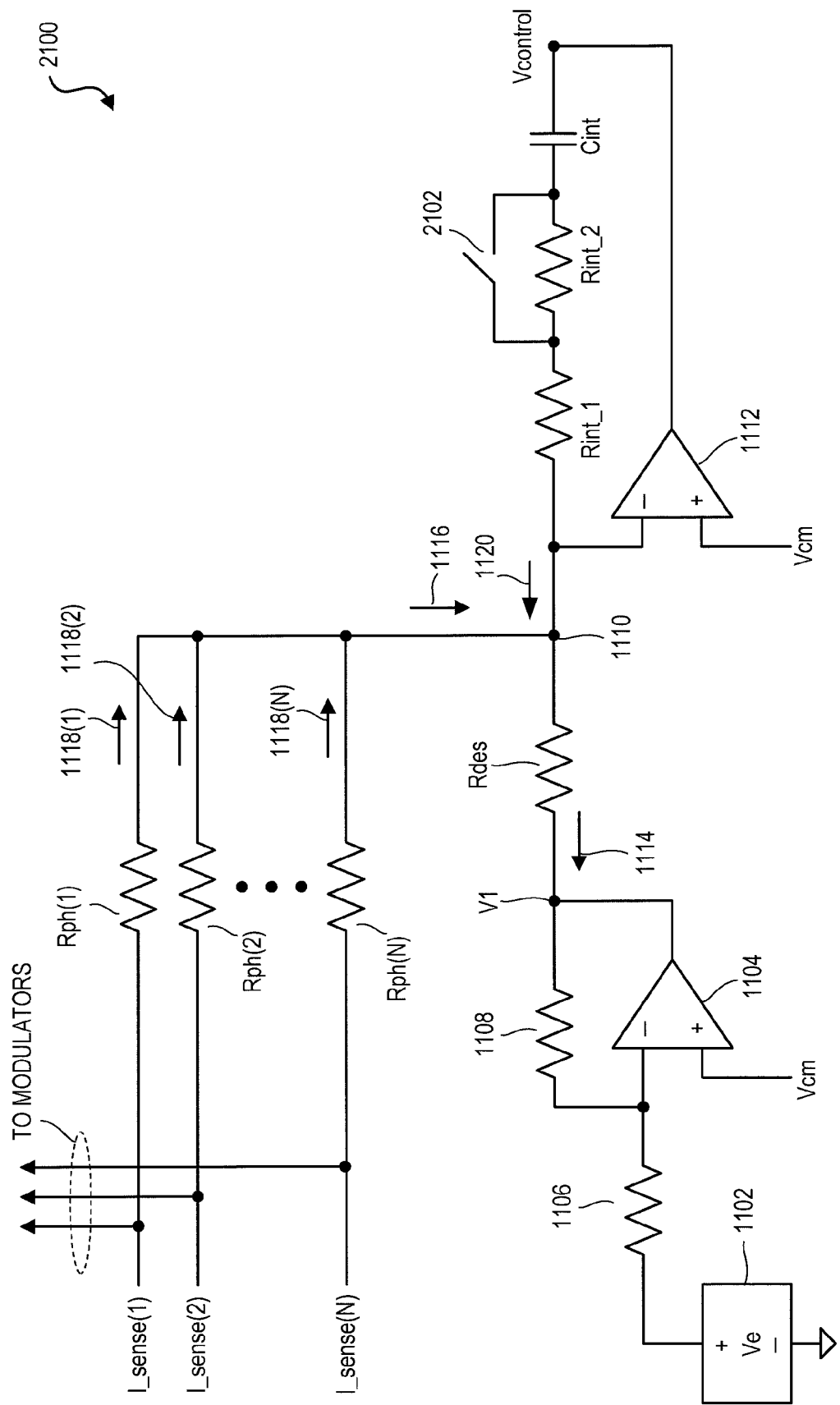
FIG. 21 shows an embodiment of the controller of FIGS. 11A and 11B with automatically adjusting integrator gain.

For example, FIG. 21 shows a controller 2100, which is an embodiment of controller 1100 with automatically adjustable integrator gain. Integrator gain is adjusted as the number of active phases changes such so that control loop bandwidth and phase margin remain relatively constant as the number of active phases varies. Controller 2100 is the same as controller 1100 with the exception that controller 2100 includes two resistors, Rint_1 and Rint_2, and a switch 2102 in the feedback branch of op-amp 1112. Switch 2102 is opened and closed to change integrator gain. Specifically, if at least half of phases are active, switch 2102 is closed such that resistor Rint_2 is shorted out of the feedback loop. If less than half of phases are active, switch 2102 is opened so that resistor Rint_2 is added to the feedback loop to help compensate for the reduction in active phases. It is anticipated that alternate embodiments of controller 2100 will include additional switches and resistors in a feedback to op-amp 1112 to provide greater granularity in adjusting integrator gain. For example, in an alternate embodiment, additional switches and resistors enable adjusting of integrator gain whenever there is any increase or decrease in number of active phases. In some alternate embodiments, integrator gain is adjusted based on actions other than a change in number of active phases, such as a change in characteristics of a load powered by a converter including controller 2100.

It is sometimes desirable to operate a switching DC-to-DC converter in discontinuous conduction mode (DCM) under certain circumstances, such as during light load conditions. DCM may be more efficient than continuous conduction mode (CCM) during light load conditions, the advantages of DCM for efficiency at light loads are well known in the art. Accordingly, some embodiments of controller 1000 are configured to support DCM as well as CCM, and to automatically switch between modes. However, in certain embodiments of controller 1100 (FIGS. 11A, 11B), control voltage Vcontrol is close to or below common mode voltage Vcm during DCM. Such fact may cause undesired overshoot and undershoot on Vout during transitions from CCM to DCM and CCM to DCM, respectively. Accordingly, certain embodiments of controller 1100 include circuitry to scale Vcontrol during DCM to help alleviate such transients.

Figure 22A:
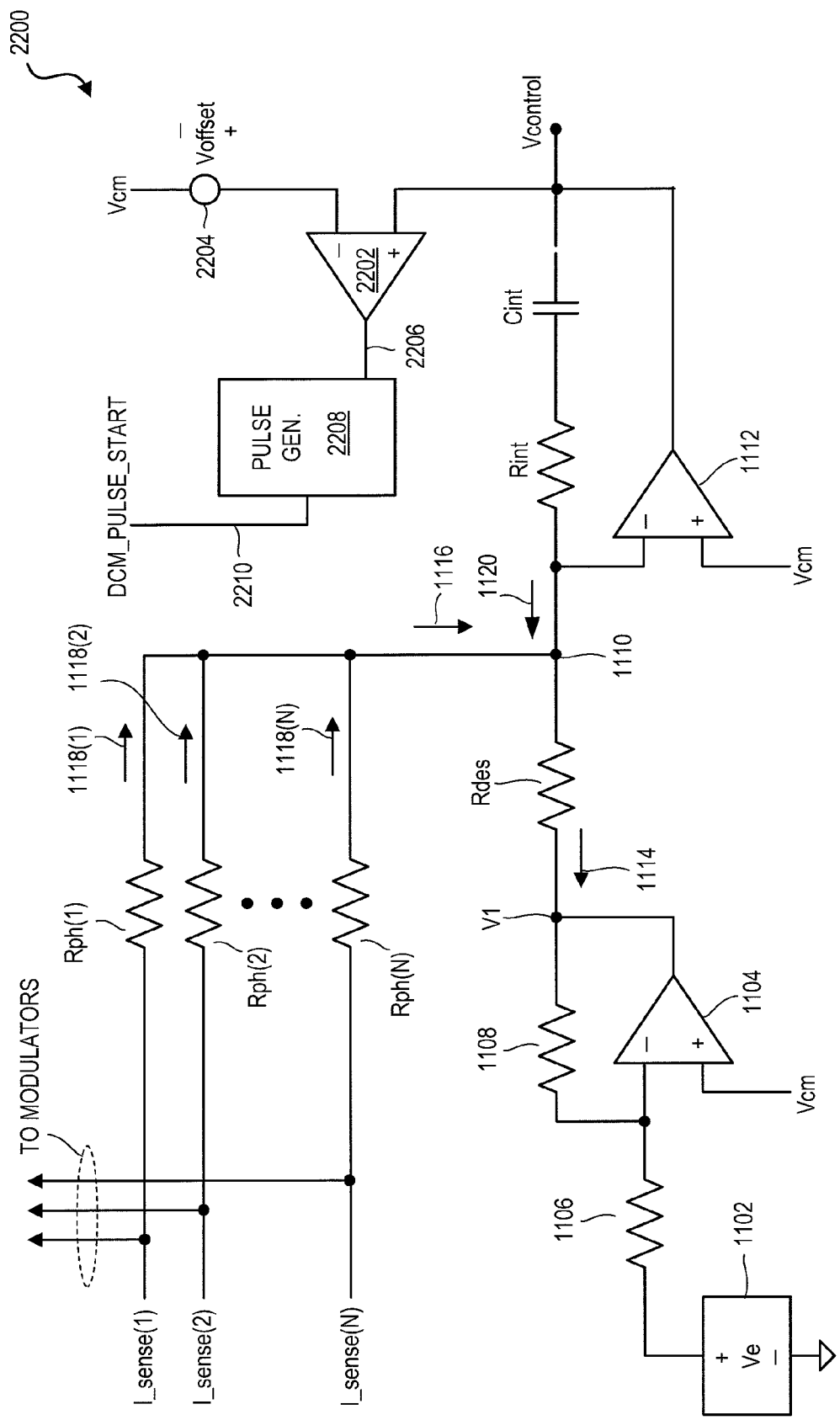
FIGS. 22A and 22B show an embodiment of the controller of FIGS. 11A and 11B including circuitry to boost voltage Vcontrol during discontinuous conduction mode operation.
Figure 22B:
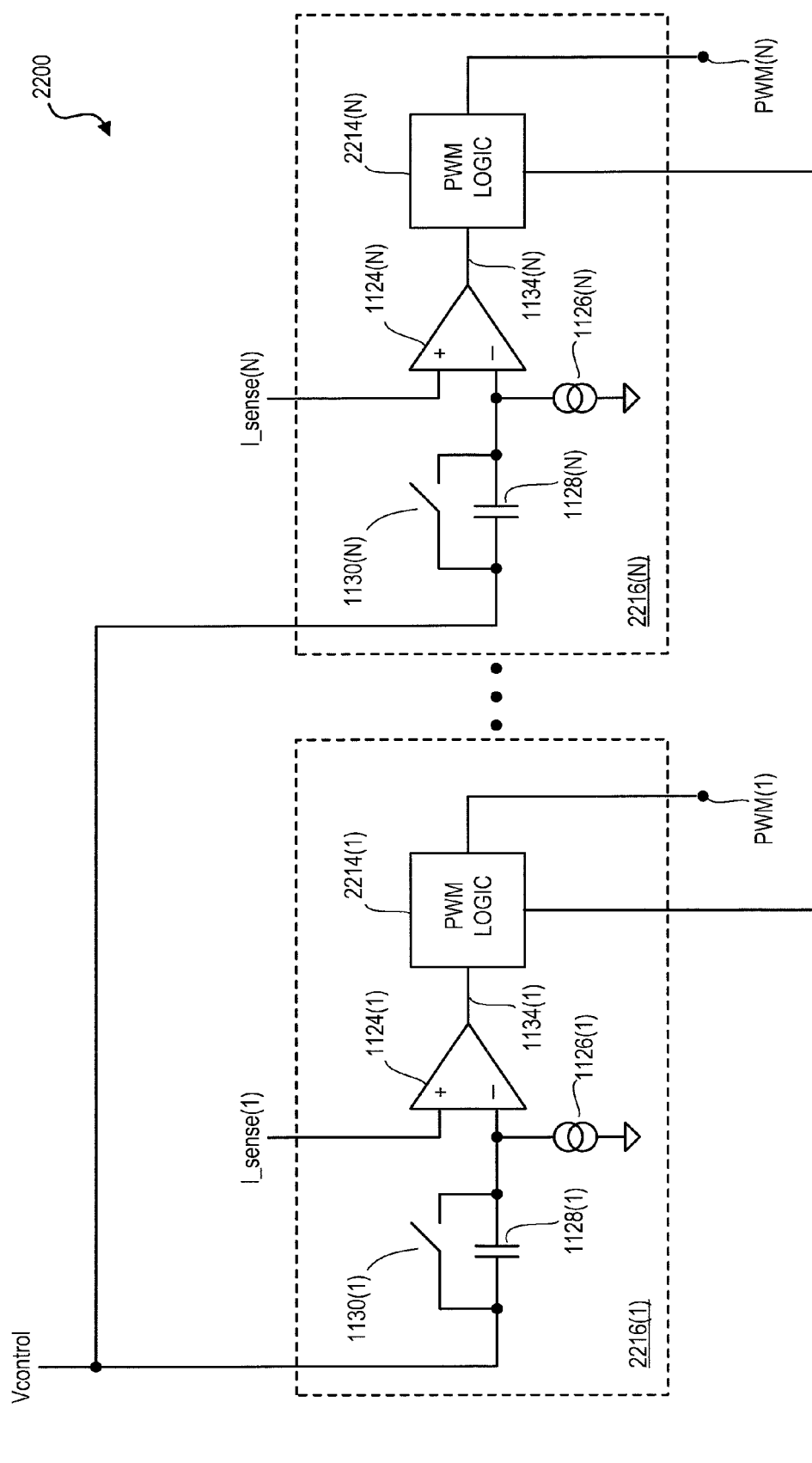

FIGS. 22A and 22B show a controller 2200, which is an embodiment of controller 1100 that includes circuitry to scale Vcontrol during DCM. In particular, controller 2200 includes a comparator 2202 with its non-inverting input electrically coupled to Vcontrol. An inverting input of comparator 2202 is electrically coupled to an offset 2204, which is referenced to Vcm. When Vcontrol reaches offset 2204, comparator 2202 output 2206 is asserted, thereby triggering a pulse generator 2208 which generates a DCM_PULSE_START signal on an output 2210. In certain embodiments, pulse generator 2208 is a clocked one shot or a continuous time one shot. Signal DCM_PULSE_START is inputted into PWM logic 2214 of modulators 2216 (FIG. 22B) to set PWM logic 2214 when in DCM mode. Thus, signal DCM_PULSE_START acts a clock for PWM logic 2214 in DCM mode, thereby allowing asynchronous operation in DCM mode. In certain embodiments, modulators 2216 includes additional circuitry (not shown) to control which phase or phases are fired when signal DCM_PULSE_START is asserted. Such additional circuitry is configured, for example, to fire phases in a predetermined sequence, where one phase is fired each time signal DCM_PULSE_START is asserted. By setting PWM logic 2214 whenever Vcontrol reaches the value of offset 2204, Vcontrol is boosted by approximately the value of offset 2204 from Vcm. In some embodiments, voltage of offset 2204 is adjustable to control how much Vcontrol is boosted above Vcm. When operating in CCM, PWM logic 2214 is set by a clock signal (not shown).

FIG. 23 shows simulated operation of an embodiment of controller 2200 in a single phase DCM buck-type converter application. Curve 2302 represents a value of offset 2204, curve 2304 represents Vcontrol, curve 2306 represents a ramp signal generated across capacitor 1128, curve 2308 represents a current sense signal proportional to current out of the buck converter's switching node, curve 2310 represents Vcm, curve 2312 represents signal DCM_PULSE_START, and curve 2314 represents the PWM signal generated by the modulator. As can be observed, DCM_PULSE_START goes high whenever Vcontrol 2304 reaches offset 2302, and Vcontrol 2304 is thereby shifted above Vcm by approximately the value of offset 2204.

Although boosting Vcontrol in controller 1000 during DCM can improve a transition between CCM and DCM, undershoot can still occur in some embodiments when transitioning from DCM to CCM at very light loads. Additionally, if Vcontrol is boosted to a value that is much higher than that during normal CCM, overshoot can occur during a transition from DCM to CCM. Furthermore, a transition from CCM to DCM can be delayed due the time required for Vcontrol to reach its desired offset value. Some or all of such issues can be at least partially mitigated by introducing a feed forward term into modulators of controller 1000 during DCM.

Figure 24:
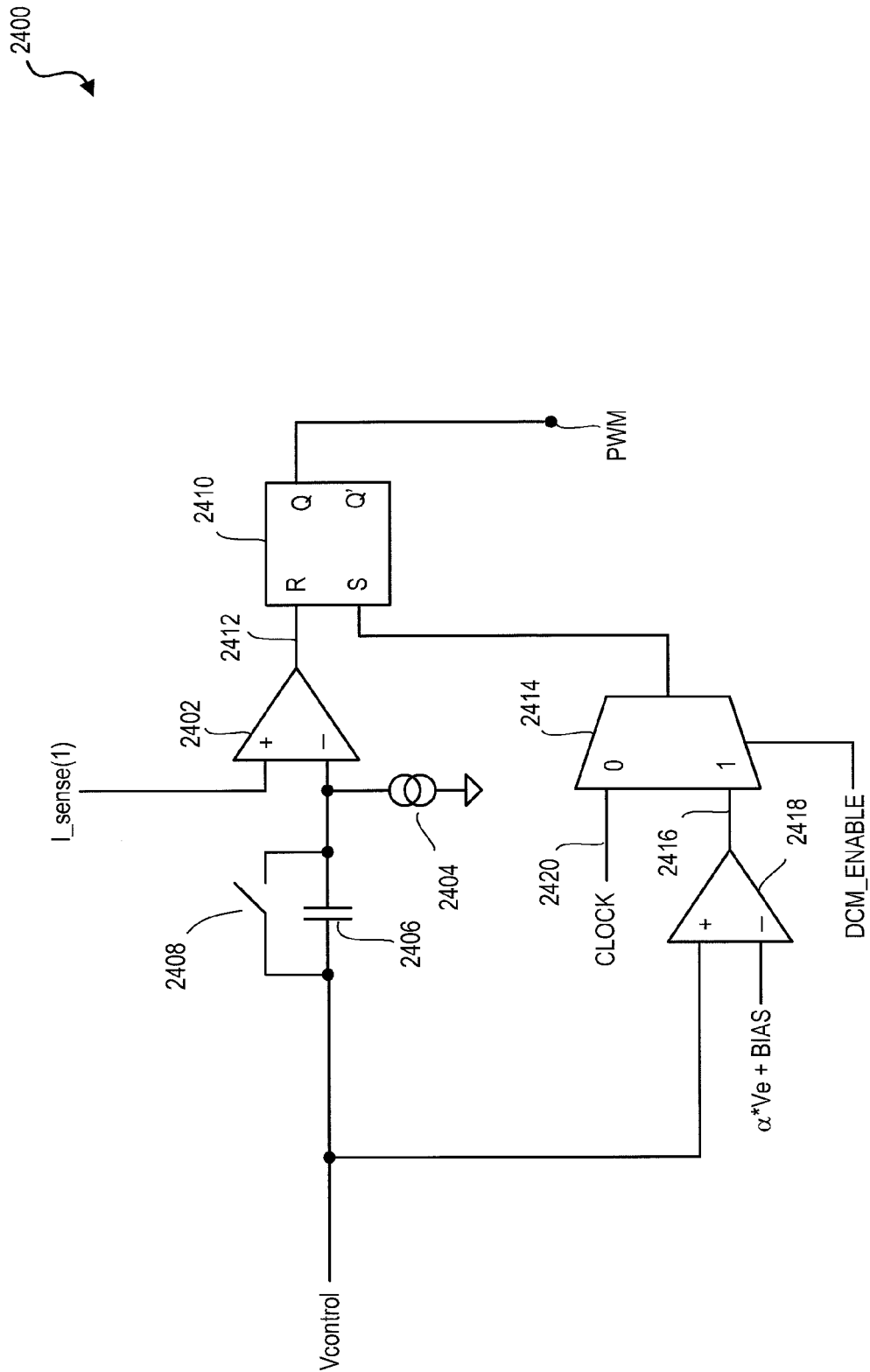
FIG. 24 shows an alternate embodiment of a Pulse Width Modulation (PWM) modulator.

For example, FIG. 24 shows one modulator 2400, which is an alternate embodiment of modulator 1122 (FIG. 11B). In a manner similar to that discussed above with respect to FIGS. 22A and 22B, modulator 2400 scales Vcontrol during DCM, but modulator 2400 additionally includes feed forward functionality. Modulator 2400 includes an op-amp 2402, a current source 2404, a capacitor 2406, and a switch 2408, which are analogous to op-amp 1124, current source 1126, capacitor 1128, and switch 1130 of modulator 1122. Modulator 2400 further includes logic 2410 (e.g., a flip-flop) which generates a PWM signal. An output 2412 of op-amp 2402 resets logic 2410.

Multiplexer 2414 controls what signal sets logic 2410 to start a PWM pulse. Specifically, when signal DCM_ENABLE is deasserted (representing CCM operation), a CLOCK signal 2420 sets logic 2410. Conversely, when signal DCM ENABLE is asserted (representing DCM operation), an output 2416 of a comparator 2418 sets logic 2410. A non-inverting input of comparator 2418 is electrically coupled to Vcontrol, and an inverting input of comparator 2418 is driven by signal equal to a*Ve+BIAS, where a is a scaling factor and BIAS is an offset voltage. The BIAS offset voltage is analogous to offset voltage 2204 (FIG. 22A) and boosts Vcontrol. As discussed above, Ve is a function of Vout; therefore, a*Ve is a feedback term that adaptively adjusts signal a*Ve+BIAS based on Vout in a way that is not limited by integrator delay.

In controller 1100 (FIG. 11), the value of Rint can affect both converter transient response as well as current sharing among phases. For example, a relatively large value of Rint (e.g., 950 ohms) generally results in better converter transient response than a smaller value of Rint (e.g., 750 ohms). However, use of a large value of Rint typically results in excessive current imbalance among phases during high frequency load transients. Therefore, some embodiments of controller 1100 include alternative modulators where modulation ramp rate is increased in proportion to phase current. Such negative feedback from phase current helps to mitigate phase current imbalance when using large values of Rint.

Figure 25:
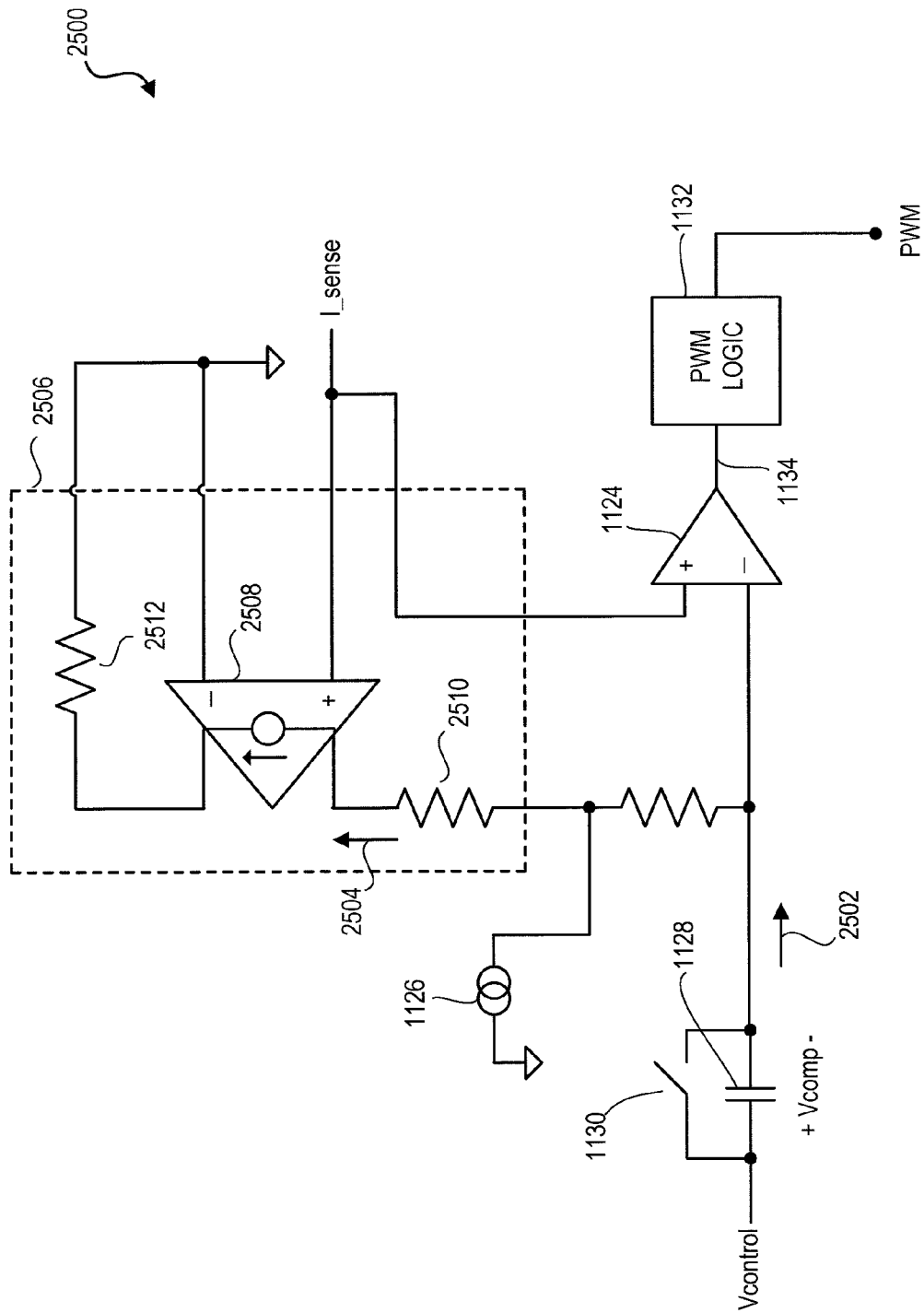
FIG. 25 shows another alternate embodiment of a PWM modulator.

For example, FIG. 25 shows one modulator 2500, which is an alternate embodiment of modulator 1122 (FIG. 11B) with negative feedback to its modulator ramp. Modulator 2500 differs from modulator 1122 in that modulator 2500 includes circuitry to control generation of a ramp signal Vcomp across capacitor 1128 as a function of phase current. In particular, current 2502 through capacitor 1128 is the sum of current 2504 from transconductance device 2506 as well as current source 1126. Transconductance device 2506, which for example includes an amplifier 2508 and resistors 2510, 2512, causes current 2504 to increase in proportion to a current sense signal (e.g., I_sense in converter 300) of the phase associated with the modulator. Thus, as phase current increases, total current 2502 through capacitor 1128 increases, thereby increasing ramp rate of ramp signal Vcomp and reducing current feedback in op-amp 1124. Such reduction in current feedback helps reduce phase current imbalance resulting from high frequency load transients when using large values of Rint.

Figure 26:
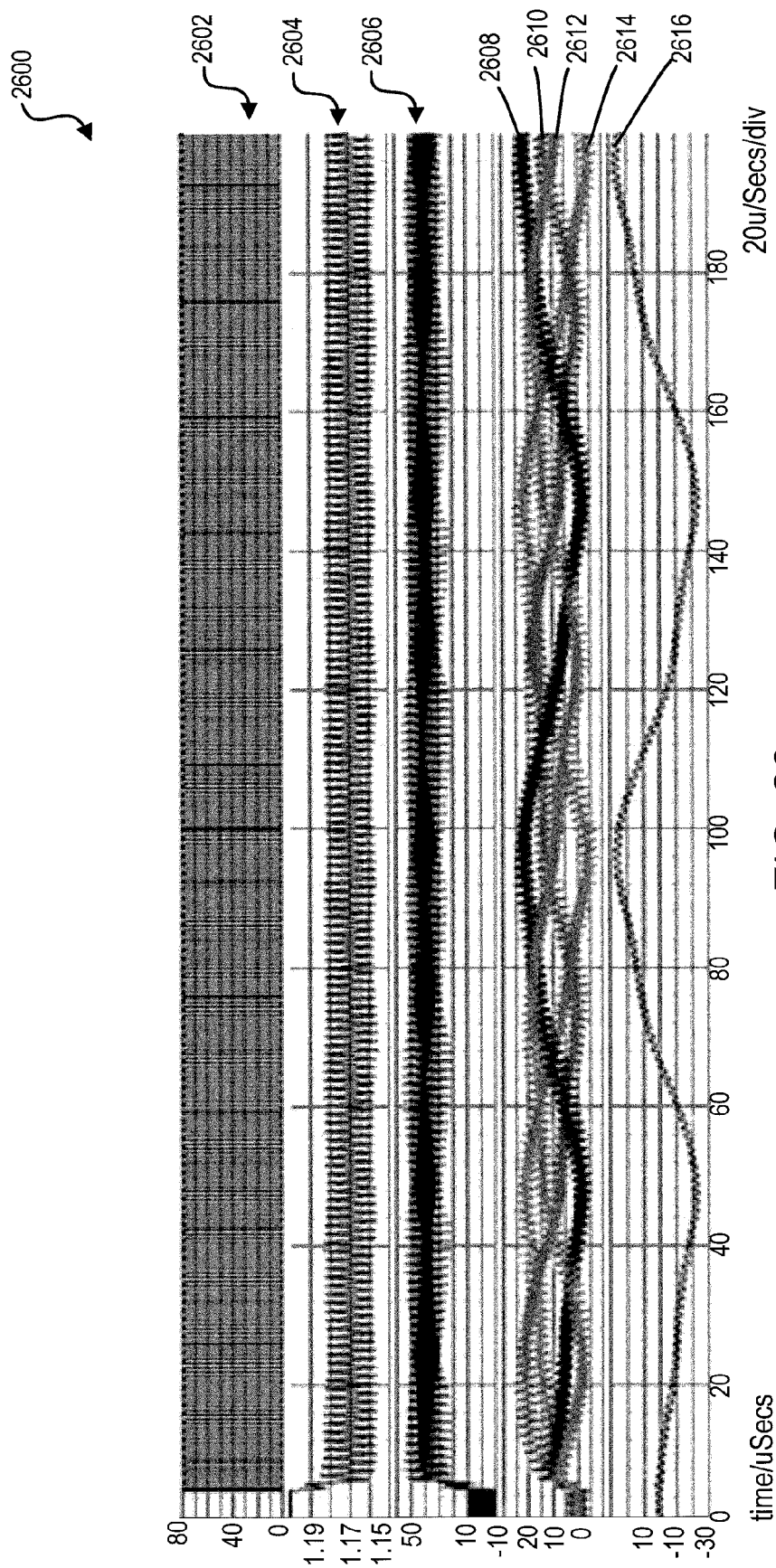
FIG. 26 shows a simulation of a four phase DC-to-DC converter with an alternating step load.

In a multiphase DC-to-DC converter, undesired phase current imbalance may occur during high frequency load transients due to control circuit bandwidth limitations. For example, FIG. 26 shows a simulation 2600 of a four phase DC-to-DC converter powering a load alternating between zero and 80 amperes at a frequency close to 800 KHz. Curve 2602 represents load current, curve 2604 represents output voltage, curve 2606 represents converter output current, each of curves 2608-2614 represents a respective phase current, and curve 2616 represents current imbalance between a second and a fourth phase. As can be observed, phase currents 2608-2614 are not equal at any given point in time and have roughly a sinusoidal characteristic.

Phase current imbalance, such as resulting from high frequency load transients, can be improved by firing phases based on their respective current magnitudes instead of based on a predetermined order. Specifically, whenever it is time to fire a phase, current magnitude of each phase (i.e., magnitude of current out of the phase's switching node) is evaluated, and a phase with a smallest current magnitude is fired.

Figure 27:
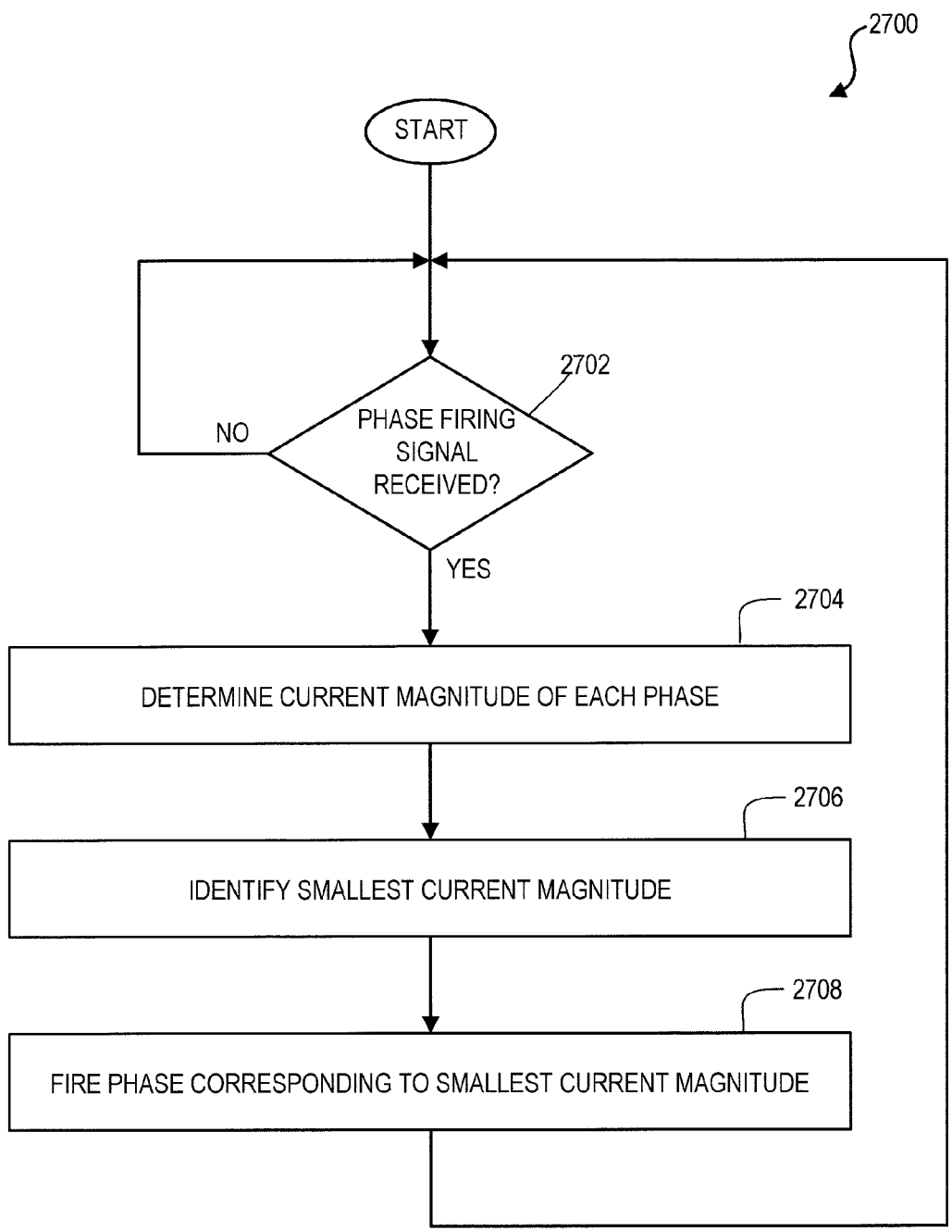
FIG. 27 shows a method for controlling phase current imbalance in a multiphase DC-to-DC converter, according to an embodiment.

For example, FIG. 27 shows one method 2700 for controlling phase current imbalance in a multiphase DC-to-DC converter. Although method 2700 is discussed with respect to DC-to-DC converter 300 of FIG. 3, method 2700 is not limited to use with DC-to-DC converter 300, and method 2700 could be implemented with other multiphase DC-to-DC converters.

Method 2700 begins with a decision step 2702 of determining whether a phase firing signal has been received. Such signal, which is typically periodically generated so that each phase switches at a desired frequency, indicates that it is time to fire one phase (i.e., time to turn on the control switch of one phase) of the multiphase DC-to-DC converter. In some embodiments, the phase firing signal corresponds to a clock signal edge. In a particular embodiment, the phase firing signal has a frequency equal to the number of active phases times a frequency of converter cycles. If a phase firing signal has been received, method 2700 proceeds to step 2704. Otherwise, method 2700 returns to decision step 2702. An example of step 2702 is controller 326 of master 308 (FIG. 3) determining whether a signal has been received to turn on an upper switch 314 of one slave 306.

In step 2704, a current magnitude of each phase is determined (e.g., magnitude of current out of at least one switching device of each phase). An example of step 2704 is controller 326 sampling an I_sense signal from each slave 306. In step 2706, the current magnitudes determined in step 2704 are compared, and a smallest current magnitude is identified among phases presently off. An example of step 2706 is controller 326 comparing the I_sense signals sampled in step 2704 and identifying which sampled I_sense signal is smallest. In step 2708, a phase corresponding to the smallest current magnitude identified in step 2706 is fired. If there is no one phase with a smallest current magnitude, a phase to be fired is selected in a different manner (e.g., randomly or sequentially based on phase number). An example of step 2708 is controller 326 causing a high side switch 314 of a slave 306 corresponding to the smallest sampled I_sense signal to be turned on. Method 2700 returns to step 2702 after executing step 2708.

In alternate embodiments, two or more phases with smallest current magnitudes are fired when it is time to fire a phase. For example, method 2700 could be modified such that the two smallest current magnitudes are identified in step 2706, and the two phases corresponding to such two smallest current magnitudes are fired in step 2708. Simultaneously firing two or more phases may be necessary if a single phase is unable to electrically and/or thermally handle the DC-to-DC converter's load.

Figure 28:
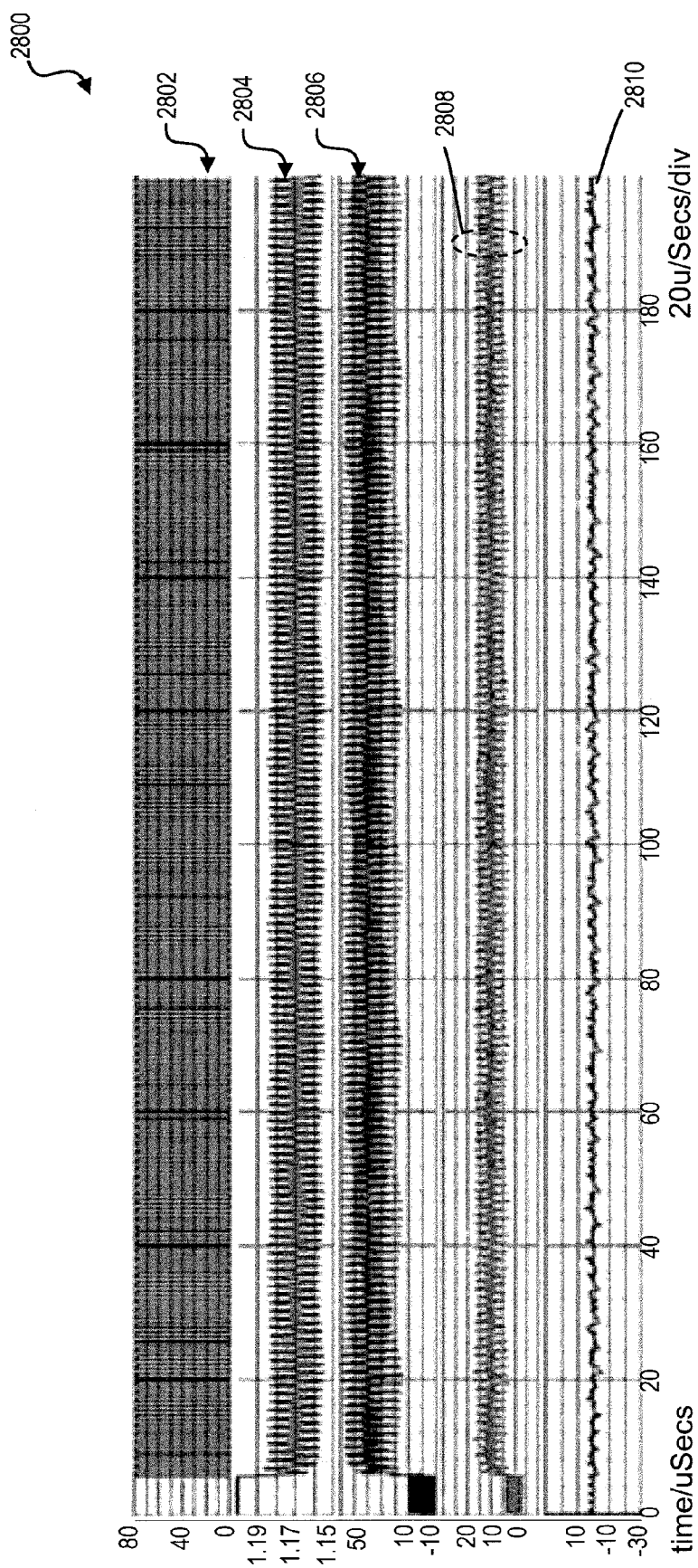
FIG. 28 shows a simulation of a four phase DC-to-DC converter with an alternating step load and where a phase with a smallest current magnitude is fired whenever it is time to fire a phase.

FIG. 28 shows a simulation 2800 of the same four phase DC-to-DC converter as in simulation 2600 (FIG. 26) but employing an embodiment of method 2700. Specifically, whenever it is time to fire a phase, current magnitude of each phase is evaluated, and a phase with a smallest current magnitude is fired. As with simulation 2600, the converter of simulation 2800 is powering a load alternating between zero and 80 amperes at a frequency close to 800 KHz. Curve 2802 represents load current, curve 2804 represents output voltage, curve 2806 represents converter output current, curves 2808 (not individually distinguishable) represent a respective phase current of each of the four phases, and curve 2810 represents current imbalance between a second and a fourth phase. As can be observed, the phase currents are approximately equal despite the high frequency load transient.

Communications to Slave Devices Having Power Drivers

Figure 29:
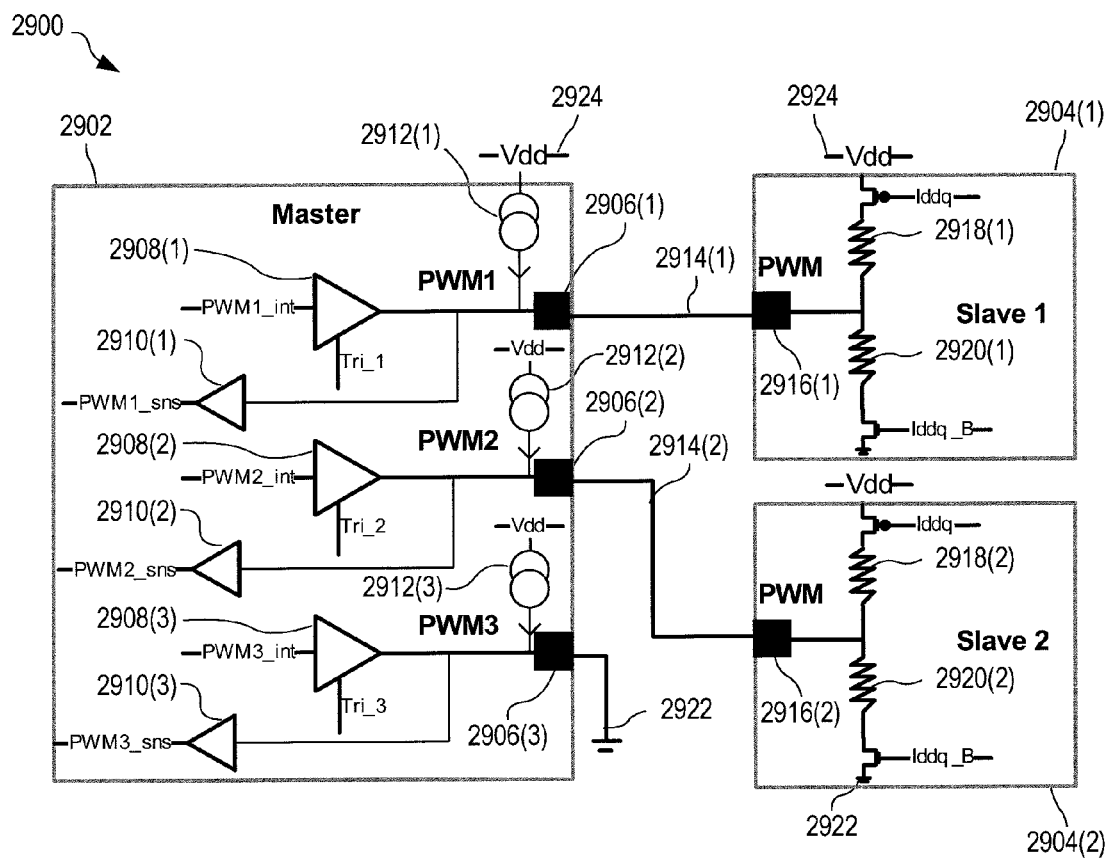
FIG. 29 is a schematic diagram illustrating one exemplary system for implementing single wire connectivity between a master unit and each of a plurality of slave units, in an embodiment.
Figure 30:
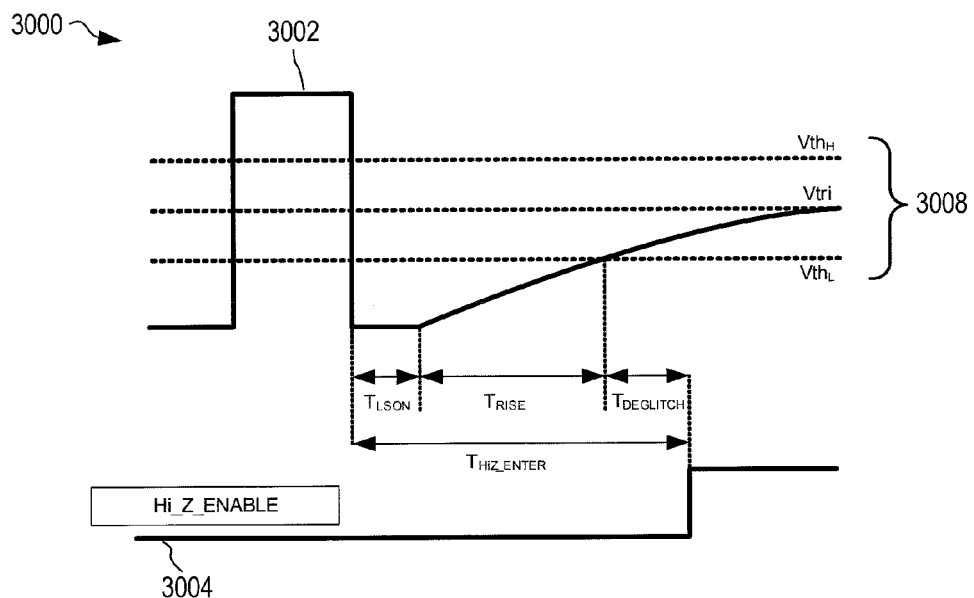
FIG. 30 shows one exemplary graph showing voltage of the input signal to the slave unit when transitioning from PWM mode to a tri-state mode, and generation of a disable signal.
Figure 31:
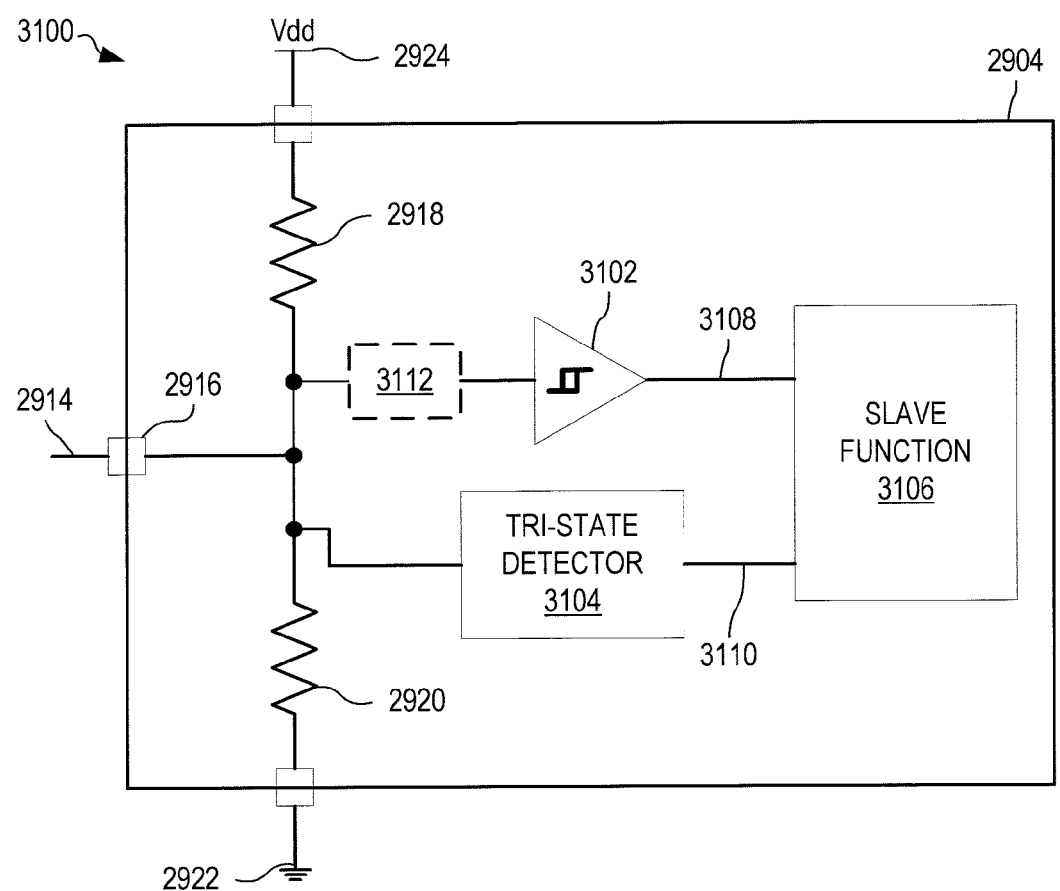
FIG. 31 shows one exemplary slave unit of FIG. 29 with a Schmidt trigger connected to the input for generating an internal PWM signal.

In some DC-to-DC converters, it is necessary to interface a controller that generates digital control signals (e.g., PWM signals) with controlled devices that receive the control signals. For example, in DC-to-DC converter 300 of FIG. 3, controller 326, which generates PWM signals, interfaces with slaves 306. Possible systems and methods for interfacing a PWM generator of a master with one or more controlled devices are discussed below with respect to FIGS. 29-31. While such systems and methods are discussed with respect to PWM signals, the systems and methods could be adapted to operate with other digital control signals, such as binary-encoded pulse widths transmitted serially in digital form. Furthermore, while the systems and methods of FIGS. 29-31 are discussed with respect to DC-to-DC converter slaves, the systems and methods could also be applied to other devices controlled by a master. Although it is envisioned that some embodiments of DC-to-DC converter 300 will incorporate such systems and methods, the systems and methods could be applied to other DC-to-DC converters as well, such as to reduce packaging pin count and/or to reduce a number of signal lines between a master and slaves. Reducing packaging pin count may advantageously reduce packaging cost and/or packaging size. Reducing a number of signal lines between a master and slaves promotes ease of printed circuit board layout and may facilitate a reduction in number of printed circuit board layers.

FIG. 29 is a schematic diagram illustrating one exemplary system 2900 for implementing single wire control signal 2914 connectivity between a master unit 2902 and each of a plurality of slave units 2904. System 2900 is used, for example, in certain embodiments of DC-to-DC converter 300 (FIG. 3), where master 2902 is analogous to master 308, and slave units 2904 are analogous to slaves 306. In the example of FIG. 29, master unit 2902 has three outputs 2906(1)-(3), each connected to a circuitry 2908(1)-(3), respectively, that operate to drive each output to one of three states: high, low, and high-impedance (known as high-Z and tri-state). Circuitry 2908 is for example CMOS output stage capable of driving signals from rail-to-rail. Each circuitry 2908 is independently controlled by an input signal and a tri-state signal. Within certain embodiments master unit 2902, each of a plurality of small current sources 2912 connects to one output 2906 to enable master unit 2902 to determine whether slave unit 2904 is connected to outputs 2906. In some alternate embodiments, current sources 2912 are replaced with high value resistors connected to a voltage source.

Each slave unit 2904 has one input 2916 that is externally connected to one output 2906 of master unit 2902. In the example of FIG. 29, input 2916(1) of slave unit 2904(1) receives signal 2914(1) from output 2906(1) of master unit 2902, while input 2916(2) of slave unit 2904(2) receives signal 2914(2) from output 2906(2) of master unit 2902. Master unit 2902 and each slave unit 2904 contain at least control portions connected to a common ground rail 2922 and a common power source or VDD rail 2924, for example. In an embodiment, power source 2924 is 1.8V with respect to ground 2922.

In normal operation, each output 2906, when connected to slave unit 2904, is driven to one of ground rail 2922 and power source VDD rail 2924 by driver 2908 within master unit 2902 and the generated signal is received by a Schmitt trigger (not shown for clarity of illustration) within slave unit 2904. Input 2916 may also include glitch rejection circuitry without departing from the scope hereof In particular, driver 2908 generates a pulse width modulated (PWM) signal on its associated output 2906 which is received by slave unit 2904 as a control thereof. Each slave unit 2904 may also be referred to as a "phase."

Each slave unit 2904 also includes a potential divider, formed of resistors 2918 and 2920 connected in series between power source 2924 and ground 2922 via transistors Iddq and Iddq_B, respectively. A center point between resistors 2918 and 2920 connects to input 2916. When driver 2908 is in tri-state mode and slave 2904 and output 2906 are connected, resistors 2918 and 2920 within slave unit 2904 function to hold output 2906 at Vtri, which is approximately a mid-voltage between voltages on power source rail 2924 and ground rail 2922. Slave unit 2904 also includes an auxiliary receiver circuit (e.g., a class AB input stage) that functions to detect when output 2906 is in tri-state mode, which in turn indicates that the slave unit 2904 should stop operation. Specifically, master unit 2902 puts output 2906 in tri-state mode in order to shut-down operation within the connected slave unit 2904.

Populated Phase Detection

As discussed above, certain embodiments include a respective controllable current source 2912 or high value resistor electrically coupled to each output 2906 to determine whether a slave unit 2904 is connected to the output 2906. In such embodiments, at power-up of master unit 2902 and slave unit 2904 (e.g., upon application of power source 2924, and once the master analog supply voltage UVLO is cleared as adequate), the master unit 2902 starts automatic detection of connected slave units 2904. In an embodiment, master unit 2902 assumes that one slave unit 2904 is connected to a specific output 2906 for determining startup timing of other connected slave units. This assumed connection may be called the "primary phase," while the remaining connections may be referred to as "secondary phase" control lines. In an embodiment, the primary phase is assumed to include output 2906(2).

Upon startup, master unit 2902 sets all outputs 2906 to tri-state mode (i.e., high impedance) and activates current sources 2912. Each current source 2912 attempts to pull up the voltage of a different one of outputs 2906 towards a positive VDD rail 2924. Master unit 2902 measures the resulting voltage on the "primary phase" output 2906 using a voltage sense amplifier 2910. For example, where output 2906(2) represents the output to the primary phase, voltage on output 2906(2) is sensed using voltage sense amplifier 2910(2) to determine when other slave units have attained operating voltage, which is assumed to have occurred when the measured voltage at the "primary phase" output 2906(2) reaches Vtri, which is a voltage level between positive VDD rail 2924 and ground rail 2922 (e.g., half of the value of VDD rail 2924).

Where a slave unit 2904 is connected to output 2906, the connected current source 2912 provides insufficient current to pull up the voltage to the rail 2924. That is, current source 2912 provides less current than the current flowing through resistors 2918, 2920 within slave unit 2904. Where output 2906 is open circuit (i.e., not connected to a slave 2904), current source 2912 is able to pull the voltage at that output close to rail 2924, and the voltage at that output approaches the potential of power source 2924. Where output 2906 is connected to ground 2922, current source 2912 cannot pull the voltage at that output high, and it remains substantially near potential of a ground rail 2922.

When the measured voltage of the "primary phase" reaches Vtri, master unit 2902 assumes that each other connected slave unit 2904 has similarly driven the associated output 2906 to Vtri. Master unit 2902 then utilizes voltage measurement devices or voltage sensors 2910 to measure voltages at other outputs 2906. Where the measured voltage is substantially ground (e.g., 0 volts), master unit 2902 assumes that the output is shorted to a ground rail 2922 and records within internal memory of master unit 2902 that output as not used; in a particular embodiment outputs 2906 that, in a particular board design can never be populated because no mounting pads and interconnect traces are provided for a slave at that output may be tied to the ground rail 2922. Where the measured voltage is substantially the same as that of power source 2924, master unit 2902 assumes that no slave unit is connected and records that output as open circuit. Where the measured voltage is within a predetermined range intermediate between positive VDD rail 2924 and ground rail 2922, such as within tri-state window 3008 of FIG. 30, master unit 2902 assumes that a slave unit is connected to that output, and records that output in a memory as connected to a slave, and likely operational.

Once voltage measurement of each output is complete, master unit 2902 may deactivate current sources 2912 to save power, and latch drivers 2908 of outputs that are marked as open circuit in the off state to prevent undesirable oscillation.

In an embodiment, once slave 2906 detection is completed as herein described, master 2902 determines a count of populated phases by counting outputs recorded in its memory as connected to slaves. The master 2902 allocates transition times of secondary phase control lines within a converter cycle according to the count of populated phases by determining an initial phase timing, or phasing, for operation of populated phases in a DC-DC converter cycle such that PWM transitions of the populated phases are evenly distributed throughout the cycle. For example, in a converter having two phases, a second phase may be assigned to have PWM transitions midway between PWM transitions of the primary phase. A three-phase converter may have a second phase assigned to have a PWM transition at a one-third point, and a third phase assigned to have a PWM transition at a two-third's point, between PWM transitions of the primary phase.

Phase Enabling-Disabling

Each slave unit 2904 is controlled via the single wire control signal 2914 through which it connects to one output 2906 of master unit 2902. In an embodiment, master unit 2902 utilizes driver 2908 to output PWM signals to control operation of each slave unit 2904 independently.

FIG. 31 shows slave unit 2904 with a Schmitt trigger 3102 connected to input 2916 for generating an internal PWM signal 3108 from signal 2914. Optionally, slave unit 2904 may include glitch rejection circuitry 3112. Slave unit 2904 is also shown with a tri-state detector 3104 that connects to input 2916 and operates to generate a disable signal 3110 when tri-state of signal 2914 is detected. Disable signal 3110 is used to enable and disable other functionality 3106 of slave unit 2904 (e.g. switching of a power stage of slave unit 2904). Enabling and disabling of functionality 3106 within slave unit 2904 based upon signal 2914 is described below.

FIG. 30 shows one exemplary graph 3000 showing voltage 3002 of signal 2914 when transitioning from PWM to a tri-state (with slave unit 2904 connected thereto), and generation of disable signal 3110 (also known as Hi_Z_Enable).

TABLE 1

Tri-state Timing Conditions

| Parameter | Min | Typ | Max | Unit |
|---|---|---|---|---|
| Tri-state voltage (Vtri) | | 0.5 * VDD | | V |
| Tri-state window low threshold ($Vth_L$) | | 0.3 * VDD | | V |

TABLE 1-continued

Tri-state Timing Conditions

| Parameter | Min | Typ | Max | Unit |
|---|---|---|---|---|
| Tri-state window high threshold ($Vth_H$) | | 0.7 * VDD | | V |
| Slave phase enabling delay | | | 6 | ns |
| Total phase disabling delay ($T_{HiZ\,ENTER}$) | | | 200 | ns |
| PWM line Low Time before disabling the phase ($T_{LSON}$; Master) | 25 | | | ns |
| PWM line Deglitch Time (Slave; $T_{DEGLITCH}$) | 30 | | | ns |
| Trace Capacitance (Stripline; Typ NB board Stackup; length = 4 in) | | | 20 | pF |

In particular, graph 3000 shows a tri-state window 3008 based upon a tri-state low threshold $Vth_L$ and a tri-state high threshold $Vth_H$. Graph 3000 also shows tri-state voltage Vtri, which is substantially midway between power source VDD rail 2924 and ground rail 2922.

Tri-state detector 3104 includes an internal window comparator, with an analog filter to reject glitches and to reject actively driven signals transiting from one actively-driven level to another, that determines whether the voltage of the filtered version of signal 2914 is between tri-state low threshold $Vth_L$ and tri-state high threshold $Vth_H$ of tri-state window 3008. If the voltage of the filtered version of signal 2914 is within tri-state window 3008, tri-state detector 3104 sets disable signal 3110 high, otherwise tri-state detector 3104 sets disable signal 3110 low. Line 3004 represents disable signal 3110 (e.g., a tri-state detected signal also known as Hi_Z_Enable) that is generated by tri-state detector 3104 upon detection of a tri-state mode of signal 2914.

Phase Enabling

Assuming function 3106 of slave 2904 is disabled and signal 2914 is tri-state, master unit 2902 may enable operation of function 3106 of slave unit 2904 by driving (e.g., using driver 2908) output 2906 and signal 2914 to low (e.g., 0 V) or high (e.g., 1.8 V). At startup, if slave unit 2904 becomes operational before master unit 2902 (e.g., if the 1.8V rail of slave unit 2904 becomes available before the 1.8V rail of the master unit 2902 stabilizes), signal 2914 may present a low voltage to input 2916 of slave unit 2904. To prevent undesirable operation, slave unit 2904 should not interpret this low signal as a command to activate function 3106. Thus, at power up, slave unit 2904 requires a specific sequence of signal 2914 before activating function 3106 for the first time. For example, where slave function 3106 represents a driver for one phase of a buck DC-DC converter, a low-side switch is not turned on by a low level of signal 2914 unless a high level on signal 2914 has first been received. Further, a high-side switch is not turned on by the initial high level of signal 2914; rather this initial high level is interpreted as a wake-up pulse.

Phase Disabling

Assuming function 3106 of slave 2904 is enabled (i.e., operational) and signal 2914 is a PWM signal, master unit 2902 may disable operation of function 3106 of slave unit 2904 by setting the associated output 2906 to tri-state (e.g., by setting driver 2908 to tri-state mode). The potential divider (e.g., resistors 2918 and 2920) within slave unit 2904 brings signal 2914 to Vtri (e.g., a middle rail value). The potential divider has a limited current drive such that driver 2908 of master unit 2902 is able to drive signal 2914 high and low during normal PWM operation. Tri-state detector 3104 detects signal 2914 becoming tristate, as shown in FIG. 30, and transitions disable signal 3110 to high.

In the example where function 3106 represent the driver for one phase of the buck DC-DC converter, the activation of disable signal 3110, if the high-side switch is on (e.g., signal 2914 was previously high), the high-side switch is turned off and the switching node will remain at high impedance until signal 2914 is activated again. If the low-side is on, function 3106 waits until a sensed output current crosses zero and then turns off the low-side switch to leave the switching node at high impedance until signal 2914 is activated again. Further, if slave unit 2904 is disabled immediately after a high to low transition on signal 2914 (e.g. during DCM operation or PS0→PS1 and PS0→PS2 transitions), master unit 2902 maintains the PWM low for a minimum time ($T_{LSON}$) in order to allow slave unit 2904 to detect this transition. Master unit 2902 then transitions output 2906 to tri-state mode. The transition to tri-state has to be fast enough to comply with the overall tri-state entry enable time ($T_{HiZ\_ENTER}$), in order to guarantee that the zero-crossing comparator is enabled before the inductor current becomes negative. Tri-state detector 3104 detects tri-state after the window comparator lower threshold (VthL) is exceeded for more than a specified deglitch time ($T_{DEGLITCH}$), in order to prevent undesired tri-state entering because of switching noise on the power ground.

Communicating Fault and Operating Condition Information

In a DC-to-DC converter including master and slaves, such as DC-to-DC converter 300 of FIG. 3, it may be desirable to communicate information, such as slave temperature or fault information, from the slaves to the master. Systems and methods for communicating information from controlled devices to a master are discussed below with respect to FIGS. 32-34. Such systems and methods are incorporated in some embodiments of DC-to-DC converter 300 but are not limited to use in DC-to-DC converter 300. Furthermore, although the systems and methods are discussed with respect to DC-to-DC converter slaves, the systems and methods could be applied to other controlled devices, such as audio amplifiers controlled by a master controller.

Figure 32:
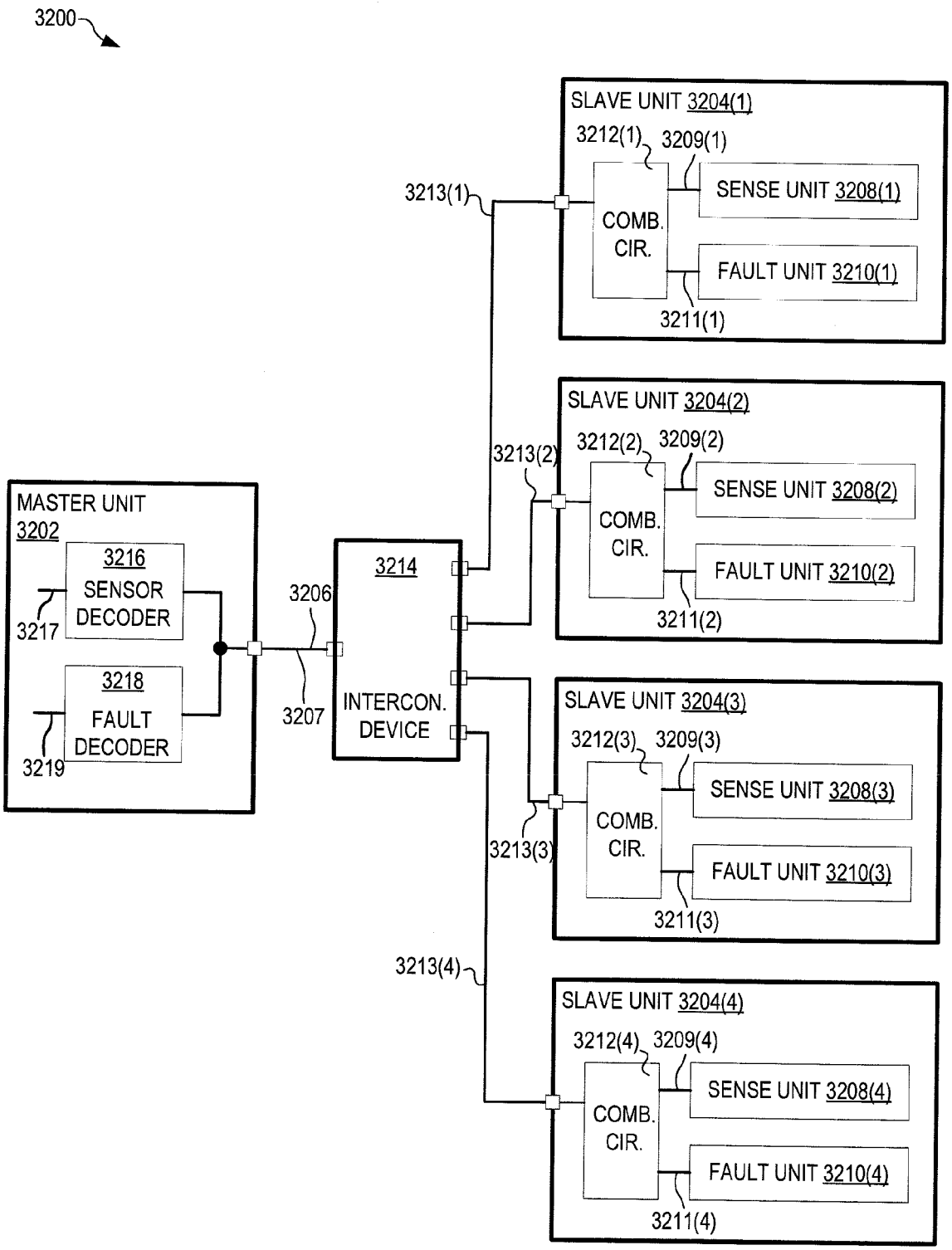
FIG. 32 shows one exemplary system for communicating sensed information and fault information from a plurality of slave units to a master unit over a single wire, in an embodiment.
Figure 33A:
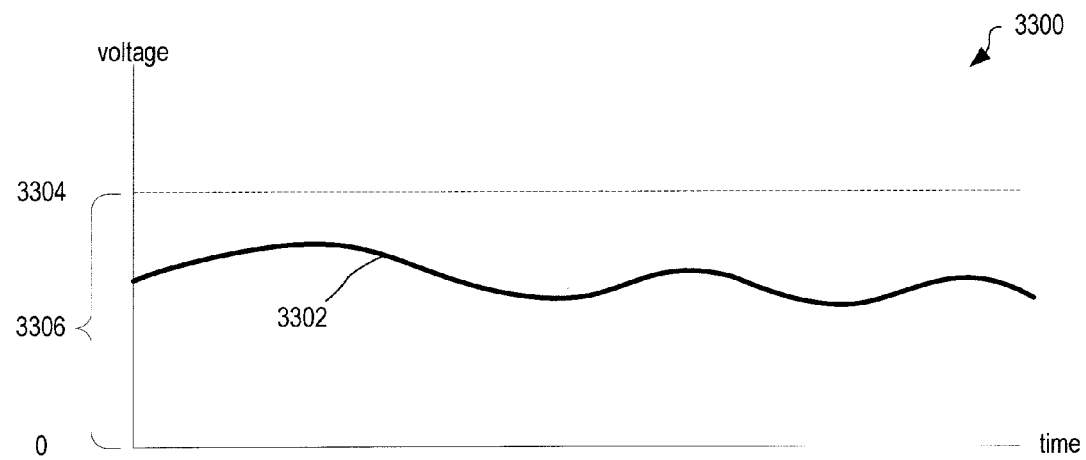
FIGS. 33(A)-(C) are graphs illustrating exemplary waveforms of signals within the system of FIG. 32.
Figure 33B:
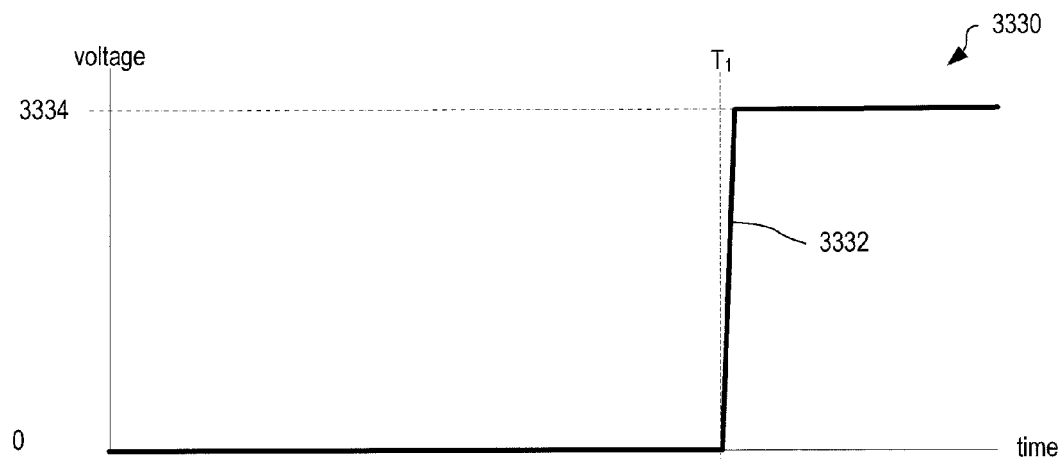
Figure 33C:
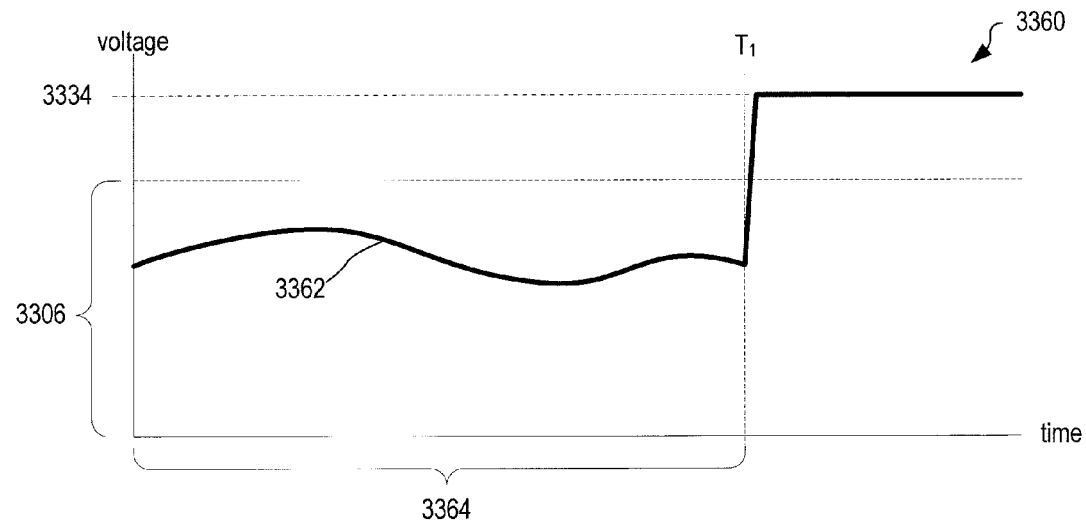

FIG. 32 shows one exemplary system 3200 for communicating sensed information and fault information over a single analog wire. System 3200 includes a master unit 3202 receiving sensor information and fault indication from a plurality of slave units 3204 over a single wire 3206 via a interconnect device 3214. In an embodiment, master unit 3202 is a master controller (e.g., master 308 of FIG. 3) of a Buck DC-DC converter and slave units 3204 are individual power stages (e.g., slaves 306, FIG. 3) of the converter. Each slave unit 3204 has a sense unit 3208, a fault unit 3210 and a signal combiner 3212. Although slave unit 3204, fault unit 3210, and signal combiner 3212 are shown as separate devices, two or more these devices are combined or share at least some common circuitry in certain alternate embodiments. Each sense unit 3208 may generate a sense signal 3209, each fault unit 3210 may generate a fault signal 3211, and the signal combiner 3212 can combine the sense signal 3209 and the fault signal 3211 to generate a sense and fault combination signal 3213, sometimes referred to as a composite signal. FIGS. 33(A)-(C) represent graphs 3300, 3330, and 3360 respectively, that correspondingly illustrate exemplary waveforms of signals 3209, 3211, and 3213. FIGS. 32 and 33(A)-(C) are best viewed together with the following description.

Within each slave unit 3204, sense unit 3208 generates sense signal 3209 as a voltage. In FIG. 33(A), line 3302 represents the sense signal 3209. The sense signal 3209 (3302) lies within a defined voltage range 3306 (e.g., between 0 and 1.8V), that has a specific maximum voltage 3304. In an embodiment, sense unit 3208 is a temperature sensor that senses temperature of slave unit 3204 and generates signal 3209 as a voltage within a range of between 0 and 1.8V that is proportional to the sensed temperature. In certain alternate embodiments, sense unit 3208 senses one or more parameters other than, or in addition to, temperature. For example, in some embodiments, sense unit 3208 measures one or more slave input voltage, slave output voltage, and/or current flowing through a slave switching device.

Also within each slave unit 3204, fault unit 3210 monitors operation of slave unit 3204 to detect faults. Fault signal 3211 is outside of defined voltage range 3306 when no fault is detected by fault unit 3210, and fault signal 3211 is within a second defined voltage range outside of voltage range 3306 when a fault is detected. In certain embodiments, fault signal 3211, shown by line 3332 in FIG. 33(B), is at ground (e.g., 0V) when no fault is detected by fault unit 3210, and switches to a high voltage level 3334 (e.g., 3.3V) when a fault is detected by fault unit 3210, and is therefore outside a range of sensed temperature signals. High voltage level 3334 is higher that maximum voltage 3304 of signal 3209 in the embodiments illustrated in FIGS. 33B and 33C. In the example of graph 3330, a fault is detected at time $T_1$ by fault unit 3210 which causes the voltage of signal 3211 to transition to high voltage level 3334 at time $T_1$, or momentarily thereafter. In certain alternate embodiments, fault unit 3210 is operable to detect two or more different faults and generate a fault signal 3211 within a respective non-overlapping voltage range for each fault. For example, in one alternate embodiment, fault unit 3210 is operable to detect a first fault and second fault. In such embodiment, fault unit 3210 generates a fault signal 3211 in a second voltage range upon detection of the first fault, and fault unit 3210 generates a fault signal 3211 in a third voltage range upon the detection of the second fault. The first, second, and third voltage ranges are non-overlapping in this embodiment.

Each slave unit 3204 also has a combining circuit 3212 for combining sense signal 3209 and fault signal 3211 to generate sense and fault combination signal 3213. In an embodiment, combining circuit 3212 operates to output signal 3213 as the maximum of signals 3209 and 3211. As shown in the example of FIGS. 33(A)-(C), sense and fault combination signal 3213 (shown as line 3362) is equivalent to signal 3209 (shown as line 3302) in a first period 3364 prior to time $T_1$, and is the same as signal 3211 (shown as line 3332) after time $T_1$.

Interconnect device 3214 combines sense and fault signals 3213 from each slave unit 3204 to form multi-sensor or multi-slave combined signal 3207 propagated over single wire 3206 to master unit 3202.

Figure 34:
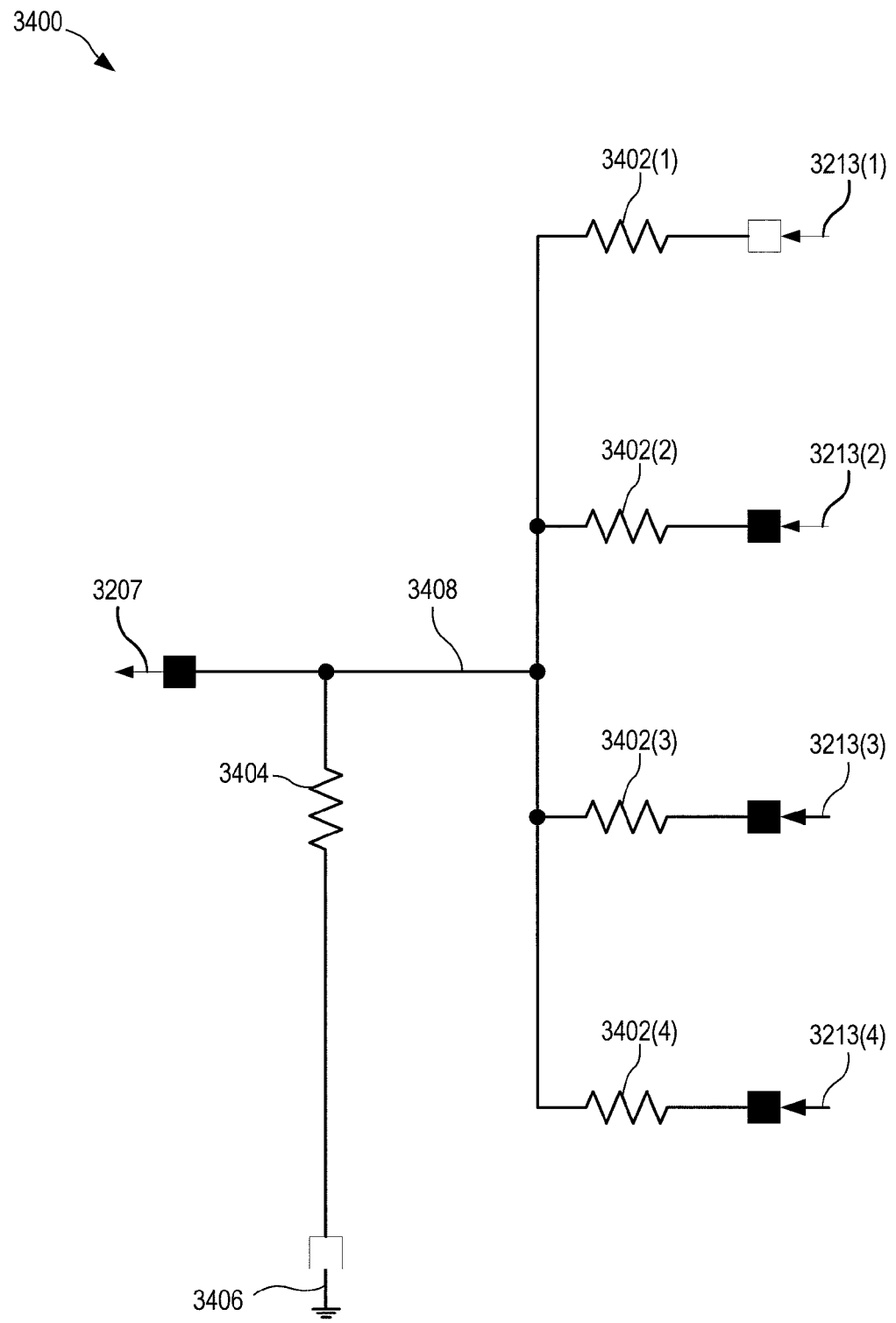
FIG. 34 shows one exemplary circuit for the interconnect device of FIG. 32 for averaging signals from slave units, in an embodiment.

FIG. 34 shows exemplary circuit 3400 of interconnect device 3214 for averaging signals 3213 from slave units 3204 to produce signal 3207. Circuit 3400 includes, for each slave unit 3204, a resistor 3402 having a first end connected to signal 3213 received from the slave unit 3204 and the other end connect to a common point 3408 which also connects to ground 3406 via a resistor 3404. Common point 3408 forms the output of circuit 3400, producing signal 3207 as an average of signals 3213. In one example, resistors 3402 each have a value of 1K ohms and resistor 3404 has a value of 100K ohms.

In an alternative embodiment, resistors 3402 have value zero ohms, while resistor 3404 has a value of approximately 10 K-ohms. In this embodiment, interconnect device 3214 may be replaced with a circuit-board trace or other wiring taking the place of common node 3408 and a resistor 3404. Since, in this embodiment, pullup circuitry in each slave having low impedance is used as combining circuit 3212, such as source-follower circuits, to drive signals 3213, this results in the common node 3408 tracking the highest desired Tsense signal voltage and communicating this to the master. In the event of a fault condition in a slave, the voltage of the common node 3408 tracks the highest combining circuit 3212 output voltage and goes to a level above that of the valid Tsense signal, and is interpreted by the master as a fault condition Other circuits for combining signals 3209 and 3211 to form signal 3213 may be used without departing from the scope hereof.

In an embodiment, within master unit 3202, signal 3207 is received by a sensor decoder 3216 and a fault decoder 3218. Although sensor decoder 3216 and fault decoder 3218 are shown as separate, these two devices are combined or share at least some common circuitry in certain alternate embodiments. Sensor decoder 3216 decodes output of sense unit 3208 from signal 3207 when signal 3207 is within a voltage range corresponding to voltage range 3306, and sensor decoder 3216 may incorporate hysteresis. Sensor decoder 3216 may include an analog to digital converter that converts the voltage of signal 3207 into a digital value corresponding to a sensed value of sense unit 3208, such as an average or maximum sensed value of sense units 3208. In an embodiment where sense unit 3208 is a temperature sensor, sensor decoder 3216 may include hysteresis comparators that utilize a temperature threshold (e.g., VRHOT, 1.4V) such that an output 3217 is set high when signal 3207 indicates that one or more slave units 3204 are at a temperature above the temperature threshold and indicative of need to operate loads at reduced speed or power levels, and low when signal 3207 indicates that all slave units 3204 are below the threshold temperature (e.g., normal operation).

In certain embodiments, sensor decoder 3216 is configured to compare signal 3207 to a number of threshold values and indicate via output 3217 if signal 3207 exceeds any of these thresholds. For example, in one embodiment, sense unit 3208 is a temperature sensor, and sensor decoder 3216 is configured to compare signal 3207 to a first and second temperature threshold. Sensor decoder 3216 indicates via output 3217 if signal 3207 exceeds either of these thresholds so that appropriate action may be taken, such as reducing DC-to-DC converter load if signal 3207 exceeds the first temperature threshold and shutting down the DC-to-DC converter if signal 3207 exceeds the second temperature threshold.

Fault decoder 3218 utilizes a fault threshold (e.g., 2V for a 3.3V supply) and may include a comparator that compares signal 3207 to that fault threshold. When signal 3207 is greater than the fault threshold, fault decoder 3218 outputs a high level on output 3219. Otherwise fault decoder 3218 outputs a low level on output 3219, indicating no faults within slave units 3204. That is, output 3219 being high indicates that a fault exists on any one or more of slave units 3204. In certain alternate embodiments, fault decoder 3218 is operable to compare signal 3207 to two or more fault thresholds to distinguish between two or more possible faults. For example, in certain embodiments where fault unit 3210 is operable to generate a fault signal in two non-overlapping voltage ranges corresponding to two different faults, fault decoder 3218 is operable to detect if signal 3207 is within either of these two voltage ranges and generate a corresponding fault signal.

Master unit 3202 receives sensor information and fault information from slave units 3204 over single wire 3206, and system 3200 may be configured to average sensed values or to select a maximum of sensed values.

Telemetry Reporting

Figure 35:
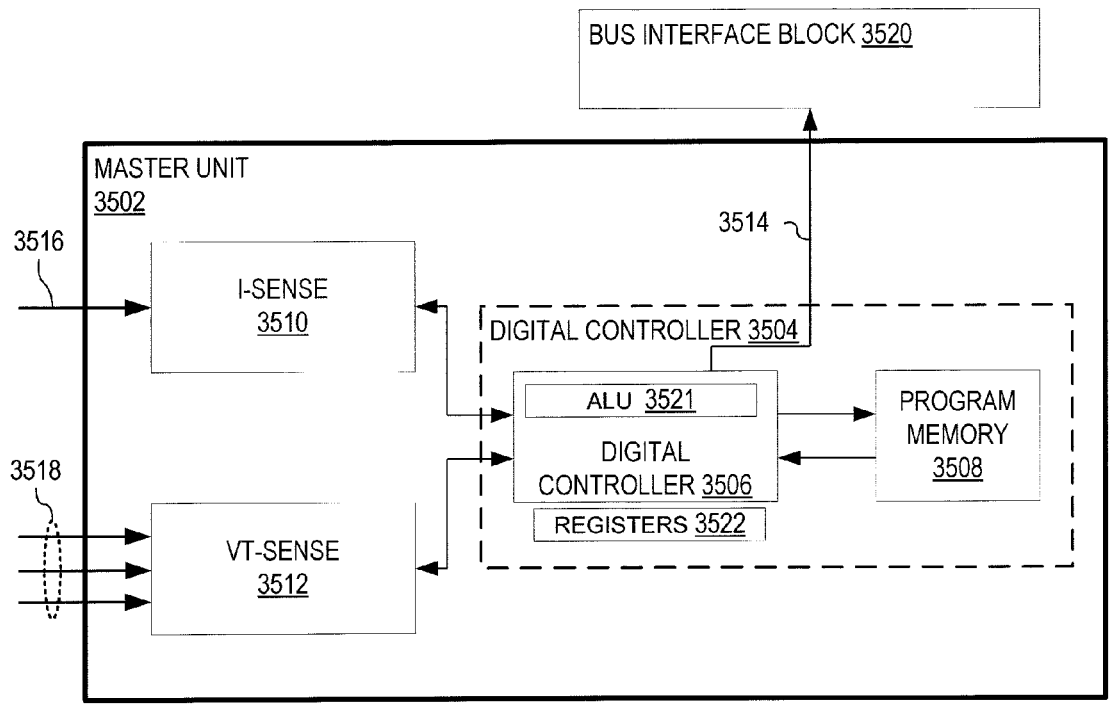
FIG. 35 is a schematic illustrating exemplary components of a master unit of a buck DC-to-DC converter, in an embodiment.
Figure 36:
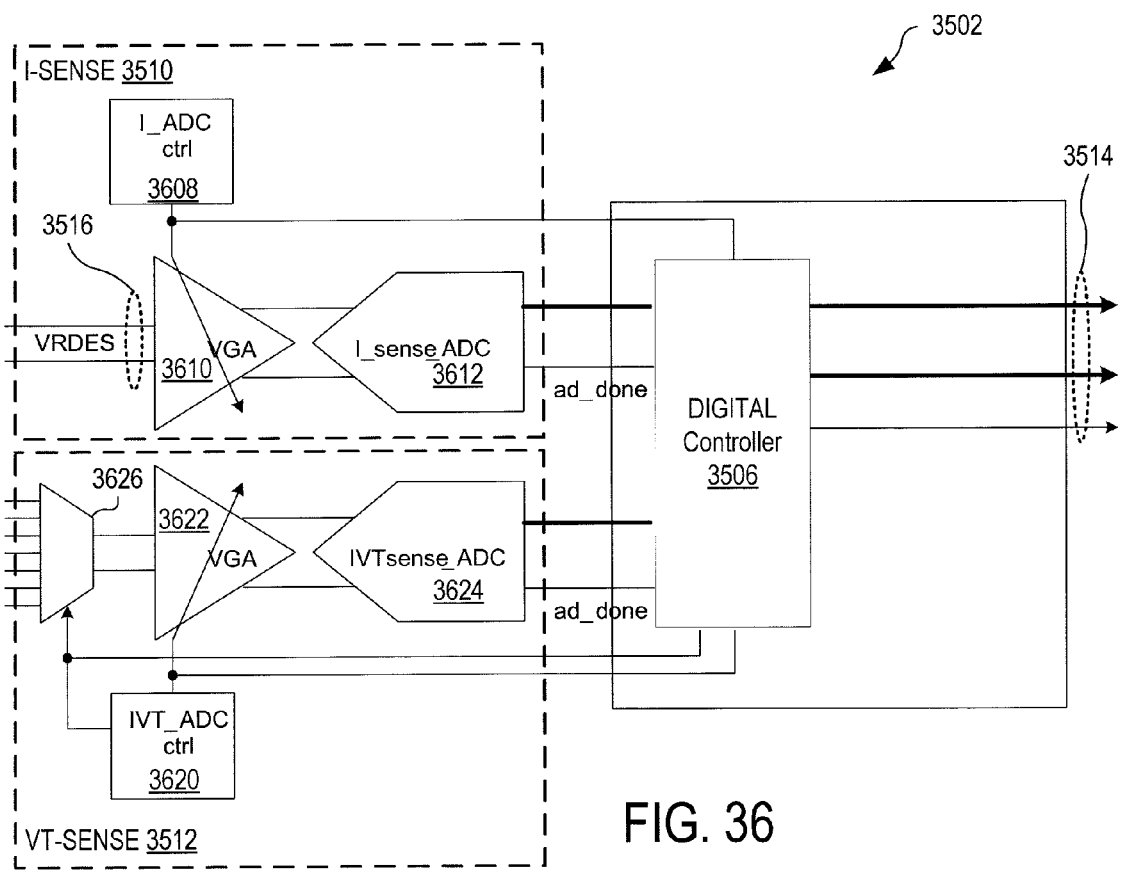
FIG. 36 shows the master unit of FIG. 35 in further detail.
Figure 37:
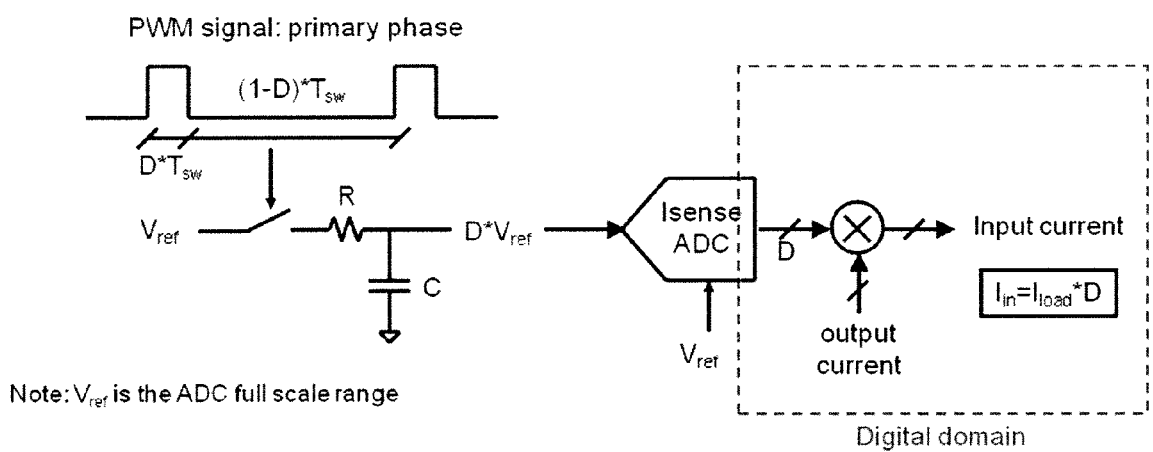
FIG. 37 shows one exemplary operational sequence for use within the controller of FIG. 35 and illustrating use of PWM signal parameters to determine input current based upon load current, in an embodiment.

In certain situations, it is desirable to communicate DC-to-DC converter operating conditions and characteristics to an external system. For example, if a DC-to-DC converter is powering a computer processor, it may be desirable for the DC-to-DC converter to communicate fault information to the processor so that the processor can take appropriate action on partial system failure, such as to cause processing speed to be reduced to reduce power consumption, data to be backed up, and service personnel to be notified, before complete failure of the DC-to-DC converter. Similarly, during production test of processor boards, it is desirable to verify that a correct number of slaves are detected, and that each slave is functional. Discussed below with respect to FIGS. 35 through 37 are telemetry systems and methods that can be used by a DC-to-DC converter to report converter operating conditions, including temperature warnings, and characteristics to an external system. One application of such telemetry systems and methods is in master 308 of DC-to-DC converter 300 (FIG. 3) so that master 308 can report converter operating condition information to an external system. However, the telemetry systems and methods discussed below are not limited to use in DC-to-DC converter 300, and DC-to-DC converter 300 need not necessarily include such systems and methods.

FIG. 35 is a schematic illustrating exemplary components of a master unit 3502 of a buck DC-to-DC converter (e.g., master 308 of DC-to-DC converter 300) that includes a digital controller 3504. In certain embodiments, digital controller 3504 performs functions of low pass filter 4504, as well as low speed comparators 4506, 4508 of the phase-shedding circuitry of FIG. 45, measurement of signals 2914 on control lines for populated phase detection as discussed with reference to FIG. 29, measurement of external programming resistors, such as Rdes discussed with reference to FIG. 16, a current limiting setting resistor, individual phase resistors Rph, and as herein discussed for setting phase enable and disable threshold currents, measurement of desired current output as well as individual phase currents, and/or communications of telemetry information with a host or system management processor. In some embodiments, digital controller 3504 is also adapted to set one or more operating characteristics of the DC-to-DC converter, such as current limit, control circuit feedback loop characteristics, and output voltage, in response to one or more sensed signals of the DC-to-DC converter.

In an embodiment, digital controller 3504 comprises a microcontroller core 3506 that may have in some embodiments an additional math coprocessor for extended precision arithmetic 3521, RAM memory and/or registers 3522, a read-only program memory 3508, an Arithmetic Logic Unit (ALU), an instruction counter and instruction decoder (not shown for simplicity) and a bus interface block 3520 coupled to digital controller 3504 by a bus 3514. In an alternative embodiment, digital controller 3504 comprises a customized state machine (not shown for simplicity) instead of program memory 3508; in this embodiment the state machine controls its operation in a predetermined sequence. In an embodiment, a math coprocessor 3521 comprising circuitry for performing extended precision arithmetic is provided to permit great processing speed. Master unit 3502 also includes a current sense unit (I-Sense) 3510 for sensing a desired output current based upon a signal 3516 indicated desired current output (e.g., a voltage across resistor Rdes in controller 1100), and a voltage and temperature sense unit (VT-Sense) 3512 that senses voltages of inputs 3518.

In an embodiment, registers 3522 or RAM memory stores values for each of a current sense resistor value, a maximum expected load current, load current, input current, phase current, input phase current, output voltage, error voltage, slave or other controlled device temperature, warning temperature, and maximum temperature. Bus interface block 3520 provides an interface for one or more of SMBus, SVI and PMBus, which may request the stored values within registers 3522.

For example, based upon signals "svid_read_sel" and "smbus_read_sel" from SVID/SMBus logic, a value from one of registers 3522 may be multiplexed to a data pin.

Digital controller 3506 controls I-sense 3510 to read output current based upon voltage signal 3516 and controls VT-sense 3512 to measure output voltage, error voltage, slave or other controlled device temperature, and maximum temperature of the slaves or other controlled devices. For example, a first measurement controller 3608 sets a gain of a variable gain amplifier 3610 and initiates a first ADC 3612 (I_sense ADC) to begin converting the voltage output of amplifier 3610 into a digital value. Similarly, a second measurement controller 3620 selects a signal for measurements using an input multiplexer 3626, sets a gain of a second gain amplifier 3622 and initiates a second ADC 3624 (IVTsense_ADC) to begin converting the voltage output of amplifier 3622 into a digital value. In the embodiment of FIG. 36, each ADC 3612 and 3624 utilizes an ad_done signal to indicate when an output value is ready.

In an alternative embodiment, a single ADC having an input multiplexer operates under control of the digital controller 3506 to convert both IVTsense and I_sense signals. Such embodiment optionally includes one or more variable gain amplifiers to amplify signals coupled the ADC's input. In a particular embodiment, the converter may be activated to measure I_sense directly or indirectly by first measurement controller 3608, and to convert IVTsense directly or indirectly by the second measurement controller. In certain embodiments, some of the measured signals are differential. For example, in some embodiments, a differential voltage across a phase resistor is measured, where the phase resistor carries a current signal used by a feedback controller to control one or more DC-to-DC converter phases. The differential signals are typically converted to single-ended signals prior to input to the ADC, such as by a VGA having differential input and single-ended output.

In an embodiment, digital controller 3506 executes a startup sequence during which registers are initialized, programming resistors measured, programmable features of the DC-to-DC converter initialized, and preliminary calculations performed. It then changes to executing a run-time sequence including monitoring converter operating conditions and providing telemetry to a host or system management processor.

Upon inputting the ADC values, digital controller 3506 converts these values into an appropriate range in engineering units based upon one or more of set gains, PWM ratios, startup voltages (e.g., V_ILIMIT) and resistor measurements stored within memory of digital controller 3506 that define operation of master unit 3502 and its associated slave units. Digital controller 3506 also converts the calculated values into an appropriate format for output to each interface (e.g., SMBus, SVI, and PMBus), and for presentation to a host or system management processor in an appropriate encoded serial telemetry format.

Master unit 3502 and two or more slave units (e.g., slave units 306 of FIG. 3) implement a current mode controlled multiphase buck DC-to-DC converter. In alternative embodiments, master unit 3502 and one slave unit 306 implement a current mode controlled single-phase buck DC-to-DC converter. Under normal operation of this converter, total output current is controlled by a current command signal that is proportional to the desired total output current. The current command is a current signal that flows through an external resistor Rdes in some embodiments. As described with respect to FIG. 16, the resistance of Rdes is measured, such that by measuring the voltage across Rdes (e.g., using amplifier 3610, gain control 3608 and ADC 3612 in cooperation with ALU controller 3506), the control current through Rdes may be determined. Based upon this determined control current, the total output current may be determined by multiplying the determined control current by the defined gain in each slave unit.

Time Multiplexing

A finite state machine (FSM) within measurement controller 3620 (IVT_ADC_ctrl) operates in one of two modes: startup mode and normal mode.

Input current may be determined by measuring output current and performing an calculation based upon a duty-cycle of the slave units (e.g., a duty cycle of the PWM control signal). Duty cycle is measured, for example, as shown in FIG. 37.

The following equation calculates the overall input current for output to SVI and PMBus in the appropriate format:

$$I_{in} = I_{load} \cdot D$$

FIG. 37 shows one exemplary operational sequence for implementing the above equation within controller 3504 illustrating use of PWM signal parameters to determine input current based upon load current.

A phase current (e.g., output current attributed to a particular slave unit) is determined in certain embodiments by measuring a voltage across a resistor (e.g., Rph) that senses the reconstructed feedback current signal from the particular slave unit.

The following equation calculates phase current (e.g., output current attributed to a particular slave unit) for output on the SMBus in an appropriate format:

$$I_{phx} = \frac{V_{phx}}{R_{phx}} \cdot 100k$$

Enhanced Load-Transient Response

Additional systems and methods to improve a multiphase DC-to-DC converter's response to a load transient are now discussed below with respect to FIGS. 38-45.

Figure 2:
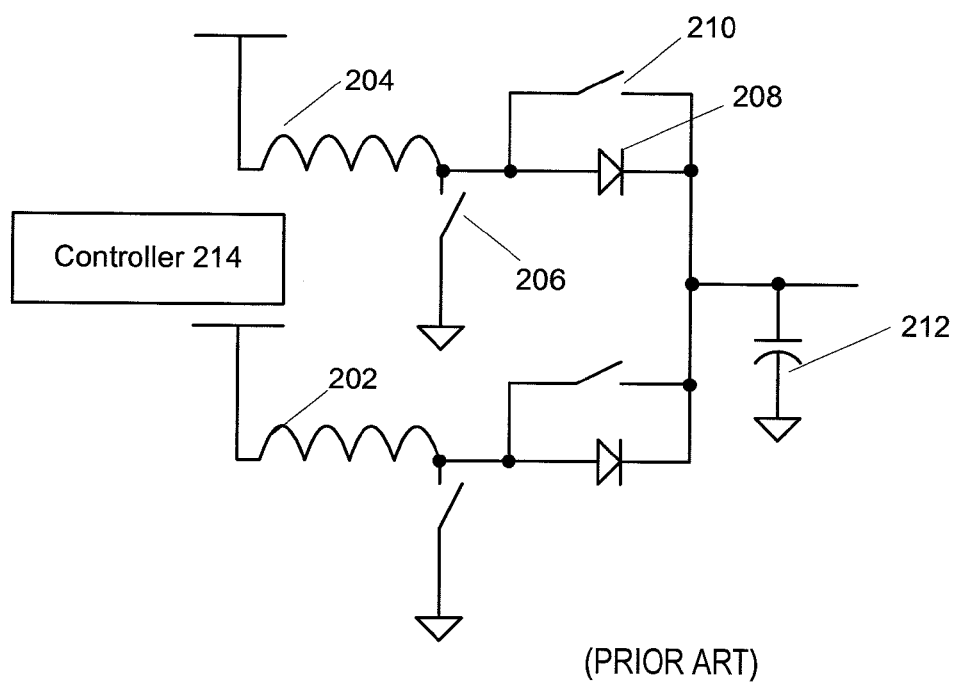
FIG. 2 is a schematic illustration of a boost converter.
Figure 38:
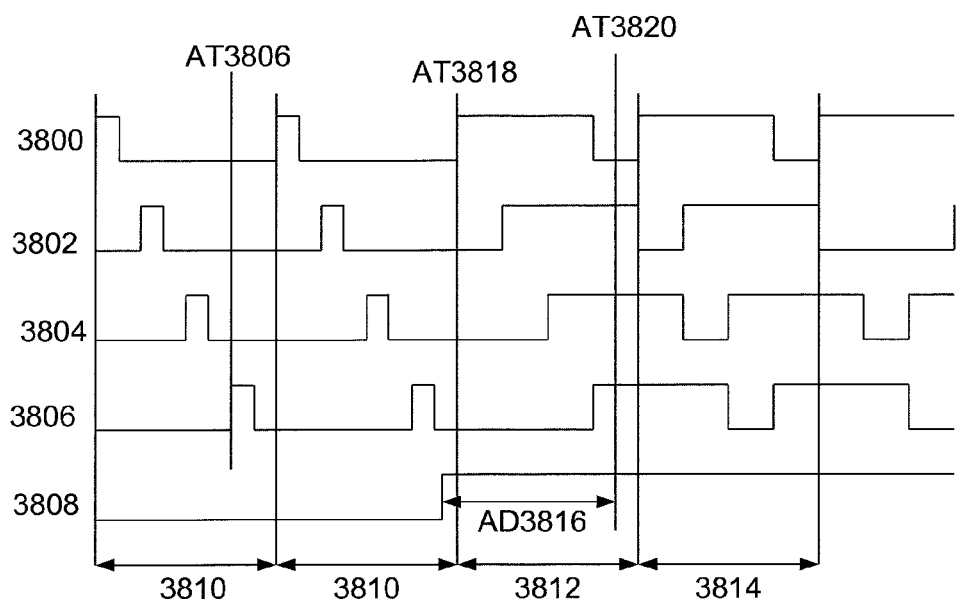
FIG. 38 is an illustration of multiphase pulse-width-modulated operation with an output current spike.
Figure 40:
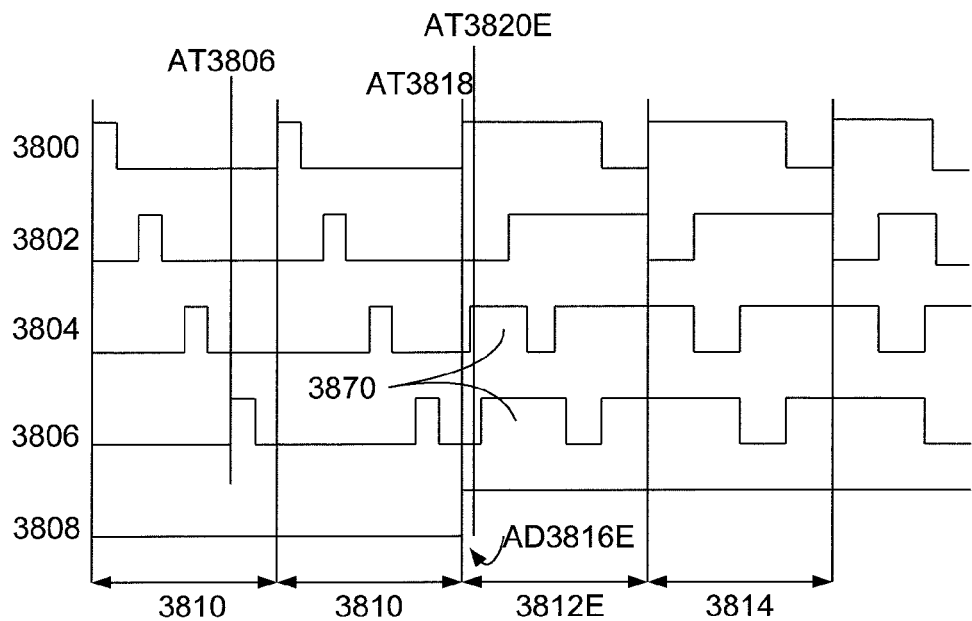
FIG. 40 is an illustration of multiphase pulse-width-modulated operation early turn-on during an output current spike.
Figure 41:
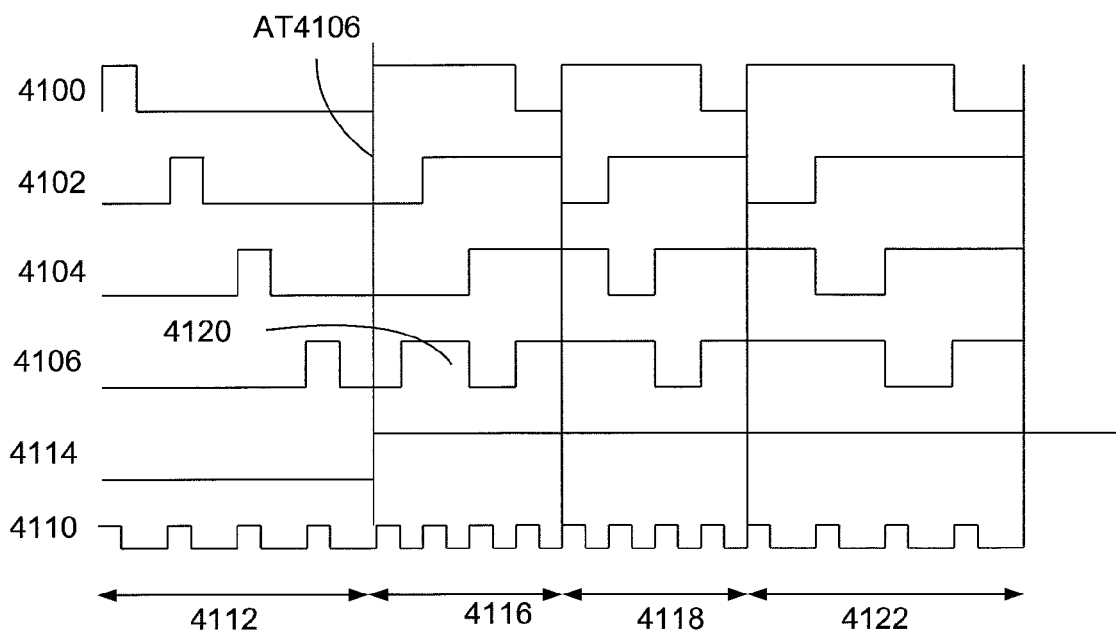
FIG. 41 is an illustration of multiphase pulse-width-modulated operation early turn-on with operating frequency increase during an output current spike.

Timing of an exemplary multiphase buck DC-DC converter as heretofore described with respect to FIGS. 1-2 is illustrated in FIG. 38. For simplicity of illustration, the pulsewidths shown in FIGS. 38, 40, and 41 illustrate relative turn-on times and changes in pulsewidth, but do not represent actual pulsewidths. During steady state operation at a low load current, each switching device of each phase, such as phase 3800, phase 3802, phase 3804, phase 3806, turns ON at a fixed turn-on point, such as time AT3806 for phase 3806, in a cycle 3810 of fixed duration and as determined by a switching clock. Each switching device turns off at a variable point later in the cycle, the pulse widths essentially determine inductor current in each inductor, and current provided to the load.

When a load current, such as load current 3808, increases, the converter responds to the increase in load current by extending pulse widths of each phase in a transitional phase 3812, thereby providing more inductor current in each inductor, and increasing current provided to the load. In DCM, higher load current typically requires greater pulsewidths once the system stabilizes at the higher load current. In CCM, once the converter stabilizes after the increase, pulsewidths may return to nearly the same as before the load current increase. In FIG. 38, 3814 represents a cycle of higher or increasing load current. In responding to the higher load current, however, even for a high bandwidth design there may be a lag time of one or more cycles before output current of the converter rises to match the load current, and during which load current must be provided by a filter capacitor such as filtering capacitor 116 in FIG. 1.

Reducing Control-Delay Component of Converter Response Delay

A control-delay component of the converter response delay is time AD3816, this component includes time from AT3818, at which the load current 3808 has increased and the controller can determine need for greater output current, and a time AT3820 where a waveform alteration can occur at the last phase 3806 to switch. Converter response delay also includes time that may be required for current to build up in inductors, such as inductors 106 or 124 (FIG. 1) of the phase circuitry. Filter capacitors 116 are typically provided to prevent an undesirable voltage undershoot of voltage at the load during this delay time.

In order to reduce this delay time AD3816, and thereby reduce the amount of filter capacitance 116 needed, an embodiment detects increases in load current and turns on control switching devices (e.g., switches 314 of FIG. 3) of one or more phases earlier than those phases would normally turn on in a cycle. This reduces the control-delay component of lead time, thereby reducing lag time AD3816.

Figure 39:
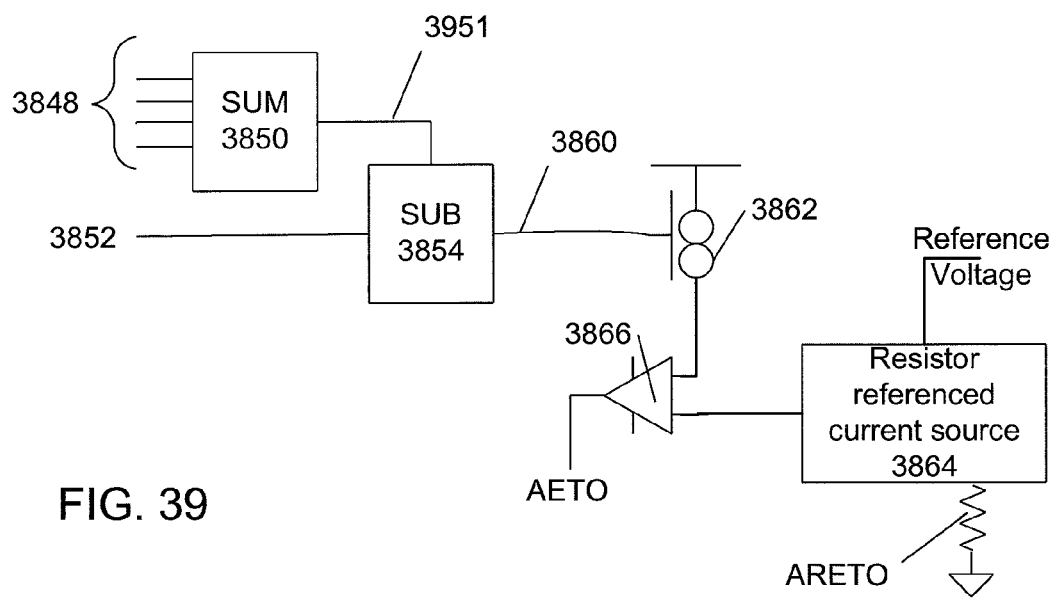
FIG. 39 is a schematic diagram for determining when early turn-on may desirable.

In one embodiment, illustrated in FIG. 39, signals 3848, representing reconstructed inductor current in each phase, are summed in an analog summing circuit 3850 to generate a total current signal 3951. Total current signal 3951 is subtracted from a signal 3852 representing desired load current in an analog subtracting circuit 3854 to produce a current difference signal 3860. A reference current is created by resistor referenced current source 3864 with the help of an internal fixed reference voltage and an external resistor ARETO. The current difference signal is then compared with the reference current in a current comparator 3866 to produce a signal AETO when early turn-on of one or more phases is desirable. In certain alternate embodiments, an integrated version of current difference signal 3860 is compared to the reference current produce signal AETO.

When AETO occurs, control switching devices of one or more then-off phases switch ON immediately, as illustrated in FIG. 40, without waiting for their normal turn-on point in the cycle. This results in a modified transitional cycle 3812E having one or more early turn-on pulses 3870, an earlier time AT3820E at which late phases have been affected by the change of load current, and a shortened response time AD3816E compared to the more conventional timing of FIG. 38.

Circuitry is also provided to detect when an AETO signal occurs that does not result in turning on one or more early turn-on pulses. This condition is termed a failed early turn-on. In a particular embodiment, failed early turn-on is determined by observing the PWM output signals for a rising edge, and declaring a failed early turn-on if two rising edges of PWM output signals are not seen within fifty nanoseconds.

In an embodiment, when multiple phases are turned on at AETO, a programmable turn-on to turn-on delay is imposed between turn-on of successive phases to avoid transients from excessive cumulative input surge current. In a typically well compensated system this delay could be in the range of a hundred to a few hundred nanoseconds. In an alternative embodiment, no turn-on to turn-on delay is provided.

In an embodiment for operation with coupled inductors, each phase turned on by AETO provides a pulse. In one embodiment, no more than two phases are permitted to be ON simultaneously because the low inductance of our coupled inductor systems permits fast response relative to discrete inductor system.

In a particular variation of this embodiment with coupled inductors, each phase turned on by AETO is turned on early for not more than a predetermined maximum time, in an exemplary embodiment this predetermined time is one half microsecond. When each phase turned on by AETO is turned off, the converter may similarly turn on a different phase early if AETO is still active to maintain two active phases until AETO ends.

An alternative, variably timed, embodiment also providing for quick response to load current changes has timing illustrated in FIG. 41. In this embodiment, during steady state operation at a low load current, each switching device of each phase, such as phase 4100, phase 4102, phase 4104, phase 4106, turns ON at a fixed turn-on point, such as time AT4106 for phase 4100, in a cycle 4112 of stable duration and as determined by a switching clock 4110. Each switching device turns off at a variable point later in the cycle, the pulse widths essentially determine inductor current in each inductor, and current provided to the load.

The embodiment having timing illustrated in FIG. 41 has circuitry resembling that previously discussed with reference to FIG. 39 and the current reconstructions previously described for determining when early turn-on is desired, and providing an AETO signal when load current 4114 increases. When AETO occurs, control switching devices of one, or more than one, then-off phases, such as phase 4106, switch ON immediately, without waiting for their normal turn-on point in the cycle. This results in an initial transitional cycle 4116 having one or more phases with early turn-on pulses 4120, resulting in an earlier time at which even normally-late phases in a cycle have been affected by the change of load current, and therefore providing a shortened response time compared to the more conventional converter timing of FIG. 38.

Switching Clock/DC-DC Converter Cycle Clock

The embodiment having timing illustrated in FIG. 41 also increases frequency of the switching clock 4110 when AETO occurs except during a failed early turn-on; in one embodiment this frequency increase of increased switching clock to normal switching clock is by a factor of 1.5, in an alternative embodiment this frequency increase is by a factor of two. The initial transitional cycle 4116, and in a particular embodiment a predetermined number of following transitional cycles 4118 therefore operate at a higher switching clock 4110 frequency. After the initial transitional cycle 4116 and following transitional cycles 4118, the system reverts to operation with normal switching clock in cycle 4122. In a particular embodiment, instead of reverting to operation with normal switching clock immediately in cycle 4122, the switching clock frequency is tapered back to the normal switching clock frequency through several steps over a number of operating cycles of the converter. In a particular embodiment, the switching clock frequency is tapered back to the normal switching clock frequency over twelve steps.

In an embodiment, the switching clock frequency is provided from a fixed-frequency reference clock by a programmable counter. In this embodiment, the programmable counter divides the reference clock by a first constant during normal operation, and by a second constant smaller than the first constant when the switching clock frequency is increased.

When phases are activated or deactivated, temporary disturbances may occur as phase currents rapidly change. Such disturbances may be reduced by temporarily increasing switching frequency, thereby reducing switching delay. Accordingly, in an alternative embodiment an increase of switching frequency as described in the preceding paragraph also occurs following operating transients such as changes in a number of active phases. For example, upon deactivating of a phase or reactivating a phase, the digital controller of the system boosts the switching frequency and then tapers it down over certain fixed or programmable time.

In some embodiments having early turn-on, and in order to prevent excessive currents from developing in the inductors, the early-turn-on catch-up mechanism is allowed to occur only once in an early-turn-on timeout interval, thereby limiting a frequency of assertion of the early turn on signal. In a particular embodiment the early-turnon timeout interval is eight microseconds.

Early turn-on is applicable to converter types other than the heretofore discussed single and multiphase buck converter. For example, early turn-on is applicable to converters having boost and buck-boost configuration, including the boost configuration illustrated in FIG. 2. When early turn-on is applied to a boost converter as illustrated in FIG. 2, it is preferred that turn-on of switch 206, or the equivalent switch in any phase, not be turned on until after any inductor current being provided to the load by the associated inductor 204 through diode 208 or switching device 210 has died away and switching device 210 opens. It is anticipated that early turn-on will sometimes be used with other systems and methods to improve converter performance. For example, in certain embodiments, early turn-on is used in conjunction with methods to reduce phase current imbalance discussed above with respect to FIG. 27. As another example, in certain embodiments, early turn-on is used in conjunction with phase adding and dropping, such as that discussed below with reference to FIG. 45.

Figure 42:
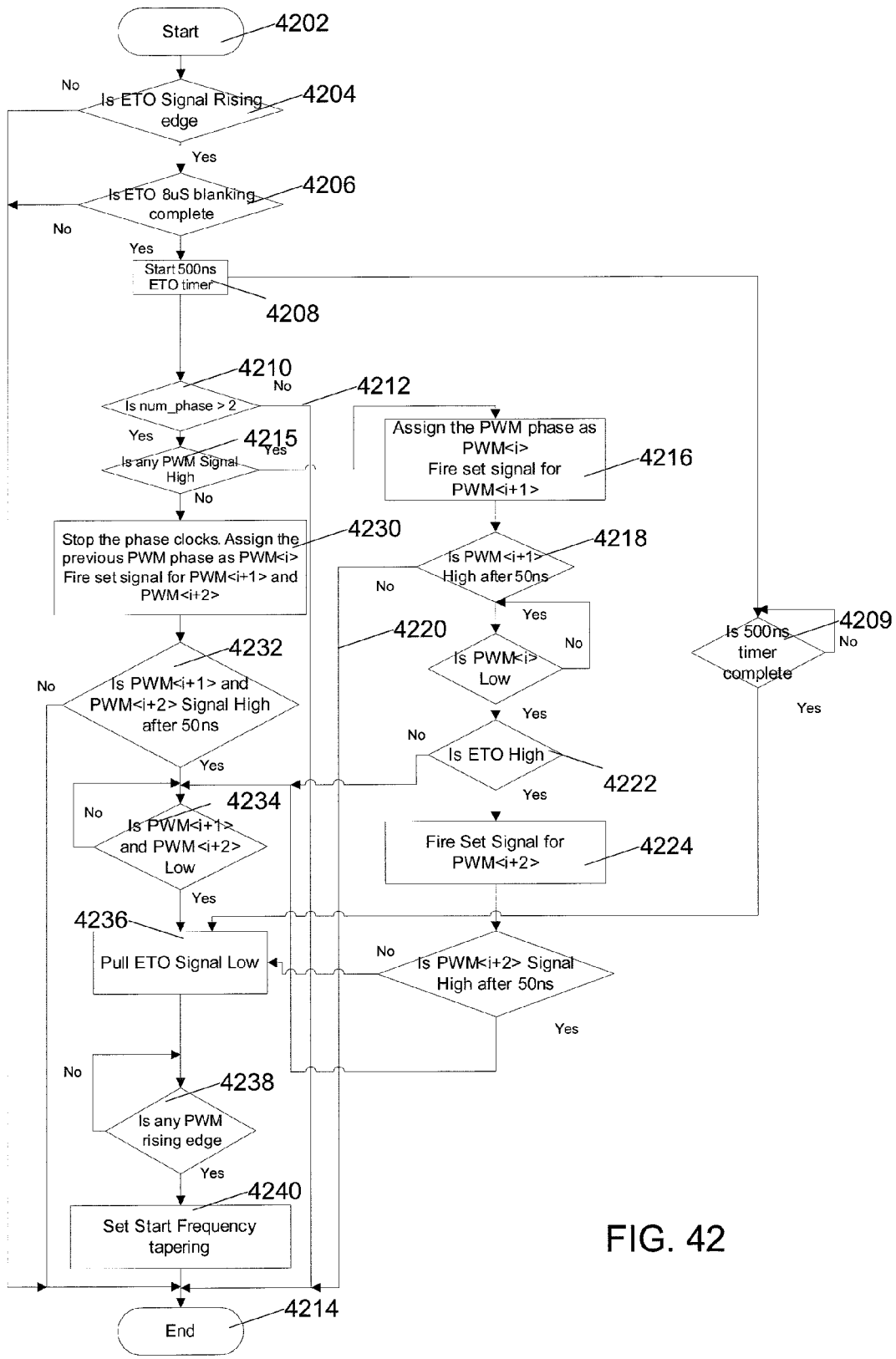

A flowchart illustrating this operation is provided in FIG. 42.

The method of FIG. 42 applies to embodiments having three or more phases and coupled inductors. The method starts 4202 on rising edges of AETO. If 4204 a rising edge of AETO is detected, and if 4206 a timeout period (in this example an eight microsecond blanking interval), has expired since the most recent AETO response, then a 500 nanosecond early-turnon pulse-length-timer is started 4208. If 4210 a number of active phases is less than 2, nothing happens 4212 and the method ends 4214.

If 4210 the number of active phases exceeds 2, a check is made to determine if 4215 any phases, such as phase i, already are providing a pulse. If one phase is already providing a pulse, the next sequential phase i+1 in the operating sequence is turned on 4216 immediately, thereby providing an early-turnon. If for some reason, such as an already high voltage on the converter output, that i+1 phase fails to turn on, a failed early-turnon 4220 has happened and the method ends 4214 with normal operating clock frequency. Otherwise, operating clock frequency is stepped up as previously discussed. When the initially-high phase i ends, the 500 nanosecond early-turnon pulse-length timer is checked 4222, and if still high the next sequential i+2 phase is turned on 4224.

If 4215 no phase's PWM signals were already on when AETO occurred, the phase clocks are stopped, and the next two phases i and i+1 expected to operate in the normal sequential order of operation are turned on 4230, or fired. If for some overriding reason, such as an excessively high voltage on the converter output, that i+1 phase fails to turn on, a failed early-turnon 4232 has happened and the method ends 4214. If the phases turn on, operating clock frequency is stepped up as previously discussed. When the early turnon pulse ends 4234, at or before the expiration 4209 of the 500 nanosecond early-turnon pulse-length-timer, or after phases fired when one phase was operating also end 4222-4224, the AETO early-turnon signal ends 4236. At the next PWM pulse setting 4238 of any phase to occur, clock rate tapering 4240 begins as clock rate returns over several steps to normal, and the timeout period begins.

The early turn-on systems and methods discussed above can be modified into an early-turnoff embodiment. In the early-turnoff embodiment, one or more currently turned-off freewheeling switching devices may be turned-on before their normal turn-on times, and any control switching device coupled to the same inductor turned off, in response to a load decrease. Turning on one or more freewheeling switching devices early may reduce or even eliminate output voltage overshoot due to a step load decrease. For example, the FIG. 39 system could be modified to generate a modified, or inverted, current difference signal 3860 by subtracting desired current 3852 from total current 3951. One or more currently turned-off freewheeling switching devices, such as switching devices 316 of FIG. 3, are turned-on if modified current difference 3860 exceeds a reference signal generated by circuitry similar to that shown in FIG. 39.

It is anticipated that some embodiments will provide for both early turn-on of control switching devices in a response to load increase and early turn-on of freewheeling switching devices in response to a load decrease. Such embodiments, for example, share a common summing circuit 3850, but use different subtracting circuits 3854, comparators 3866, and reference signal generators to trigger each type of early-turn.

Figure 43:
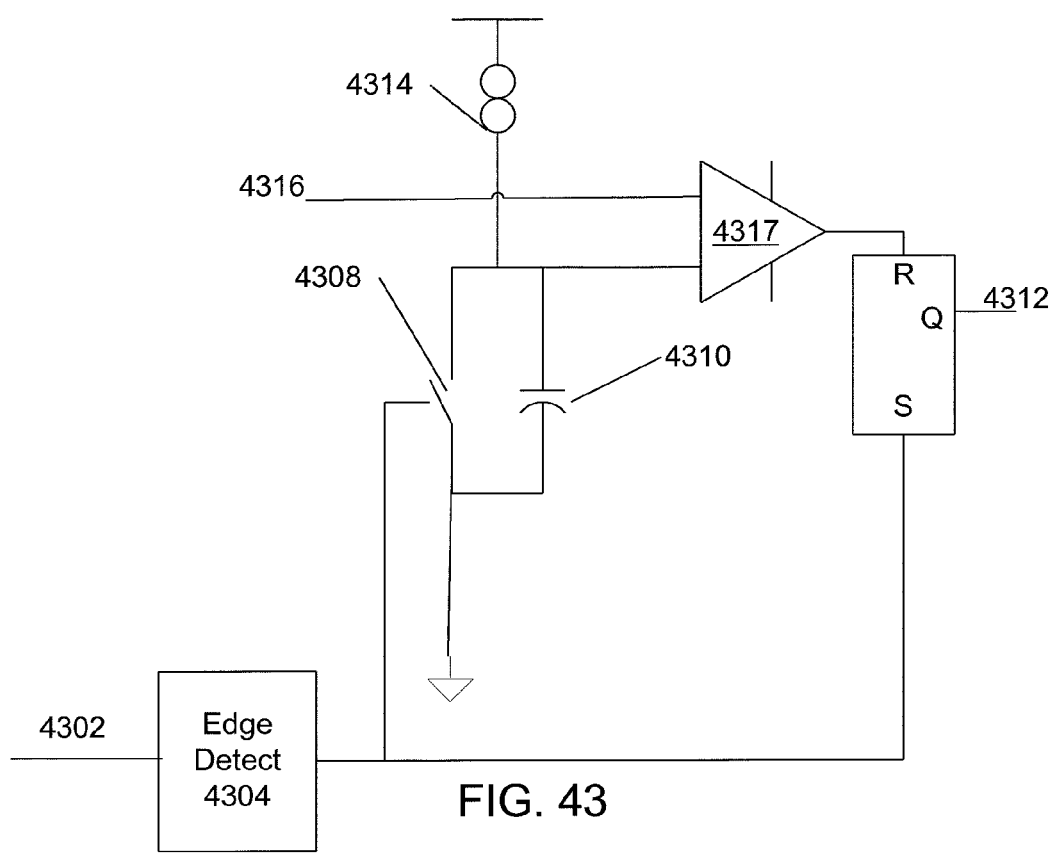
FIG. 43 is a schematic diagram illustrating a pulsewidth modulator having dynamic adjustment of modulator ramp rates during output current transients.
Figure 44:
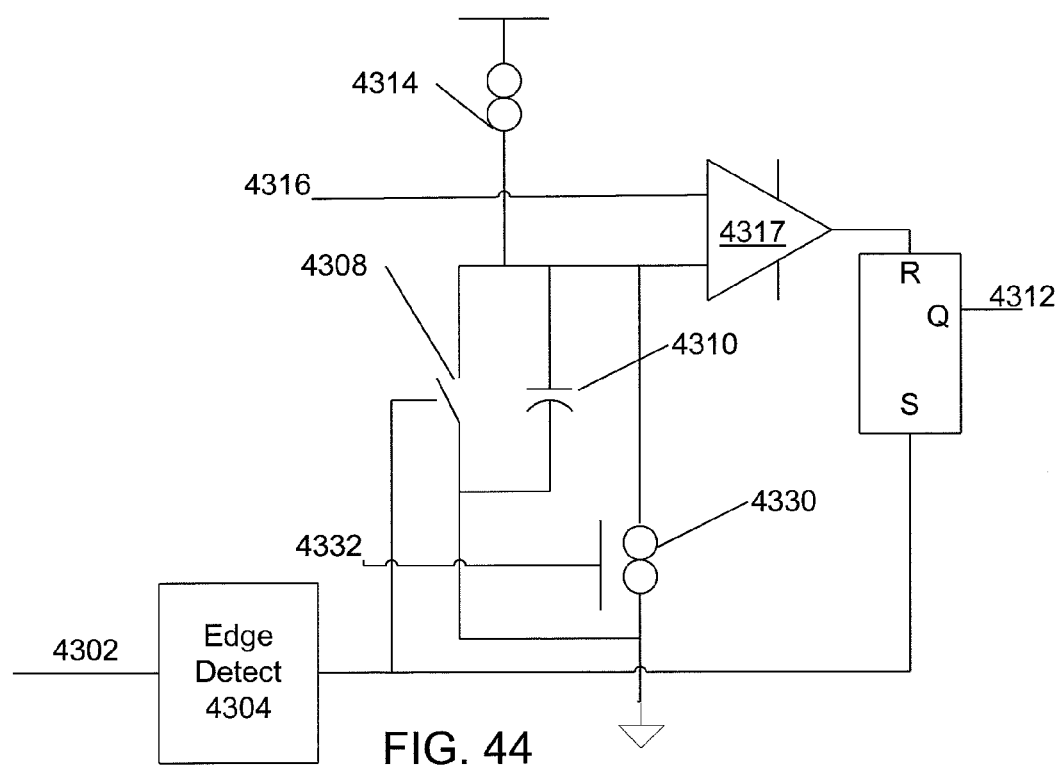
FIG. 44 is a schematic diagram of an alternative pulsewidth modulator having dynamic adjustment of modulator ramp rates during output current transients.

A dual-slope pulsewidth modulator for a phase of a multiphase buck DC-DC converter is illustrated in FIG. 43. In this modulator, a reference clock input 4302 feeds an edge-detector 4304. On a particular edge, for this discussion the rising edge, however in alternative embodiments falling edges may replace rising edges, edge detector 4304 generates a pulse that briefly closes switch 4308 to discharge capacitor 4310 and sets pulse width modulator RS latch 4312 to begin a pulse-width modulator pulse. In an alternative embodiment, reference clock 4302 is a narrow pulse and directly closes switch 4308 and sets RS latch 4312. RS latch 4312 is designed such that its reset input overrides its set input, thereby permitting pulse skipping. A current source 4314 charges capacitor 4310 with a voltage ramp until capacitor 4310 voltage passes a threshold determined by a desired phase-output current level signal 4316. Rising of the voltage ramp on capacitor 4310 past threshold signal 4316 is detected by comparator 4317. When capacitor 4310 passes output current level signal 4316, pulse width modulator RS latch 4312 is reset and ends the pulsewidth modulator pulse.

When current drawn by the load is rapidly increased, it has been found desirable to increase pulsewidths generated by each pulse width modulator for a period of time following the increase in current. In an embodiment, a controlled current source 4330, providing a current proportional to current error signal 4332, is connected in parallel to, but opposing, the 4314 current source, effectively reducing the current through capacitor 4310 when switch 4308 is open. Current error signal 4332 is a product of a constant AK1 times a difference between a desired output current of the converter as determined by feedback from the load, and a sum of phase output currents. Experiment has shown that modulating pulsewidths in this way provides a reduction in voltage undershoot when output current increases.

Determining Phase Enable/Disable

The present converters operate over a wide range of load currents. At high currents, several or all phases of these multiphase converters are necessary to drive the load, but at low currents operation of only one or a few phases are necessary to drive the load; intermediate loads may require intermediate numbers of phases to drive the load. Further, there is power consumption associated with operation of each phase of the converter. In order to minimize total energy consumption, and maximize battery life in battery-operated applications, one or more phases of the converter are shut down when operating at low output currents or light loads.

Figure 45:
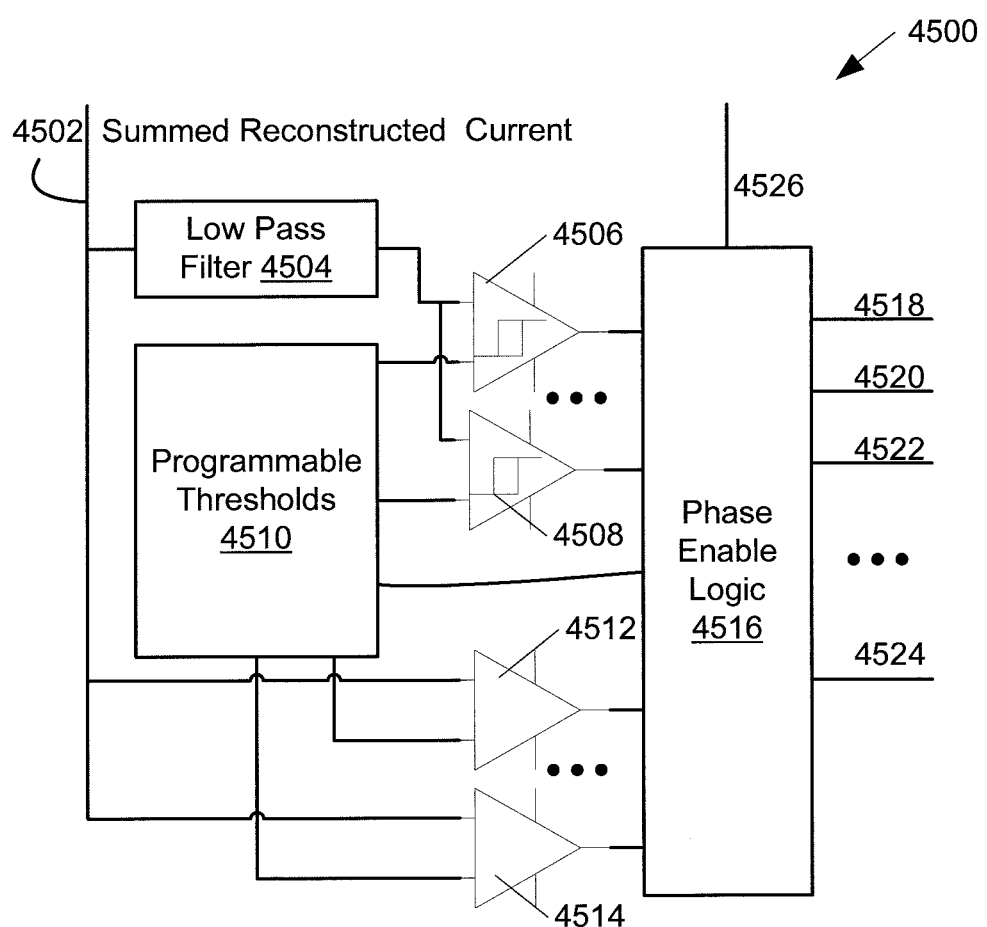
FIG. 45 is a block diagram of a controller for dynamically enabling and disabling phases of the multiphase DC-DC converter.

In the controller 4500 illustrated in FIG. 45, totalized reconstructed current from all phases 4502 is passed through a low pass filter 4504. In other embodiments, another measure of load current, or of current provided to the load, may be used instead of totalized reconstructed current 4502. An output of low pass filter 4504 is compared by low-speed comparators 4506, 4508 to outputs of a programmable threshold generator 4510.

Total current from all phases 4502 is also compared by high-speed comparators 4512, 4514 to a second, higher, set of outputs of programmable threshold generator 4510.

Outputs of both the low-speed comparators 4506, 4508, and the high-speed comparators 4512, 4514, are fed to phase enable logic 4516, which in turn generates phase-enable signals 4518, 4520, 4522, 4524 associated with each phase of the multiphase converter. Each phase is activated or deactivated in response to its respective phase-enable signal. In an embodiment, a number of active phases is also derived from the phase enable logic.

In a variation of this embodiment, hystereis is obtained by separating thresholds of high speed comparators 4512, 4514 from those of low-speed comparators 4506, 4508 for each breakpoint between numbers of active phases. When the total current signal is greater than that of the low speed comparator threshold for a given breakpoint, and below that of the high speed comparator, the current active phases are retained; when the current signal falls below the low speed comparator threshold the active phases may change to the lower number of active phases associated with the breakpoint, and when the current signal rises above the high speed comparator threshold, the active phases may change to the higher number associated with the breakpoint.

In an alternative embodiment, a converter-disable input 4526 is also provided that deactivates all phases of the converter and shuts the device down.

In an embodiment, a number of low-speed comparators 4506, 4508 and a number of high-speed comparators 4512, 4514 is provided that is one less than the number of phases of the converter. In an alternative embodiment, phase enable logic 4516 keeps track of active phases and the programmable thresholds provided by programmable threshold generator 4510 are dynamically adjusted according to how many phases are in operation. In this embodiment, only one low-speed comparator need be provided, and phases are dropped in sequence.

In an embodiment, the low pass filter 4504 incorporates an analog-to-digital converter, and the functions of hysteresis low-speed comparators 4506, 4508 are performed digitally, while the functions of high-speed comparators 4512, 4514 are performed in high speed analog circuitry; this permits enabling additional phases quickly when load current jumps sharply under conditions such as those previously described with reference to signal AETO and early turn-on functions. However, in certain alternate embodiments, the functions of comparators 4506, 4508, 4512, 4514 are performed differently, such as by using all analog or all digital comparators, or a different mix of analog and digital comparators.

Since high-speed comparators 4512, 4514 respond to load current changes more quickly than do low-speed comparators 4506, 4508, phase enable logic 4516 is designed such that phase-turn-on request signals from the high-speed comparators override phase turn-off signals from the low-speed comparators, and a timeout is provided such that no phase can turn off within a predetermined time of being turned on. In a particular embodiment, this predetermined minimum run time is ten milliseconds; this time limits the rate at which automated phase shedding can take place and in an embodiment this predetermined minimum run time is configurable. In another embodiment, this time is dynamically adjusted according to a frequency profile of the load to improve dynamic efficiency.

In a particular embodiment, the multiphase converter has hysteresis in phase enabling and disabling, in this embodiment the converter switches from two to one phase operation at a phase-drop threshold of 12 amperes, and from one to two phase operation at a higher current phase-enable threshold of 15 amperes; additional phases being enabled at higher currents; it is understood that other embodiments will have different current thresholds although phase-drop thresholds will be lower than phase-enable thresholds. In one embodiment, the programmable thresholds are determined through automatic measurement of a value of a programming resistor, in an alternative embodiment these thresholds are set by a system management processor.

In an alternative, or phase-counter, embodiment, an active number of phases is determined by a counter. In this embodiment, a current deficit signal is derived by subtracting totalized reconstructed current from desired current. This deficit signal is compared by comparators to a positive "add phase" threshold and to a negative "subtract phase" threshold, the active phase counter is incremented when the deficit signal is greater than the add phase threshold, and decremented when the deficit signal is less than the "subtract phase" threshold. In a first variation of this embodiment, an additional "add two phases" threshold is provided, and an additional comparator compares the deficit to the "add two phases" threshold, in this embodiment the active phase counter increments by two counts. In an alternative variation, any deficit greater than the add phase threshold causes the counter to advance to an all-phases-on active-phase count, the active phase count may be reduced from the all-on state to intermediate or single-phase counts. In this phase-counter embodiment, the number of active phases is reduced when either pulse width modulator (PWM) pulsewidths provided at the slaves are consistently below a drop-phase threshold, or when the deficit signal is below a subtract-phase threshold.

With higher numbers of active phases and higher current conditions, and in some embodiments, including variations of the counter embodiment and the embodiment referenced with respect to FIG. 45 above, more than one phase may be activated or deactivated simultaneously. For example, a particular DC-DC converter embodiment may be designed to operate with 1, 2, 3, 4, 6, or 8 active phases, adding two phases simultaneously when addition of a phase is necessary and the converter is operating with either four or six phases, and dropping two phases simultaneously when dropping a phase is permitted and the converter is operating with six or eight phases.

In some embodiments, when phases are deactivated, the converter repartitions a converter cycle to permit remaining phases to fire at times evenly distributed within the converter cycle. Similarly, when phases are activated, the converter repartitions the converter cycle to permit remaining phases to fire at times evenly distributed within the converter cycle. For example, a multiphase DC-to-DC converter operating with four phases that drops a phase to operate with three phases may redistribute the three remaining phases to fire at three equally spaced times within the converter cycle; such redistribution improves ripple and gives more even distribution of current among phases than would be possible if the operating phases fire at times unevenly distributed within the cycle.

In certain embodiments, control loop characteristics are changed as the number of active phases changes such that control loop bandwidth and phase margin are sufficient for stability as the number of active phases changes. For example, in some embodiments, an error amplifier feedback network configuration is changed as the number of active phases changes to maintain relatively constant control loop characteristics as the number of active phases changes.

In an alternative embodiment, phase enable logic 4516 is adapted to operate as a phase up-down counter which keeps track of a number of active phases. The counter counts upward if the number of active phases is less than a number of available phases and current from all phases 4502 is greater than a predetermined threshold. The counter counts downwards if the number of active phases is greater than a predetermined minimum number of active phases and current from all phases 4502 is less than a phase drop threshold. In some embodiments, the counter is adapted to skip codes while counting, such as to facilitate even partitioning of PWM turn-on points in a converter cycle and/or to activated/deactivate more than one phase at once. For example, in one embodiment, the counter sequentially counts between 1 and 12 by counting from 1, 2, 3, 4, 6, 8, and 12, skipping 5, 7, and 9. The counter also optionally determines PWM turn-on points distributed within a converter cycle according to the phase up-down counter.

In some alternate embodiments, circuitry similar to that of FIG. 45 increments a number of active phases while an external subsystem decrements the number of active phases. Similarly, in some other alternate embodiments, circuitry similar to that of FIG. 45 decrements a number of active phases while an external subsystem increments the number of active phases.

The phase-enable circuitry described herein with reference to FIG. 45 may be applied to other types of converters, such as boost and buck-boost converters, as well as to multiphase buck converters. It is also anticipated the that phase-enable circuitry will sometimes be used with other systems and methods to improve converter performance, such as the methods to control phase current imbalance discussed above with respect to FIG. 27.

Many other architectures for single and multiple-phase converters exist besides the buck and boost architectures, and concepts described herein may be applied to many such other DC-DC converter architectures including some architectures capable of providing voltage step up or voltage inversion. Such converter architectures include the buck-boost converter, the SEPIC (Single-ended primary-inductor converter) converter, the Ćuk converter, and many others. Concepts describe herein can also be applied to isolated converters including many transformer-coupled and capacitively-isolated designs.

While certain PWM embodiments have been described as turning ON a signal at a particular time or clock edge, and turning OFF the signal when a ramping signal matches a control voltage, thereby adjusting a trailing edge of the signal to produce pulse width modulation of the signal, other embodiments may alternatively adjust a leading edge of the signal, or both edges of the signal, to produce a pulse-width modulated signal. For example, a digitally-controlled pulse-width modulator may be constructed from a period register, a width register, a resettable counter and a comparator; in such an embodiment a pulse-width modulated output is SET when the 1's complement of the width register matches the counter, while the output is cleared and the counter reload with the 1's complement of the period register upon the counter reaching all-1's. In an alternative embodiment, a digital PWM as described in this paragraph could also have its output cleared when an overvoltage condition is detected at the DC-to-DC converter output. Pulse-width modulators may also be implemented in many other ways.

Changes may be made in the above methods and systems without departing from the scope hereof. It should thus be noted that the matter contained in the above description or shown in the accompanying drawings should be interpreted as illustrative and not in a limiting sense. The following claims are intended to cover generic and specific features described herein, as well as statements of the scope of the present method and system, which, as a matter of language, might be said to fall therebetween.

What is claimed is:

1. A method for controlling phase current imbalance in a multiphase DC-to-DC converter, comprising:
   determining a current magnitude value for each phase of the multiphase DC-to-DC converter, where each current magnitude value corresponds to magnitude of current out of one or more switching devices of the phase;
   identifying a smallest current magnitude value;
   firing a phase corresponding to the smallest current magnitude value;
   generating a desired current signal representing a desired load current of the DC-to-DC converter;
   generating a total current signal representing a load current of the DC-to-DC converter, the total current signal derived from the current magnitude value for each phase of the DC-to-DC converter;
   generating a current difference signal representing an amount by which the total current signal exceeds the desired current signal;
   comparing the current difference signal to a reference signal; and
   in response to a magnitude of the current difference signal exceeding a magnitude of the reference signal, turning on a currently turned off freewheeling switching device, before a normal turn-on time of the freewheeling switching device, and turning off a currently turned on control switching device, of one or more phases of the DC-to-DC converter.

2. The method of claim 1, wherein the step of determining is executed in response to a signal indicating that a phase of the multiphase DC-to-DC converter is to be fired.

3. The method of claim 2, wherein the signal indicating that the phase of the multiphase DC-to-DC converter is to be fired corresponds to a clock signal edge.

4. A The method of claim 1, further comprising:
   comparing the total current signal to a first threshold value;
   decreasing a number of phases that are active if the total current signal falls below the first threshold value; and temporarily increasing a frequency of a converter cycle of the multiphase DC-to-DC converter for a predetermined duration, whenever the number of phases that are active is altered.

5. The method of claim 4, the step of comparing the total current signal to the first threshold value comprising comparing a filtered version of the total current signal to the first threshold value.

6. The method of claim 4, the step of decreasing comprising decreasing a number of phases that are active by two or more phases for at least one number of phases that are active.

7. The method of claim 4, further comprising:
comparing the total current signal to a second threshold value; and
increasing a number of phases that are active if the total current signal rises above the second threshold value.

8. The method of claim 7, the step of increasing the number of phases that are active comprising increasing a number of phases that are active by two or more phases for at least one number of phases that are active.

9. The method of claim 7, wherein:
the step of comparing the total current signal to the first threshold value is performed using an analog comparator; and
the step of comparing the total current signal to the second threshold value is performed using a digital comparator.

10. The method of claim 7, wherein:
the step of comparing the total current signal to the first threshold value is performed using a digital comparator; and
the step of comparing the total current signal to the second threshold value is performed using an analog comparator.

11. The method of claim 7, wherein:
the step of comparing the total current signal to the first threshold value is performed using an analog comparator; and
the step of comparing the total current signal to the second threshold value is performed using an analog comparator.

12. The method of claim 7, wherein:
the step of comparing the total current signal to the first threshold value is performed using a digital comparator; and
the step of comparing the total current signal to the second threshold value is performed using a digital comparator.

13. The method of claim 4 further comprising reallocating phase turn-on times within the converter cycle whenever the number of phases that are active is altered.

14. The method of claim 4 further comprising changing control loop characteristics as the number of active phases changes such that control loop bandwidth and phase margin are sufficient for stability as the number of active phases changes.

15. The method of claim 1, further comprising:
comparing the total current signal to a second threshold value;
increasing a number of phases that are active if the total current signal rises above the second threshold value; and
temporarily increasing a frequency of a converter cycle of the multiphase DC-to-DC converter for a predetermined duration, whenever the number of phases that are active is altered.

16. The method of claim 15, the step of increasing the number of phases that are active comprising increasing a number of phases that are active by two or more phases for at least one number of phases that are active.

17. The method of claim 15 further comprising reallocating phase turn-on times within the converter cycle whenever the number of phases that are active is altered.

18. The method of claim 15 further comprising changing control loop characteristics as the number of active phases changes such that control loop bandwidth and phase margin are sufficient for stability as the number of active phases changes.

* * * * *

UNITED STATES PATENT AND TRADEMARK OFFICE
CERTIFICATE OF CORRECTION

| | |
|---|---|
| PATENT NO. | : 9,106,201 B1 |
| APPLICATION NO. | : 13/167665 |
| DATED | : August 11, 2015 |
| INVENTOR(S) | : Sombuddha Chakraborty et al. |

It is certified that error appears in the above-identified patent and that said Letters Patent is hereby corrected as shown below:

In the specification

Column 2, Line 1, "units not" should read --units are not--.

Column 5, Line 35, "the hand" should read --the other hand--.

Column 8, Line 28, "between of I_L" should read --between I_L--.

Column 8, Line 49, "references" should read --reference--.

Column 9, Line 38, "404 to 404" should read --402 to 404--.

Column 9, Line 56, "IL" should read --I_L--.

Column 10, Line 15, "IS1*IL" should read --IS1*I_L--.

Column 10, Line 17, "recon" should read --I_recon--.

Column 10, Line 18, "above, above, the" should read --above, the--.

Column 10, Lines 39 and 40, "above, above, the" should read --above, the--.

Column 10, Line 48, "Gmp1" should read --gmp1--.

Column 10, Line 63, "IS" should read --IS1G--.

Column 14, Line 63, "Tout" should read --Iout--.

Column 16, Line 13, "Tout" should read --Iout--.

Column 17, Line 13, "is in included" should read --is included in--.

Column 17, Line 24, "response a" should read --response to a--.

Column 17, Line 42, "Tout" should read --Iout--.

Column 18, Line 3, "of-amp" should read --op-amp--.

Column 20, Lines 4 and 5, "CCM to DCM and CCM to DCM" should read --CCM to DCM and DCM to CCM--.

Signed and Sealed this
Fifth Day of January, 2016

Michelle K. Lee
*Director of the United States Patent and Trademark Office*

CERTIFICATE OF CORRECTION (continued)
U.S. Pat. No. 9,106,201 B1

In the specification

Column 20, Line 21, "acts a" should read --acts as a--.

Column 21, Line 13, "a*Ve+BIAS, where a" should read --α*VE+BIAS, where α--.

Column 21, Line 16, "a*Ve" should read --α*VE--.

Column 21, Line 17, "a*Ve" should read --α*VE--.

Column 23, Line 66, "hereof In" should read --hereof. In--.

Column 28, Line 20, "that" should read --than--.

Column 31, Line 33, "coupled the" should read --coupled to the--.

Column 32, Line 20, "an" should read --a--.

Column 34, Line 9, "system" should read --systems--.

Column 40, Line 11, "reload" should read --reloaded--.